US012725668B2

(12) United States Patent
Tang et al.

(10) Patent No.: US 12,725,668 B2
(45) Date of Patent: Sep. 1, 2026

(54) MEMORY DEVICE, MEMORY SYSTEM, MEMORY CONTROLLER, AND OPERATION METHOD

(71) Applicant: YANGTZE MEMORY TECHNOLOGIES CO., LTD., Wuhan (CN)

(72) Inventors: Xingwei Tang, Wuhan (CN); Guangchang Ye, Wuhan (CN); Lu Guo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 118 days.

(21) Appl. No.: 18/792,137

(22) Filed: Aug. 1, 2024

(65) Prior Publication Data

US 2025/0266112 A1 Aug. 21, 2025

Related U.S. Application Data

(63) Continuation of application No. PCT/CN2024/077818, filed on Feb. 20, 2024.

(51) Int. Cl.

*G11C 16/34* (2006.01)
*G11C 16/26* (2006.01)
*G11C 29/52* (2006.01)

(52) U.S. Cl.

CPC ............ *G11C 16/349* (2013.01); *G11C 16/26* (2013.01); *G11C 29/52* (2013.01)

(58) Field of Classification Search

CPC ........ G11C 16/349; G11C 16/26; G11C 29/52
USPC .................................................... 365/185.02
See application file for complete search history.

(56) References Cited

U.S. PATENT DOCUMENTS

2010/0118611 A1 5/2010 Yu et al.
2013/0070524 A1* 3/2013 Dutta ..................... G11C 16/26 365/185.03
2020/0075118 A1 3/2020 Chew et al.
2022/0076738 A1* 3/2022 Bazarsky ............. G11C 29/028

FOREIGN PATENT DOCUMENTS

CN 107179960 A 9/2017
CN 110085275 A 8/2019
CN 111341375 A 6/2020

(Continued)

*Primary Examiner* — Alexander Sofocleous
*Assistant Examiner* — Duy H Luong
(74) *Attorney, Agent, or Firm* — BAYES PLLC

(57) ABSTRACT

Examples of the present application disclose a memory device. The memory device includes: a memory cell array comprising memory cells that store a plurality of memory bits, the plurality of memory bits corresponding to a plurality of orders of read voltages, and a preset number of the memory cells forming a code word; and a peripheral circuit coupled with the memory cell array and configured to: acquire a first result of at least one code word corresponding to a target read voltage of a target order; acquire a predicted valley bottom voltage of the target order according to the first result of the at least one code word corresponding to the target read voltage of the target order and a level in which the target order is located; and determine a target valley bottom voltage of the target order based on the predicted valley bottom voltage of the target order.

20 Claims, 31 Drawing Sheets

(56) References Cited

FOREIGN PATENT DOCUMENTS

| | | | |
|---|---|---|---|
| CN | 114496044 | A | 5/2022 |
| CN | 115206386 | A | 10/2022 |
| CN | 116779007 | A | 9/2023 |
| KR | 101423052 | B1 | 7/2014 |
| KR | 20160062298 | A | 6/2016 |
| TW | 201225084 | A | 6/2012 |
| TW | 201621911 | A | 6/2016 |
| TW | 202333160 | A | 8/2023 |

* cited by examiner

MEMORY DEVICE, MEMORY SYSTEM, MEMORY CONTROLLER, AND OPERATION METHOD

CROSS-REFERENCE TO RELATED APPLICATIONS

The present application is a continuation of International Application No. PCT/CN2024/077818, filed on Feb. 20, 2024, which is hereby incorporated by reference in its entirety.

TECHNICAL FIELD

The present application relates to, but is not limited to, a memory device, a memory system, a memory controller, and an operation method.

BACKGROUND

With the development of science and technology, the market size of the integrated circuit industry is getting bigger and bigger, and the process and technology of non-volatile memory devices in the whole integrated circuit industry have been developed by leaps and bounds in recent years, among which, the application of NAND type memories is particularly widespread. NAND type memories achieve the function of data storage by capturing and storing charges in the gate dielectric layer of the memory cells contained therein. However, as the usage time increases, the charges stored in the memory cells vary with increased usage time, repeated read operations, cross temperature, etc., thus affecting the accuracy of reading data stored in the memory cells.

SUMMARY

According to one aspect of the present disclosure, a memory device is provided. The memory device may include a memory cell array with memory cells that store a plurality of memory bits. The plurality of memory bits may correspond to a plurality of orders of read voltages. A preset number of the memory cells may form a code word. The memory device may include a peripheral circuit coupled with the memory cell array. The peripheral circuit may be configured to acquire a first result of at least one code word corresponding to a target read voltage of a target order. The first result may indicate the number of flipped bits of the at least one code word in two read results corresponding to a first read voltage and a second read voltage. A difference between the first read voltage and the second read voltage may be less than a preset voltage. The peripheral circuit may be configured to acquire a predicted valley bottom voltage of the target order according to the first result of the at least one code word corresponding to the target read voltage of the target order and a level in which the target order is located. The peripheral circuit may be configured to determine a target valley bottom voltage of the target order based on the predicted valley bottom voltage of the target order. The target valley bottom voltage may be taken as a read voltage for a read operation performed on the at least one code word.

In some implementations, the peripheral circuit may be configured to acquire the predicted valley bottom voltage of the target order according to the first result corresponding to the target read voltage, the level in which the target order is located, and a mapping function. In some implementations, the mapping function may indicate a relationship among the first result corresponding to the target read voltage, the level in which the target order is located, and the predicted valley bottom voltage of the target order.

In some implementations, the peripheral circuit may be configured to calculate a product of a prediction direction and a tune. In some implementations, the prediction direction may be determined according to the first result corresponding to the target read voltage, a program state of a memory block in which the code word is located, and the level in which the target order is located. In some implementations, the tune may be determined according to the first result corresponding to the target read voltage and the level in which the target order is located. In some implementations, the peripheral circuit may be configured to take a sum of the product and the target read voltage as the predicted valley bottom voltage of the target order.

In some implementations, the peripheral circuit may be configured to acquire the tune according to the first result corresponding to the target read voltage, the level in which the target order is located, a first constant, a second constant, and a step. In some implementations, the first constant and the second constant may both be fixed values related to the level in which the target order is located, and the step may be related to the first constant and the second constant.

In some implementations, the peripheral circuit may be configured to take the predicted valley bottom voltage of the target order as the target valley bottom voltage of the target order when the predicted valley bottom voltage of the target order satisfies a preset condition. In some implementations, the peripheral circuit may be configured to take a first result corresponding to a previous predicted valley bottom voltage as a first result in the mapping function when the predicted valley bottom voltage of the target order does not satisfy the preset condition, and perform a cyclic iteration according to the mapping function, until the predicted valley bottom voltage of the target order satisfies the preset condition.

In some implementations, the peripheral circuit may be configured to acquire a preset threshold according to the first result corresponding to the target read voltage. In some implementations, the preset threshold may indicate a first result corresponding to a maximum in an effective range of predicted valley bottom voltages. In some implementations, the peripheral circuit may be configured to take the predicted valley bottom voltage of the target order as the target valley bottom voltage of the target order when the first result corresponding to the predicted valley bottom voltage of the target order is less than the preset threshold.

In some implementations, the peripheral circuit may be configured to, when the predicted valley bottom voltage of the target order still does not satisfy the preset condition after the cyclic iteration is performed according to the mapping function more than a preset number of times, perform a plurality of first adjustments on the predicted valley bottom voltage of the target order with a first step, and acquire first results corresponding to read voltages after the plurality of first adjustments respectively. In some implementations, the peripheral circuit may be configured to determine an inflection point value according to the acquired first results corresponding to the read voltages after the plurality of first adjustments. In some implementations, a read voltage corresponding to the inflection point value may be an inflection point voltage. In some implementations, the peripheral circuit may be configured to perform a plurality of second adjustments on the inflection point voltage with a second step, and acquire first results corresponding to read voltages after the plurality of second adjustments respectively. In some implementations, the second step may be less than the first step. In some implementations, the peripheral circuit may be configured to determine the target valley bottom voltage of the target order according to the acquired first results corresponding to the read voltages after the plurality of second adjustments.

In some implementations, the first results corresponding to the read voltages after the plurality of first adjustments may include a first adjacent value and a second adjacent value both adjacent to the inflection point value. In some implementations, the peripheral circuit may be configured to restrict a read voltage after each adjustment in the plurality of second adjustments between a read voltage corresponding to the first adjacent value and the inflection point voltage according to a difference between the first adjacent value and the inflection point value being less than a difference between the second adjacent value and the inflection point value. In some implementations, the peripheral circuit may be configured to acquire an average of the read voltage corresponding to the first adjacent value and the inflection point voltage, when a first result corresponding to the average is less than the preset threshold, take the average as the target valley bottom voltage. In some implementations, the peripheral circuit may be configured to, when the first result corresponding to the average is greater than or equal to the preset threshold, continue to perform the second adjustments between the read voltage corresponding to the first adjacent value and the inflection point voltage, until a first result corresponding to an adjusted read voltage is less than the preset threshold.

In some implementations, the plurality of memory bits may correspond to a plurality of pages respectively, at least one page corresponds to a plurality of orders, the plurality of orders include a first order and a second order, and a read voltage of the second order is less than a read voltage of the first order. In some implementations, the peripheral circuit may be configured to acquire a predicted valley bottom voltage of a second target order according to a predicted valley bottom voltage of a first target order. In some implementations, the first target order may include at least one first order among a plurality of first orders corresponding to the plurality of pages, and the second target order may include at least one of other first orders or the second order, and a read voltage of the second target order may be less than a read voltage of the first target order.

In some implementations, the peripheral circuit may be configured to perform the read operation on the at least one code word according to predicted valley bottom voltages of all the first orders and second orders.

In some implementations, the peripheral circuit may be configured to acquire predicted valley bottom voltages of other orders among the plurality of orders than the target order respectively.

In some implementations, the peripheral circuit may be configured to read data stored in the at least one code word with the first read voltage to obtain a second result. In some implementations, the peripheral circuit may be configured to read data stored in the at least one code word with the second read voltage to obtain a third result. In some implementations, the peripheral circuit may be configured to perform a logic operation on the second result and the third result to obtain a fourth result. In some implementations, the peripheral circuit may be configured to count the number of bits in the fourth result that indicate flips of the third result compared to the second result to obtain the first result.

In some implementations, the peripheral circuit may include a first latch configured to store the second result. In some implementations, the peripheral circuit may include a second latch configured to store the third result. In some implementations, the peripheral circuit may include a third latch configured to store the fourth result.

According to another aspect of the present disclosure, a memory system is provided. The memory system may include one or more memory devices. Each of the one or more memory devices may include a memory cell array with memory cells that store a plurality of memory bits. The plurality of memory bits may correspond to a plurality of orders of read voltages, and a preset number of the memory cells forming a code word. Each of the one or more memory devices may include a peripheral circuit coupled with the memory cell array. The peripheral circuit may be configured to acquire a first result of at least one code word corresponding to a target read voltage of a target order. The first result may indicate the number of flipped bits of the at least one code word in two read results corresponding to a first read voltage and a second read voltage, and a difference between the first read voltage and the second read voltage may be less than a preset voltage. The peripheral circuit may be configured to acquire a predicted valley bottom voltage of the target order according to the first result of the at least one code word corresponding to the target read voltage of the target order and a level in which the target order is located. The peripheral circuit may be configured to determine a target valley bottom voltage of the target order based on the predicted valley bottom voltage of the target order. The target valley bottom voltage may be taken as a read voltage for a read operation performed on the at least one code word. The memory system may include a memory controller coupled with the one or more memory devices and configured to control the one or more memory devices.

In some implementations, the memory controller may be configured to send a data acquisition instruction. In some implementations, the data acquisition instruction may be to instruct acquisition of the target valley bottom voltage. In some implementations, the one or more memory devices may be configured to receive the data acquisition instruction, acquire the target valley bottom voltage, and send information including the target valley bottom voltage to the memory controller. In some implementations, the memory controller may be further configured to perform a read operation on data stored in the one or more memory devices according to the target valley bottom voltage in the information.

In some implementations, the memory controller may be further configured to perform an error correction code decoding operation on a read result of the read operation.

According to a further aspect of the present disclosure, a memory controller is provided. The memory controller may include a control unit. The control unit may be configured to acquire a first result of at least one code word corresponding to a target read voltage of a target order. The first result may indicate the number of flipped bits of the at least one code word in two read results corresponding to a first read voltage and a second read voltage, and a difference between the first read voltage and the second read voltage may be less than a preset voltage. The memory controller may be coupled with at least one memory device. The at least one memory device may include memory cells that store a plurality of memory bits. The plurality of memory bits may correspond to a plurality of orders of read voltages. A preset number of the memory cells may form a code word. The control unit may be configured to acquire a predicted valley bottom voltage of the target order according to the first result of the at least one code word corresponding to the target read voltage of the target order and a level in which the target order is located.

The control unit may be configured to determine a target valley bottom voltage of the target order based on the predicted valley bottom voltage of the target order. The target valley bottom voltage may be taken as a read voltage for a read operation performed on the at least one code word.

In some implementations, the control unit may be configured to acquire the predicted valley bottom voltage of the target order according to the first result corresponding to the target read voltage, the level in which the target order is located, and a mapping function. In some implementations, the mapping function may indicate a relationship among the first result corresponding to the target read voltage, the level in which the target order is located, and the predicted valley bottom voltage of the target order.

In some implementations, the control unit may be configured to calculate a product of a prediction direction and a tune. In some implementations, the prediction direction may be determined according to the first result corresponding to the target read voltage, a program state of a memory block in which the code word is located, and the level in which the target order is located, and the tune is determined according to the first result corresponding to the target read voltage and the level in which the target order is located. In some implementations, the control unit may be configured to take a sum of the product and the target read voltage as the predicted valley bottom voltage of the target order.

In some implementations, the control unit may be configured to acquire the tune according to the first result corresponding to the target read voltage, the level in which the target order is located, a first constant, a second constant, and a step. In some implementations, the first constant and the second constant may both be fixed values related to the level in which the target order is located, and the step may be related to the first constant and the second constant.

In some implementations, the control unit may be configured to take the predicted valley bottom voltage of the target order as the target valley bottom voltage of the target order when the predicted valley bottom voltage of the target order satisfies a preset condition. In some implementations, the control unit may be configured to take a first result corresponding to a previous predicted valley bottom voltage as a first result in the mapping function when the predicted valley bottom voltage of the target order does not satisfy the preset condition, and perform a cyclic iteration according to the mapping function, until the predicted valley bottom voltage of the target order satisfies the preset condition.

In some implementations, the control unit may be configured to acquire a preset threshold according to the first result corresponding to the target read voltage. In some implementations, the preset threshold may indicate a first result corresponding to a maximum in an effective range of predicted valley bottom voltages. In some implementations, the control unit may be configured to take the predicted valley bottom voltage of the target order as the target valley bottom voltage of the target order when the first result corresponding to the predicted valley bottom voltage of the target order is less than the preset threshold.

In some implementations, the control unit may be configured to, when the predicted valley bottom voltage of the target order still does not satisfy the preset condition after the cyclic iteration is performed according to the mapping function more than a preset number of times, perform a plurality of first adjustments on the predicted valley bottom voltage of the target order with a first step, and acquire first results corresponding to read voltages after the plurality of first adjustments respectively. In some implementations, the control unit may be configured to determine an inflection point value according to the acquired first results corresponding to the read voltages after the plurality of first adjustments. In some implementations, a read voltage corresponding to the inflection point value may be an inflection point voltage. In some implementations, the control unit may be configured to perform a plurality of second adjustments on the inflection point voltage with a second step, and acquire first results corresponding to read voltages after the plurality of second adjustments respectively. In some implementations, the second step may be less than the first step. In some implementations, the control unit may be configured to determine the target valley bottom voltage of the target order according to the acquired first results corresponding to the read voltages after the plurality of second adjustments.

In some implementations, the first results corresponding to the read voltages after the plurality of first adjustments may include a first adjacent value and a second adjacent value both adjacent to the inflection point value. In some implementations, the control unit may be configured to restrict a read voltage after each adjustment in the plurality of second adjustments between a read voltage corresponding to the first adjacent value and the inflection point voltage according to a difference between the first adjacent value and the inflection point value being less than a difference between the second adjacent value and the inflection point value. In some implementations, the control unit may be configured to acquire an average of the read voltage corresponding to the first adjacent value and the inflection point voltage, when a first result corresponding to the average is less than the preset threshold, take the average as the target valley bottom voltage. In some implementations, the control unit may be configured to, when the first result corresponding to the average is greater than or equal to the preset threshold, continue to perform the second adjustments between the read voltage corresponding to the first adjacent value and the inflection point voltage, until a first result corresponding to an adjusted read voltage is less than the preset threshold.

In some implementations, the plurality of memory bits may correspond to a plurality of pages respectively, at least one page may correspond to a plurality of orders, the plurality of orders may include a first order and a second order, and a read voltage of the second order may be less than a read voltage of the first order. In some implementations, the control unit may be configured to acquire a predicted valley bottom voltage of a second target order according to a predicted valley bottom voltage of a first target order. In some implementations, the first target order may include at least one first order among a plurality of first orders corresponding to the plurality of pages, and the second target order may include at least one of other first orders or the second order, and a read voltage of the second target order may be less than a read voltage of the first target order.

In some implementations, the control unit may be configured to perform the read operation on the at least one code word according to predicted valley bottom voltages of all the first orders and second orders.

In some implementations, the control unit may be configured to acquire predicted valley bottom voltages of other orders among the plurality of orders than the target order respectively.

According to yet another aspect of the present disclosure, a method of operating a memory device is provided. The method may include acquiring a first result of at least one code word corresponding to a target read voltage of a target order. The first result may indicate the number of flipped bits of the at least one code word in two read results corresponding to a first read voltage and a second read voltage, and a difference between the first read voltage and the second read voltage may be less than a preset voltage. The memory device may include memory cells that store a plurality of memory bits. The plurality of memory bits may correspond to a plurality of orders of read voltages. A preset number of the memory cells may form a code word. The method may include acquiring a predicted valley bottom voltage of the target order according to the first result of the at least one code word corresponding to the target read voltage of the target order and a level in which the target order is located. The method may include determining a target valley bottom voltage of the target order based on the predicted valley bottom voltage of the target order. The target valley bottom voltage may be taken as a read voltage for a read operation performed on the at least one code word.

According to still a further aspect of the present disclosure, a method of operating of a memory system is provided. The method may include sending, by a memory controller in the memory system, a data acquisition instruction. The data acquisition instruction may be to instruct acquisition of a target valley bottom voltage. The method may include receiving, by a memory device in the memory system, the data acquisition instruction, acquiring the target valley bottom voltage according to an operation method of a memory device, and sending information including the target valley bottom voltage to the memory controller. The operation method of the memory device may include acquiring a first result of at least one code word corresponding to a target read voltage of a target order. The first result may indicate a number of flipped bits of the at least one code word in two read results corresponding to a first read voltage and a second read voltage, and a difference between the first read voltage and the second read voltage may be less than a preset voltage. The operation method of the memory device may include acquiring a predicted valley bottom voltage of the target order according to the first result of the at least one code word corresponding to the target read voltage of the target order and a level in which the target order is located. The operation method of the memory device may include determining a target valley bottom voltage of the target order based on the predicted valley bottom voltage of the target order. The target valley bottom voltage may be taken as a read voltage for a read operation performed on the at least one code word. The operation method of the memory device may include performing, by the memory controller, a read operation on data stored in the memory device according to the target valley bottom voltage in the information.

According to yet another aspect of the present disclosure, a method of operating a memory controller is provided. The method may include acquiring a first result of at least one code word corresponding to a target read voltage of a target order. The first result may indicate the number of flipped bits of the at least one code word in two read results corresponding to a first read voltage and a second read voltage, and a difference between the first read voltage and the second read voltage may be less than a preset voltage. The memory controller may be coupled with at least one memory device. The at least one memory device may include memory cells that store a plurality of memory bits. The plurality of memory bits may correspond to a plurality of orders of read voltages. A preset number of the memory cells may form a code word. The method may include acquiring a predicted valley bottom voltage of the target order according to the first result of the at least one code word corresponding to the target read voltage of the target order and a level in which the target order is located. The method may include determining a target valley bottom voltage of the target order based on the predicted valley bottom voltage of the target order. The target valley bottom voltage may be taken as a read voltage for a read operation performed on the at least one code word.

According to still a further aspect of the present disclosure, a non-transitory computer-readable medium having an executable instruction stored thereon that, when executed, implements a method of operating a memory device is provided. The method may include acquiring a first result of at least one code word corresponding to a target read voltage of a target order. The first result may indicate the number of flipped bits of the at least one code word in two read results corresponding to a first read voltage and a second read voltage, and a difference between the first read voltage and the second read voltage may be less than a preset voltage. The memory device may include memory cells that store a plurality of memory bits. The plurality of memory bits may correspond to a plurality of orders of read voltages. A preset number of the memory cells may form a code word. The method may include acquiring a predicted valley bottom voltage of the target order according to the first result of the at least one code word corresponding to the target read voltage of the target order and a level in which the target order is located. The method may include determining a target valley bottom voltage of the target order based on the predicted valley bottom voltage of the target order. The target valley bottom voltage may be taken as a read voltage for a read operation performed on the at least one code word.

According to still a further aspect of the present disclosure, a non-transitory computer-readable medium having an executable instruction stored thereon that, when executed, implements a method of operating a memory device is provided. The method may include sending, by a memory controller in the memory system, a data acquisition instruction. The data acquisition instruction may be to instruct acquisition of a target valley bottom voltage. The method may include receiving, by a memory device in the memory system, the data acquisition instruction, acquiring the target valley bottom voltage according to an operation method of a memory device, and sending information including the target valley bottom voltage to the memory controller. The operation method of the memory device may include acquiring a first result of at least one code word corresponding to a target read voltage of a target order. The first result may indicate a number of flipped bits of the at least one code word in two read results corresponding to a first read voltage and a second read voltage, and a difference between the first read voltage and the second read voltage may be less than a preset voltage. The operation method of the memory device may include acquiring a predicted valley bottom voltage of the target order according to the first result of the at least one code word corresponding to the target read voltage of the target order and a level in which the target order is located. The operation method of the memory device may include determining a target valley bottom voltage of the target order based on the predicted valley bottom voltage of the target order. The target valley bottom voltage may be taken as a read voltage for a read operation performed on the at least one code word. The operation method of the memory device may include performing, by the memory controller, a read operation on data stored in the memory device according to the target valley bottom voltage in the information.

According to still a further aspect of the present disclosure, a non-transitory computer-readable medium having an executable instruction stored thereon that, when executed, implements a method of operating a memory device is provided. The method may include acquiring a first result of at least one code word corresponding to a target read voltage of a target order. The first result may indicate the number of flipped bits of the at least one code word in two read results corresponding to a first read voltage and a second read voltage, and a difference between the first read voltage and the second read voltage is less than a preset voltage. The memory controller may be coupled with at least one memory device. The memory device may include memory cells that store a plurality of memory bits. The plurality of memory bits may correspond to a plurality of orders of read voltages. A preset number of the memory cells may form a code word. The method may include acquiring a predicted valley bottom voltage of the target order according to the first result of the at least one code word corresponding to the target read voltage of the target order and a level in which the target order is located. The method may include determining a target valley bottom voltage of the target order based on the predicted valley bottom voltage of the target order. The target valley bottom voltage may be taken as a read voltage for a read operation performed on the at least one code word.

BRIEF DESCRIPTION OF THE DRAWINGS

In the drawings, unless otherwise stated, same reference numerals denote same or like components or elements throughout a plurality of drawings. These drawings are not necessarily drawn to scale. It is to be understood that the drawings depict only some examples disclosed in the present application, which are not to be considered as limitations on the scope of the present application.

DETAILED DESCRIPTION

Figure 1:
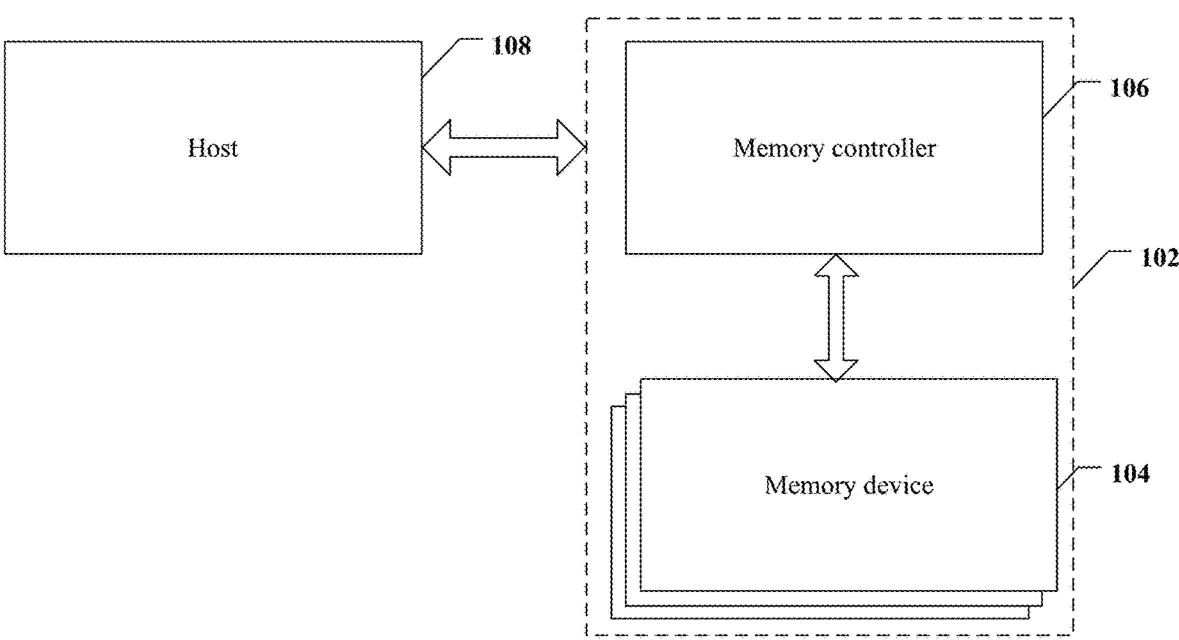
FIG. 1 is a schematic diagram of an example system having a memory system according to an example of the present application.

Examples of the present application will be described in more detail below with reference to the accompanying drawings. Although examples of the present application are shown in the drawings, it should be understood that the present application may be implemented in various ways and should not be limited to the DETAILED DESCRIPTION set forth herein. Rather, these examples are provided so that the present application can be more thoroughly understood and the scope of the present application can be fully conveyed to those skilled in the art.

In the following description, numerous specific details are given in order to provide a more thorough understanding of the present application. It will be apparent, however, to one skilled in the art that the present application may be practiced without one or more of these details. In other examples, some technical features well-known in the art are not described to avoid confusion with the present application; that is, not all features of the actual example are described here, and well-known functions and structures are not described in detail.

Furthermore, the drawings are merely schematic illustrations of the present application and are not necessarily drawn to scale. Same reference numerals denote same or like parts, and thus repeated descriptions thereof are omitted. Some block diagrams shown in the drawings are functional entities and do not necessarily correspond to physically or logically separate entities. These functional entities may be implemented in software, or implemented in one or more hardware modules or integrated circuits, or implemented in at least one of different networks or processor devices or microcontroller devices.

The flow diagram in the drawings is merely an example illustration and does not necessarily include all the operations. For example, some operations may be divided, and some operations may be combined or partially combined, so that an actual order of execution may vary depending on actual situations.

The terminology used herein is for the purpose of describing particular examples only and is not to be taken as a limitation of the present application. As used herein, “a”, “an” and “said/the” in singular forms are intended to include the plural forms as well, unless the context clearly dictates otherwise. It should also be understood that at least one of the terms “consists of” or “comprising”, when used in this specification, identify the presence of at least one of stated features, integers, operations, elements or components, but do not exclude presence of at least one of one or more other features, integers, operations, elements, components or groups. As used herein, the term “at least one of . . . ” includes any and all combinations of the associated listed items.

The memory device in the examples of the present application includes but is not limited to a three-dimensional NAND type memory, and for ease of understanding, a three-dimensional NAND type memory is used as an example for illustration.

FIG. 1 illustrates a block diagram of an example system 100 having a memory device, according to some aspects of the present application. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. The host 108 can be a processor of an electronic device, such as a central processing unit (CPU), or a system-on-chip (SoC), such as an application processor (AP). The host 108 can be configured to send or receive data to or from the memory device 104.

The memory controller 106 is coupled to the memory device 104 and the host 108 and is configured to control the memory device 104, according to some examples. The memory controller 106 can manage the data stored in the memory device 104 and communicate with the host 108. In some examples, the memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc.

In some examples, the memory controller 106 is designed for operating in a high duty-cycle environment solid state disks (SSD) or embedded multi-media-cards (eMMCs) used as data storage for mobile devices, such as smartphones, tablets, laptop computers, etc., and enterprise storage arrays.

The memory controller 106 can be configured to control operations of the memory device 104, such as read, erase, and program operations. The memory controller 106 can also be configured to manage various functions with respect to the data stored or to be stored in the memory device 104 including, but not limited to bad-block management, garbage collection, logical-to-physical address conversion, wear leveling, etc. In some examples, the memory controller 106 is further configured to process error correction codes with respect to the data read from or written to the memory device 104.

Any other suitable functions may be performed by the memory controller 106 as well, for example, formatting the memory device 104. The memory controller 106 can communicate with an external device (e.g., the host 108) according to a particular communication protocol. For example, the memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

The memory controller 106 and one or more memory devices 104 can be integrated into various types of storage devices, for example, be included in the same package, such as a universal Flash storage (UFS) package or an eMMC package. That is, the memory system 102 can be implemented and packaged into different types of end electronic products.

Figure 2A:
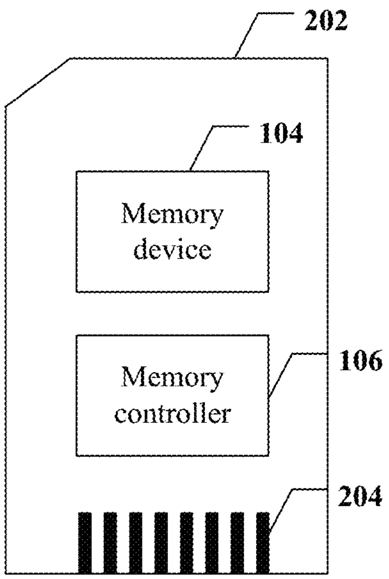
FIG. 2A is a schematic diagram of an example memory card having a memory system according to an example of the present application.

In one example as shown in FIG. 2*a*, the memory controller 106 and a single memory device 104 may be integrated into a memory card 202. The memory card 202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. The memory card 202 can further include a memory card connector 204 coupling the memory card 202 with a host (e.g., the host 108 in FIG. 1).

Figure 2B:
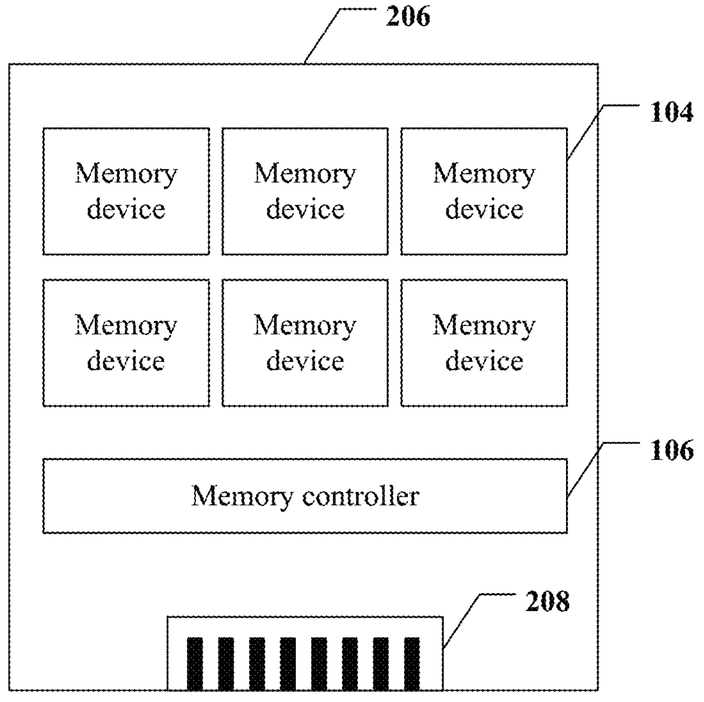
FIG. 2B is a schematic diagram of an example solid-state drive having a memory system according to an example of the present application.

In another example as shown in FIG. 2*b*, the memory controller 106 and multiple memory devices 104 may be integrated into an SSD 206. The SSD 206 can further include an SSD connector 208 coupling the SSD 206 with a host (e.g., the host 108 in FIG. 1). In some examples, at least one of the storage capacity or the operation speed of the SSD 206 is greater than those of the memory card 202.

In some examples, each memory block may be coupled with a plurality of word lines, and a plurality of memory cells coupled with each word line constitute a physical page.

Figure 3:
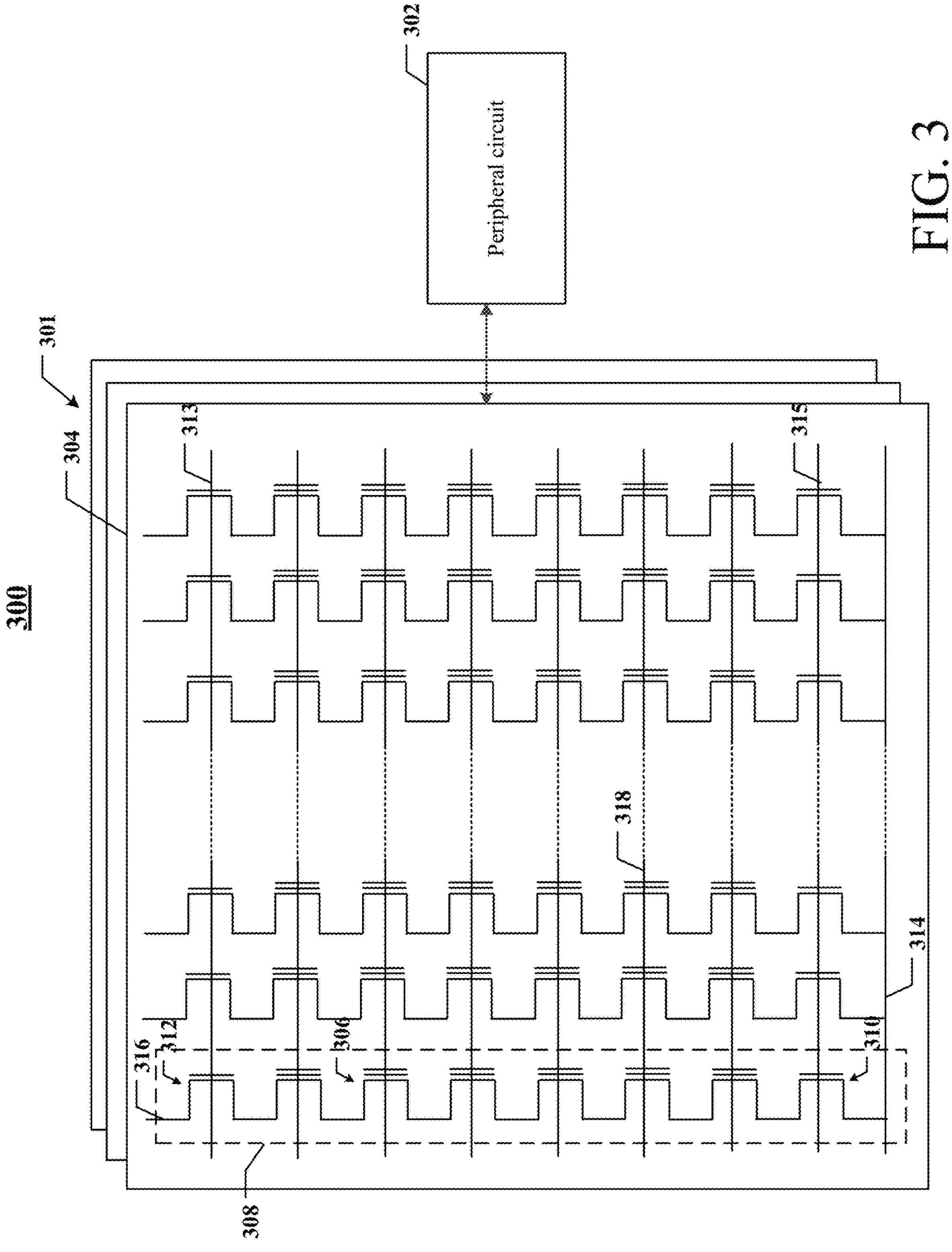
FIG. 3 is a schematic diagram of an example memory including a peripheral circuit according to an example of the present application.

FIG. 3 illustrates a schematic circuit diagram of an example memory device 300 including a peripheral circuit, according to some aspects of the present application. The memory device 300 can be an example of the memory device 104 in FIG. 1. The memory device 300 can include a memory cell array 301 and a peripheral circuit 302 coupled to the memory cell array 301. The memory cell array 301 is illustrated as an example of a three-dimensional NAND type memory cell array, in which memory cells 306 are NAND type memory cells and are provided in the form of an array of memory strings 308 each extending vertically above a substrate (not shown). In some examples, each memory string 308 includes a plurality of memory cells 306 coupled in series and stacked vertically. Each memory cell 306 can hold a continuous, analog value, such as an electrical voltage or charge, that depends on the number of electrons trapped within a region of the memory cells 306. Each memory cell 306 can be either a floating gate type of memory cell including a floating-gate transistor or a charge trap type of memory cell including a charge-trap transistor.

In some examples, each memory cell 306 is a single-level cell (SLC) that has two possible memory states and thus, can store one bit of data. For example, the first memory state "0" can correspond to a first range of voltages, and the second memory state "1" can correspond to a second range of voltages. In some examples, each memory cell 306 is a multi-level cell (MLC) that is capable of storing more than a single bit of data in more than four memory states. For example, the MLC can store two bits per cell (also known as Double-Level Cell), three bits per cell (also known as Trinary-Level cell (TLC)), four bits per cell (also known as a Quad-Level cell (QLC)), five bits per cell (also known as a Penta-Level cell (PLC)) or more than five bits per cell. Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

It is to be noted that the memory state mentioned herein is also the storage state of the memory cell referred to in the present application. Different memory cells have different numbers of storage states. For example, an SLC type memory cell has 2 storage states (i.e., two memory states), where the 2 storage states include: one programmed state and one erased state. For another example, an MLC type memory cell has 4 storage states, where the 4 storage states include: one erased state and three programmed states. For still another example, a TLC type memory cell has 8 storage states, where the 8 storage states include: one erased state and seven programmed states. In some examples, a QLC type memory cell has 16 storage states, where the 16 storage states include: one erased state and fifteen programmed states.

As shown in FIG. 3, each memory string 308 can include a bottom selective transistor (BSG) 310 (also referred to as a source side selective transistor) at its source end and a top selective transistor (TSG) 312 (also known as a drain side selective transistor) at its drain end. BSG 310 and TSG 312 can be configured to activate selected memory strings 308 during read and program operations. In some examples, the sources of memory strings 308 in the same memory block 304 are coupled through the same source line (SL) 314, e.g., a common SL. In other words, all memory strings 308 in the same memory block 304 have an array common source (ACS), according to some examples. TSG 312 of each memory string 308 is coupled to a respective bit line (BL) 316 from which data can be read or written via an output bus (not shown), according to some examples. In some examples, each memory string 308 is configured to be selected or deselected by at least one of: applying a select voltage (e.g., above the threshold voltage of the transistor having TSG 312) or a deselect voltage (e.g., 0 V) to respective TSG 312 through one or more TSG lines 313 or applying a select voltage (e.g., above the threshold voltage of the transistor having BSG 310) or a deselect voltage (e.g., 0 V) to respective BSG 310 through one or more BSG lines 315.

As shown in FIG. 3, the memory strings 308 can be organized into multiple memory blocks 304, each of which can have a common source line 314, e.g., coupled to the ground. In some examples, each memory block 304 is the basic data unit for erase operations, i.e., all memory cells 306 on the same memory block 304 are erased at the same time. To erase memory cells 306 in a selected memory block 304, source lines 314 coupled to the selected memory block 304 as well as unselected memory blocks 304 in the same plane as the selected memory block 304 can be biased with an erase voltage (Vers), such as a high positive voltage (e.g., 20 V or more). It is understood that in some examples, the erase operation may be performed at a half-memory block level, a quarter-memory block level, or a level having any suitable number of memory blocks or any suitable fractions of a memory block. Memory cells 306 of adjacent memory strings 308 can be coupled through word lines 318 that select which row of memory cells 306 is affected by read and program operations.

Referring to FIG. 3, each memory cell 306 of the plurality of memory cells is coupled to respective word lines 318, and each memory string 308 is coupled to respective bit lines 316 via a respective selective transistor (such as top selective transistor (TSG) 312).

Figure 4:
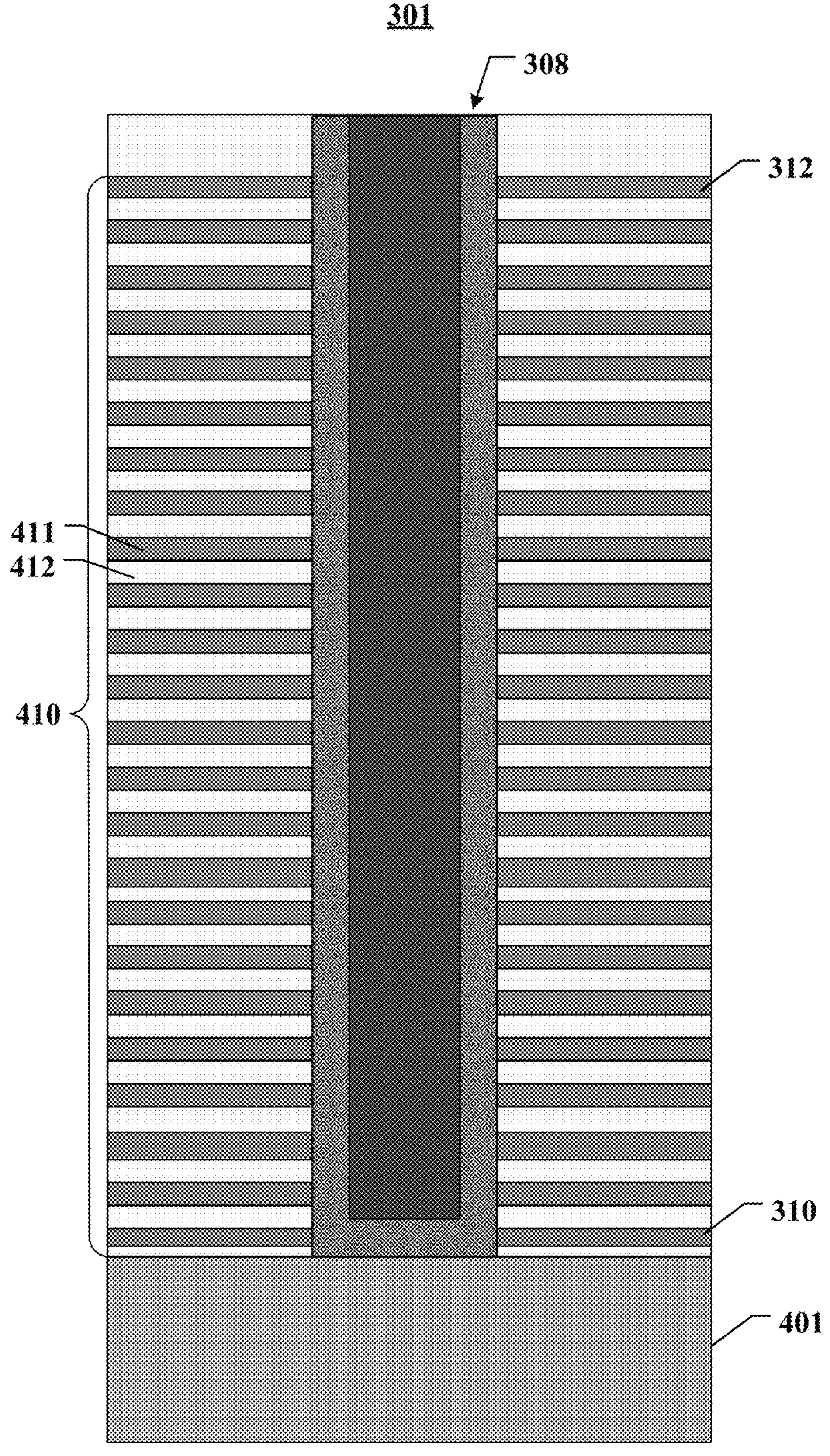
FIG. 4 is a schematic cross-sectional view of a memory cell array including a NAND type memory string according to an example of the present application.

FIG. 4 shows a schematic cross-sectional view of an example memory cell array 301 including memory strings 308, exemplified by NAND, in accordance with aspects of the present application. As shown in FIG. 4, the NAND memory cell array 301 may include a stacked structure 410, which includes a plurality of gate layers 411 and a plurality of insulating layers 412 alternately stacked in sequence, and a channel structure penetrating vertically through the gate layers 411 and the insulating layers 412. The channel structure is coupled with each gate layer to form a memory cell, and the channel structure is coupled with multiple gate layers in the stacked structure 410 to form a memory string 308. The gate layer 411 and the insulating layer 412 can be stacked alternately, and two adjacent gate layers 411 are separated by an insulating layer 412.

The constituent material of the gate layer 411 may include a conductive material. The conductive material may include but is not limited to tungsten (W), cobalt (Co), Copper (Cu), aluminum (Al), polysilicon, doped silicon, silicide, or any combination thereof. In some examples, each gate layer 411 may include a metal layer, e.g., a tungsten layer. In some examples, each gate layer 411 includes a doped polysilicon layer. Each gate layer 411 may include a control gate surrounding the memory cell. The gate layer 411 at the top of the stacked structure 410 may extend laterally as a top selective gate line, the gate layer 411 at the bottom of the stacked structure 410 may extend laterally as a bottom selective gate line, and the gate layer 411 extending laterally between the top selective gate line and the bottom selective gate line may be used as a word line layer.

In some examples, the stacked structure 410 may be disposed on a substrate 401. The substrate 401 may include silicon (e.g., monocrystalline silicon), silicon germanium (SiGe), gallium arsenide (GaAs), germanium (Ge), silicon-on-insulator (SOI), germanium-on-insulator (GOI), or any other suitable material.

In some examples, the memory string 308 includes a channel structure extending vertically through the stacked structure 410. In some examples, the channel structure includes a channel hole filled with semiconductor material(s) (e.g., as a semiconductor channel) and dielectric material(s) (e.g., as a memory film). In some examples, the semiconductor channel includes silicon, e.g., polysilicon. In some examples, the memory film is a composite dielectric layer including a tunneling layer, a storage layer (also referred to as a "charge trap/storage layer"), and a blocking layer. The channel structure may have a cylindrical shape (e.g., a pillar shape). According to some examples, the semiconductor channel, the tunneling layer, the storage layer and the blocking layer are radially arranged in this order from the center of the pillar toward the outer surface of the pillar. The tunneling layer may include silicon oxide, silicon oxynitride, or any combination thereof. The storage layer may include silicon nitride, silicon oxynitride, or any combination thereof. The blocking layer may include silicon oxide, silicon oxynitride, a high dielectric constant (high-k) dielectric, or any combination thereof. In one example, the memory film may include a composite layer of silicon oxide/silicon oxynitride/silicon oxide (ONO).

Figure 5:
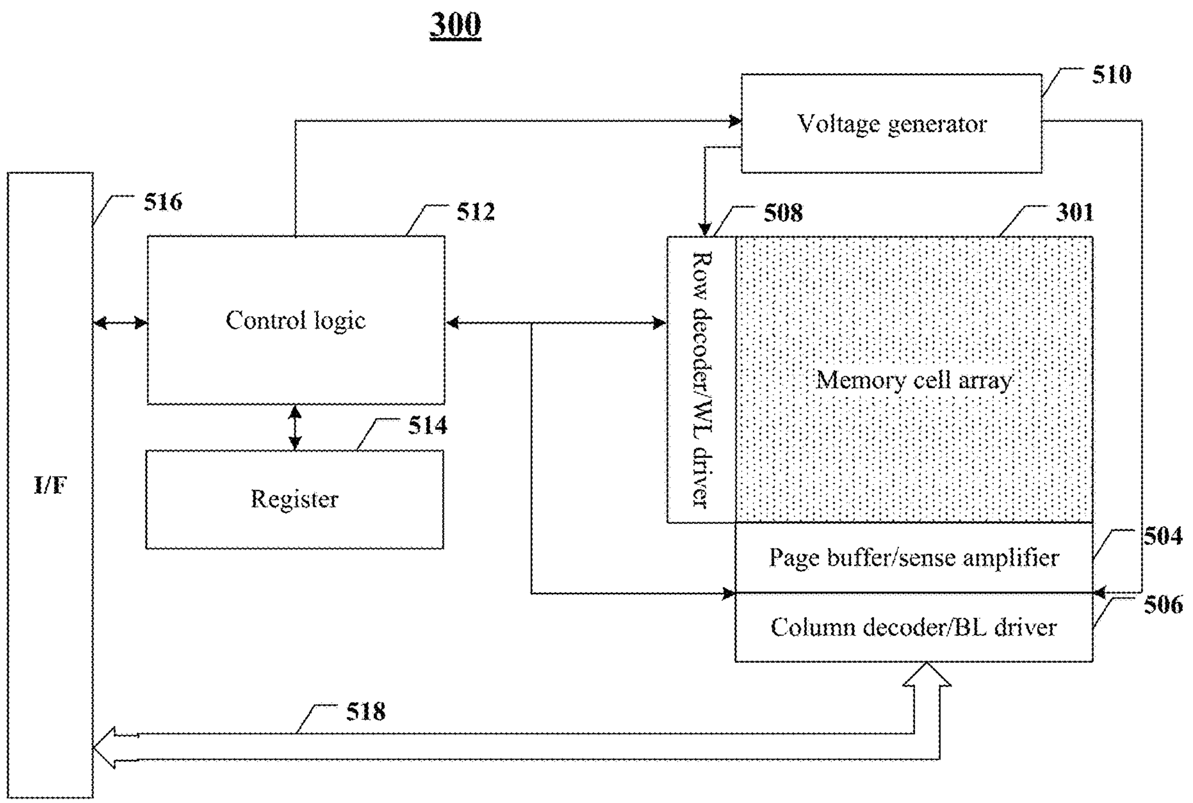
FIG. 5 is a schematic diagram of an example memory device including a memory cell array and a peripheral circuit according to an example of the present application.

Referring back to FIG. 3, the peripheral circuit 302 can be coupled to the memory cell array 301 through bit lines 316, word lines 318, source lines 314, BSG lines 315, and TSG lines 313. The peripheral circuit 302 can include any suitable analog, digital, and mixed-signal circuits for facilitating the operations of the memory cell array 301 by applying and sensing at least one of voltage signals or current signals to and from each target memory cell 306 through bit lines 316, word lines 318, source lines 314, BSG lines 315, and TSG lines 313. The peripheral circuit 302 can include various types of peripheral circuits formed using metal-oxide-semiconductor (MOS) technologies. For example, FIG. 5 illustrates some example peripheral circuits, the peripheral circuit including a page buffer/sense amplifier 504, a column decoder/bit line driver 506, a row decoder/word line driver 508, a voltage generator 510, control logic 512, registers 514, an interface 516, and a data bus 518. It is understood that in some examples, additional peripheral circuits not shown in FIG. 5 may be included as well.

The page buffer/sense amplifier 504 can be configured to read and program (write) data from and to the memory cell array 301 according to the control signals from the control logic 512. In one example, the page buffer/sense amplifier 504 may store program data (write data) to be programmed into the memory cell array 301. In another example, the page buffer/sense amplifier 504 may perform program verify operations to ensure that the data has been properly programmed into memory cells 306 coupled to selected word lines 318. In still another example, the page buffer/sense amplifier 504 may also sense the low power signals from the bit line 316 that represent data bits stored in the memory cells 306 and amplify the small voltage swing to recognizable logic levels in a read operation. The column decoder/bit line driver 506 can be configured to be controlled by the control logic 512 and select one or more memory strings 308 by applying bit line voltages generated from the voltage generator 510.

The row decoder/word line driver 508 can be configured to be controlled by the control logic 512 and select/deselect memory blocks 304 of the memory cell array 301 and select/deselect word lines 318 of memory blocks 304. The row decoder/word line driver 508 can be further configured to drive word lines 318 using word line voltages generated from the voltage generator 510. In some examples, the row decoder/word line driver 508 can also select/deselect and drive BSG lines 315 and TSG lines 313 as well. As described below in detail, the row decoder/word line driver 508 is configured to perform program operations on the memory cells 306 coupled to the selected word line(s) 318. The voltage generator 510 can be configured to be controlled by the control logic 512 and generate the word line voltages (e.g., read voltage, program voltage, pass voltage, channel boost voltage, verification voltage, etc.), bit line voltages, and source line voltages to be supplied to the memory cell array 301.

The control logic 512 may be coupled to each other part of the peripheral circuit described above and configured to control the operation of each other part of the peripheral circuit. Registers 514 can be coupled to the control logic 512 and include status registers, command registers, and address registers for storing status information, command operation codes (OP codes), and command addresses for controlling the operations of each peripheral circuit. The interface 516 may be coupled to the control logic 512 and act as a control buffer to buffer and relay control commands received from a host (not shown) to the control logic 512, and to buffer and relay status information received from the control logic 512 to the host. The interface 516 may further be coupled to the column decoder/bit line driver 506 via the data bus 518 and act as a data I/O interface and data buffer to buffer and relay data to or from the memory cell array 301.

A basic principle of the three-dimensional NAND type memory is that carriers (electrons or holes) cross a charge barrier and inject a certain amount of charges into a memory cell to complete a data write process, and then stored data can be read according to a threshold voltage when the memory cell is turned on. Therefore, in order to read data correctly, an error correction algorithm with strong error correction capability and high efficiency is typically introduced at the time of data reading.

However, as the usage time increases, the charges stored in the memory cells vary with increased usage time, repeated read operations, cross temperature, etc., thus affecting the accuracy of data reading. When the threshold voltage is shifted upwardly or downwardly more significantly, the possibility of a read error occurring when the original read voltage is used to read the data from the memory cell can be very high, and when the read error exceeds the error correction capability, it can also lead to a failure to read the data from the memory cell.

Figure 6:
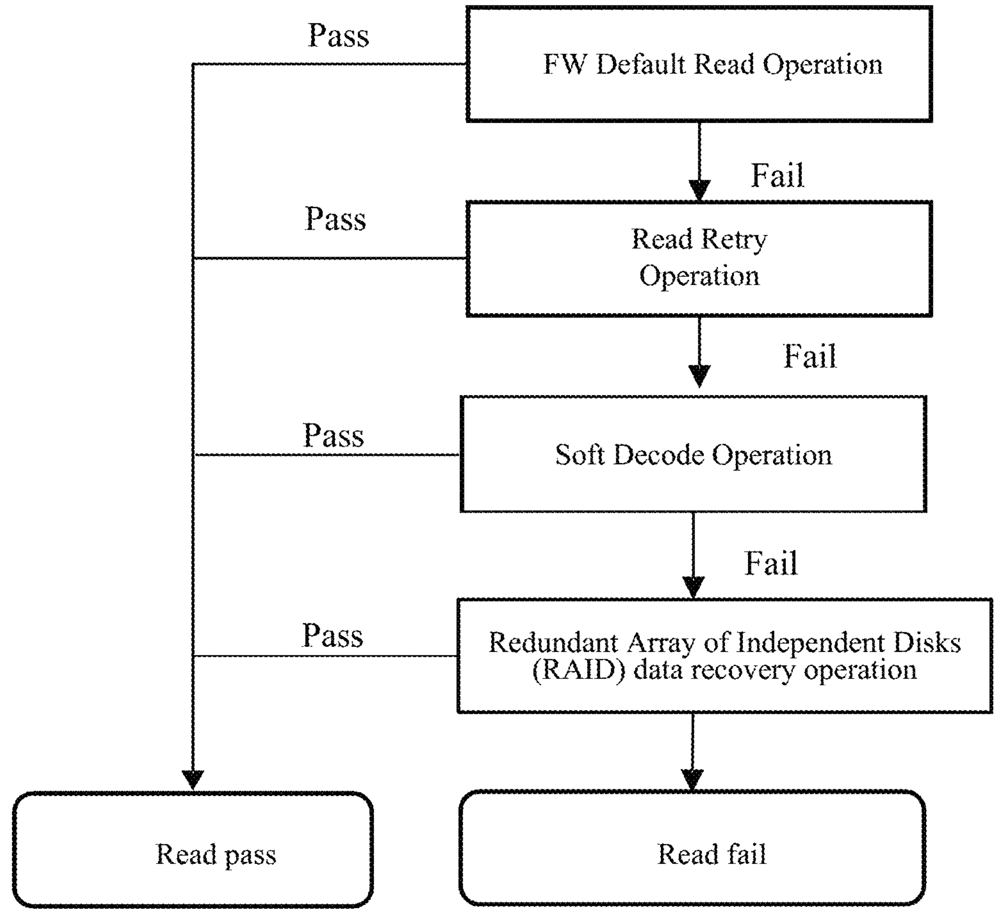
FIG. 6 is a flow diagram of an example read operation of a memory system according to an example of the present application.

FIG. 6 is a flow diagram of an example read operation of a memory system. Referring to FIG. 6, when the memory controller controls the memory device to perform the read operation, an FW default read operation is first performed on a memory cell with a corresponding physical address; a read retry operation is performed after the FW default read operation fails; a soft decode operation is performed after the read retry operation fails; a Redundant Array of Independent Disks (RAID) data recovery operation is performed after the soft decode operation fails. After the RAID operation fails, the read operation stops and fails due to the inability to correct errors, and the memory controller sends a read fail signal to the host 108. The read retry operation and the FW default read operation are applicable to hard decode.

In some examples, the read retry operation typically may be performed through querying a read retry table provided by a manufacturer. The essence of the read retry operation is an error correction mechanism, where the read retry table may provide reference voltages for data reading. Through querying the read retry table, attempts are made to re-read each memory cell with a read voltage deviating from the normal threshold voltage and in conjunction with error correction using the error correction algorithm, attempts are made to read the data correctly. Stop querying the read retry table if the data with read error is corrected. The read retry table is queried until the entire read retry table is traversed if the data with read error is not corrected.

The above read retry operation method requires querying the read retry table entry by entry, which inevitably increases the number of trial and error attempts, causing long time consumption. In addition, the read retry table provided by the manufacturer is just a table of reference values in some specific environments, while the real use scenarios are ever-changing, so the read retry table provided by the manufacturer cannot cover many of them. As such, data may not be corrected even by traversing the read retry table, resulting a waste of much command processing time. In summary, the method of performing the read retry operation through repeated querying the read retry table causes long time consumption, affecting the response time of subsequent commands, thus affecting the performance of the device.

Based on one or more of the above problems, in a first aspect, examples of the present application provide a memory device.

Figure 7:
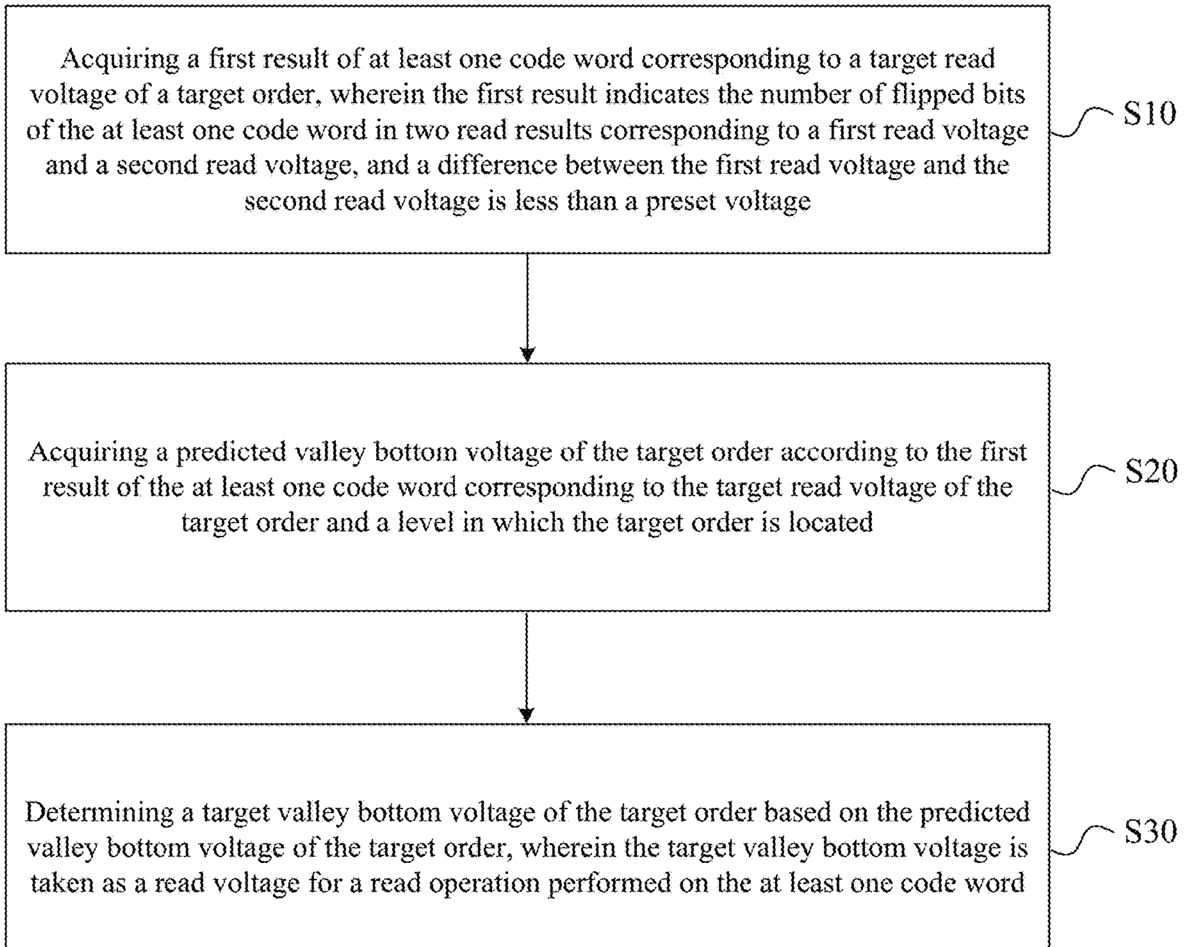
FIG. 7 is a flow diagram of implementing an operation method configured to be executed by a peripheral circuit of a memory device according to an example of the present application.

As shown in FIG. 7, the memory device includes a memory cell array including memory cells that store a plurality of memory bits, the plurality of memory bits corresponding to a plurality of orders of read voltages, and a preset number of the memory cells forming a code word; and a peripheral circuit coupled with the memory cell array and configured to perform the following operations:

Operation S10: Acquire a first result of at least one code word corresponding to a target read voltage of a target order, where the first result indicates the number of flipped bits of the at least one code word in two read results corresponding to a first read voltage and a second read voltage, and a difference between the first read voltage and the second read voltage is less than a preset voltage.

Operation S20: Acquire a predicted valley bottom voltage of the target order according to the first result of the at least one code word corresponding to the target read voltage of the target order and a level in which the target order is located.

Operation S30: Determine a target valley bottom voltage of the target order based on the predicted valley bottom voltage of the target order, where the target valley bottom voltage is taken as a read voltage for a read operation performed on the at least one code word.

Here, a structure of the memory device is referred to above FIG. 3 and is no longer repeated herein.

In some examples, the memory device includes the memory cell array including a plurality of memory cells, and a preset number of the memory cells form one code word (CW).

In some examples, the number of memory cells included in one code word is the same as the number of memory cells included in one time of coding or decoding during error correction coding or decoding. In some examples, the number of memory cells included in one code word may be less than or equal to the number of memory cells coupled with one physical page, for example, the number of memory cells included in one code word is ¼ of the number of memory cells coupled with one physical page. In some examples, the code word may include 24 to 212 memory cells. In an example, the code word may include 24, 28, or 212 memory cells.

Overall, different memory systems may choose different sizes of code words to meet performance, reliability, and storage demands thereof.

Memory cells (such as the MLC, the TLC, or the QLC) in different types of memory devices may store different numbers of bits.

It is to be noted that the code word may have some additional reserved spaces for management and error correction in practice, and thus the number of memory cells required in practice may slightly exceed above calculation.

It may be understood that the code word may include a plurality of memory cells, and the number of memory cells included in the code word may be adjusted according to an actual situation.

In some examples, during a process of reading the memory device, one read operation may read data of one physical page. When the number of memory cells included in one code word may be less than the number of memory cells coupled with one physical page, the code word may be a unit executed for acquiring the first result, without excluding the case of a plurality of code words. In other words, the first result of at least one code word corresponding to a current read voltage may be acquired here. For example, one physical page may correspond to 4 code words, a page buffer hardware operation may count respective Fail Bit Counts (FBCs) of the 4 code words at one time, and then the FBCs of the four code words are summed to obtain an FBC of one physical page. A sum value is used in subsequent calculation. It may be understood that the first result here may be data based on one physical page, and one physical page may correspond to a plurality of code words.

In some examples, the memory cell array includes memory cells with M memory bits, where the M memory bits correspond to M pages respectively, and M bits of data stored in the M-bit memory cell is read via N levels of read voltages; M and N are both integers greater than 1, and $N=2^M-1$.

Figure 8A:
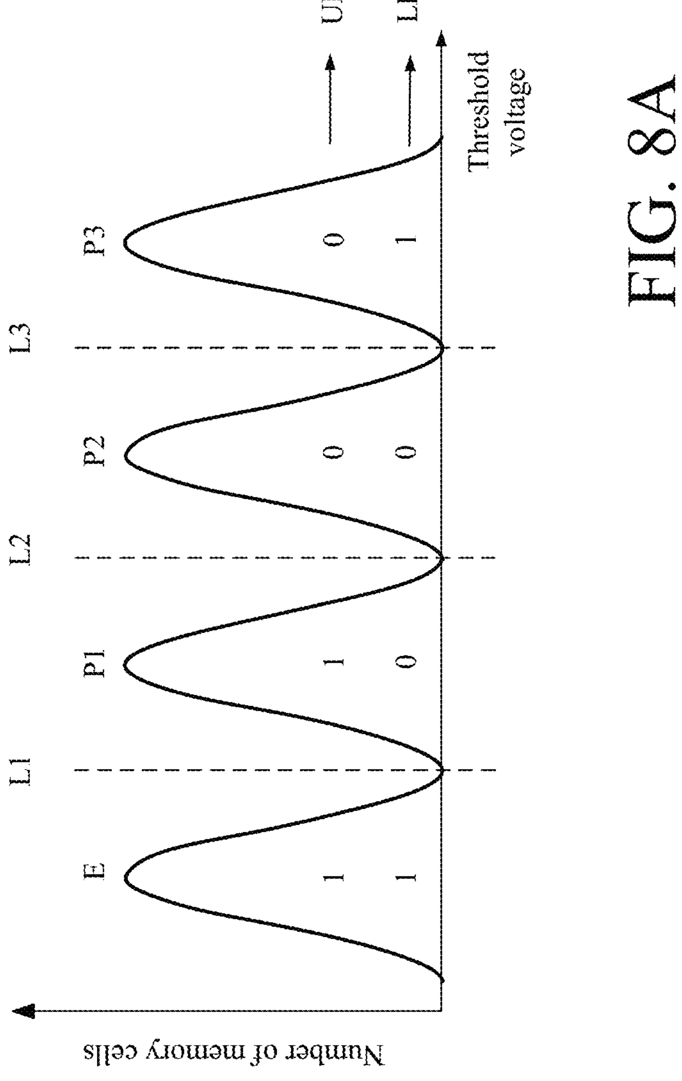
FIG. 8A is a schematic diagram of a threshold voltage distribution corresponding to memory cells each including two memory bits according to an example of the present application.

In an example, when there are two memory bits in the memory cell, corresponding storage states include zeroth to third states. Referring to FIG. 8A, the four states are a zeroth state (also referred to as an erased state) E, a first state (also referred to as a first storage state) P1, a second state (also referred to as a second storage state) P2, and a third state (also referred to as a third storage state) P3 respectively, and binary data corresponding to the four states are 11, 10, 00, and 01 respectively. Accordingly, the memory device includes two pages, which are a Lower Page (LP) and an Upper Page (UP) respectively.

Taking the memory cell shown in FIG. 8A as an example, the two-bit, four-state data stored in the two-bit memory cell is read through three levels of read voltages (a first-level read voltage L1, a second-level read voltage L2, and a third-level read voltage L3 as shown in FIG. 8A).

In an example, one of the pages corresponds to multi-level read voltages, and the other page corresponds to one level of read voltage. As shown in FIG. 8A, the lower page corresponds to binary data 1001 respectively, and a read of the lower page requires the corresponding first-level read voltage L1 and the third-level read voltage L3. The upper page corresponds to binary data 1100 respectively, and a read of the upper page requires the corresponding second-level read voltage L2.

Figure 8B:
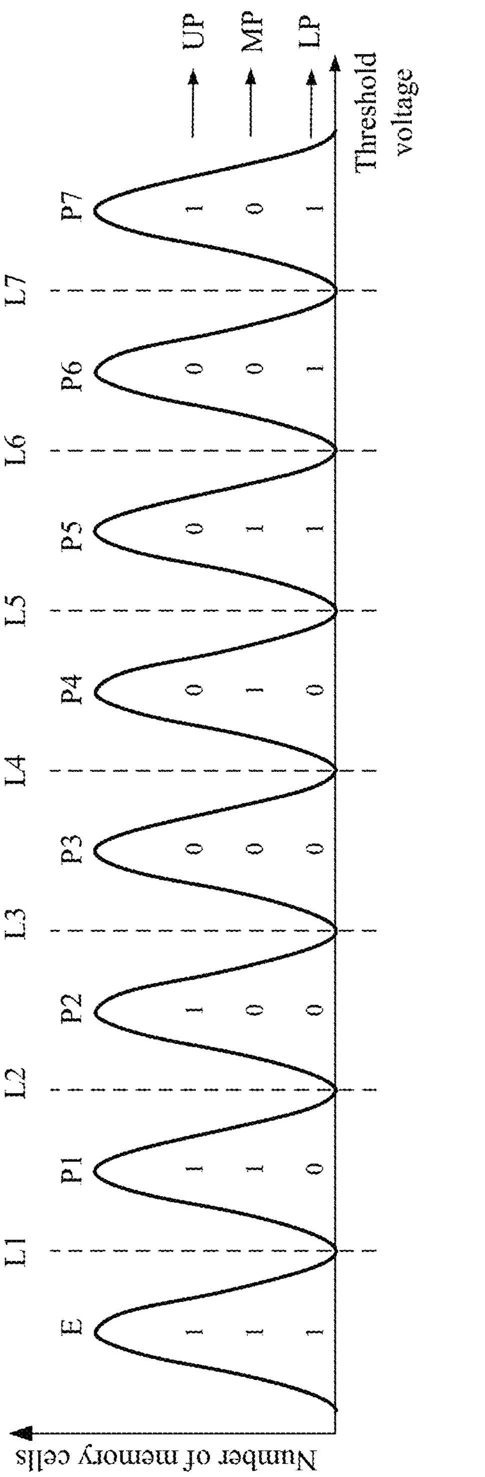
FIG. 8B is a schematic diagram of a threshold voltage distribution corresponding to memory cells each including three memory bits according to an example of the present application.

In an example, when there are three memory bits in the memory cell, corresponding storage states include zeroth to seventh states. Referring to FIG. 8B, the eight states are a zeroth state (also referred to as an erased state) E, a first state (also referred to as a first storage state) P1, a second state (also referred to as a second storage state) P2, . . . , and a seventh state (also referred to as a seventh storage state) P7 respectively, and binary data corresponding to the eight states are 111, 110, 100, 000, 010, 011, 001, and 101 respectively. Accordingly, the memory device includes three pages, which are a lower page, a Middle Page (MP) and an upper page respectively.

Taking the memory cell shown in FIG. 8B as an example, the three-bit, eight-state data stored in the three-bit memory cell is read through seven levels of read voltages (a first-level read voltage L1, a second-level read voltage L2, a third-level read voltage L3, a fourth-level read voltage L4, a fifth-level read voltage L5, a sixth-level read voltage L6, and a seventh-level read voltage L7 as shown in FIG. 8B).

In an example, each of the pages corresponds to multi-level read voltages. As shown in FIG. 8B, the lower page corresponds to binary data 10000111 respectively, and a read of the lower page requires the corresponding first-level read voltage L1 and the fifth-level read voltage L5. The middle page corresponds to binary data 11001100 respectively, and a read of the middle page requires the corresponding second-level read voltage L2, the fourth-level read voltage L4, and the sixth-level read voltage L6. The upper page corresponds to binary data 11100001 respectively, and a read of the upper page requires the corresponding third-level read voltage L3 and the seventh-level read voltage L7.

Figure 8C:
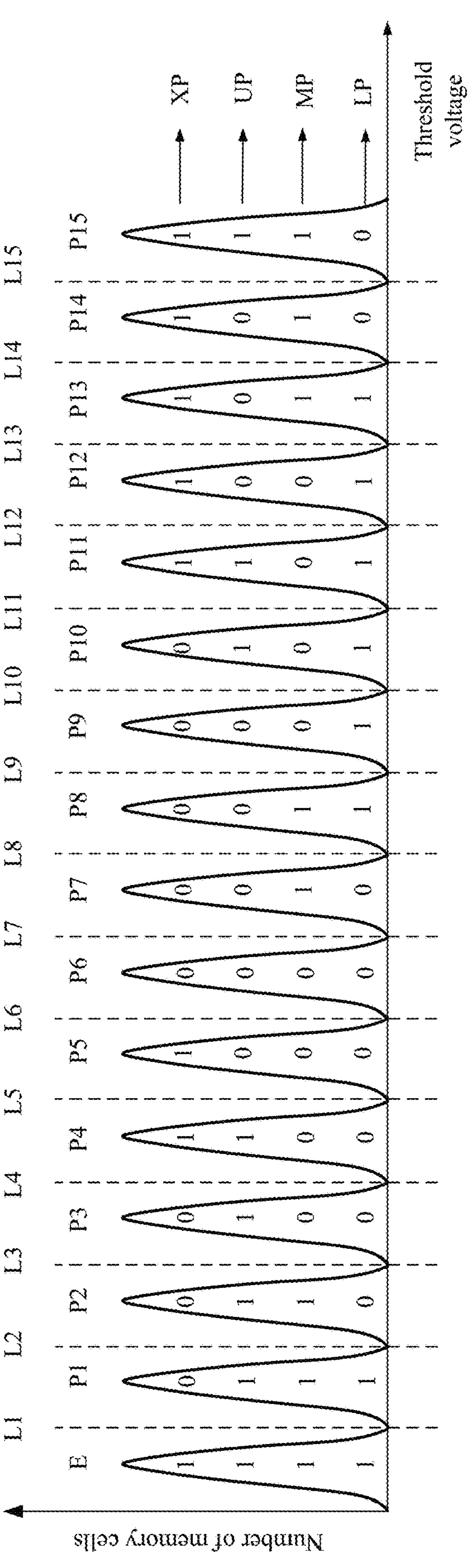
FIG. 8C is a schematic diagram of a threshold voltage distribution corresponding to memory cells each including four memory bits according to an example of the present application.

In an example, when there are four memory bits in the memory cell, corresponding storage states include zeroth to fifteenth states. Referring to FIG. 8C, the sixteen states are a zeroth state (also referred to as an erased state) E, a first state (also referred to as a first storage state) P1, a second state (also referred to as a second storage state) P2, . . . , and a fifteenth state (also referred to as a fifteenth storage state) P15 respectively, and binary data corresponding to the sixteen states are 1111, 0111, 0110, . . . , and 1110 respectively. Accordingly, the memory device includes four pages, which are a lower page, a middle page, an upper page, and an Extra Page (XP) respectively. Here, the four memory bits corresponding to the 16 states are stored in the lower page, the middle page, the upper page, and the extra page.

Taking the memory cell shown in FIG. 8C as an example, the four-bit, sixteen-state data stored in the four-bit memory cell is read through fifteen levels of read voltages (a first-level read voltage L1, a second-level read voltage L2, a third-level read voltage L3, a fourth-level read voltage L4, a fifth-level read voltage L5, a sixth-level read voltage L6, a seventh-level read voltage L7, an eighth-level read voltage L8, a ninth-level read voltage L9, a tenth-level read voltage L10, an eleventh-level read voltage L11, a twelfth-level read voltage L12, a thirteenth-level read voltage L13, a fourteenth-level read voltage L14, and a fifteenth-level read voltage L15 as shown in FIG. 8C).

In an example, each of the pages corresponds to multi-level read voltages. As shown in FIG. 8C, the lower page corresponds to binary data 1100000011111100 respectively, and a read of the lower page requires the corresponding second-level read voltage L2, the eighth-level read voltage L8, and the fourteenth-level read voltage L14. The middle page corresponds to binary data 1110000110000111 respectively, and a read of the middle page requires the corresponding third-level read voltage L3, the seventh-level read voltage L7, the ninth-level read voltage L9, and the thirteenth-level read voltage L13. The upper page corresponds to binary data 1111100000110001 respectively, and a read of the upper page requires the corresponding fifth-level read voltage L5, the tenth-level read voltage L10, the twelfth-level read voltage L12, and the fifteenth-level read voltage L15. The extra page corresponds to binary data 1000110000011111 respectively, and a read of the extra page requires the corresponding first-level read voltage L1, the fourth-level read voltage L4, the sixth-level read voltage L6, and the eleventh-level read voltage L11.

The lower page is typically closest to a source/drain, and thus each of the levels of read voltages corresponding to the lower page is determined preferentially, with a fastest access speed and shortest response time, thereby ensuring leveling performance and durability during data access.

It is to be noted that determining each of the levels of read voltages corresponding to the lower page preferentially is merely an example, and is not intended to limit an order of determining each of the levels of read voltages corresponding to at least part of the pages in the examples of the present application.

In some examples, at least part of the pages correspond to multi-order read voltages, and the multi-order read voltages include a read voltage of a first order and a read voltage of a second order, where the read voltage of the second order is less than the read voltage of the first order. In an example, the read voltage of the first order may be understood as the maximum read voltage in the multi-order read voltages corresponding to each page, and the read voltage of the second order may be understood as other read voltage in the multi-order read voltages corresponding to each page that is less than the maximum read voltage.

It is to be noted that, the first order and the second order are used for distinguishing between a high-level read voltage and a low-level read voltage in the multi-order read voltages corresponding to at least part of the pages, where the low-level read voltage is less than the high-level read voltage. For a memory cell including a plurality of memory bits, one page corresponding to one memory bit may include one or more orders, and one order may include one or more levels.

In an example, referring to FIG. 8A, the memory device includes the lower page and the upper page, where the lower page corresponds to a plurality of orders including the first level and the third level, and the first-level read voltage L1 is less than the third-level read voltage L3. Here, the third-level read voltage L3 corresponds to the read voltage of the first order of the lower page (high-level read voltage of the lower page), and the first-level read voltage L1 corresponds to the read voltage of the second order of the lower page (low-level read voltage of the lower page).

In an example, referring to FIG. 8B, the memory device includes the lower page, the middle page, and the upper page, where each page corresponds to a plurality of orders. A plurality of orders corresponding to the lower page include the first level and the fifth level, where the first-level read voltage L1 is less than the fifth-level read voltage L5. A plurality of orders corresponding to the middle page include the second level, the fourth level, and the sixth level, where the second-level read voltage L2 and the fourth-level read voltage L4 are both less than the sixth-level read voltage L6. A plurality of orders corresponding to the upper page include the third level and the seventh level, where the third-level read voltage L3 is less than the seventh-level read voltage L7. Here, the fifth-level read voltage L5, the sixth-level read voltage L6, and the seventh-level read voltage L7 correspond to read voltages of the first order of the lower page, the middle page, and the upper page respectively, and the first-level read voltage L1, the second-level read voltage L2, the fourth-level read voltage L4, and the third-level read voltage L3 correspond to read voltages of the second order of the lower page, the middle page, and the upper page respectively.

In an example, referring to FIG. 8C, the memory device includes the lower page, the middle page, the upper page, and the extra page, where each page corresponds to a plurality of orders. A plurality of orders corresponding to the lower page include the second level, the eighth level, and the fourteenth level, where the second-level read voltage L2 and the eighth-level read voltage L8 are both less than the fourteenth-level read voltage L14. A plurality of orders corresponding to the middle page include the third level, the seventh level, the ninth level, and the thirteenth level, where the third-level read voltage L3, the seventh-level read voltage L7, and the ninth-level read voltage L9 are all less than the thirteenth-level read voltage L13. A plurality of orders corresponding to the upper page include the fifth level, the tenth level, the twelfth level, and the fifteenth level, where the fifth-level read voltage L5, the tenth-level read voltage L10, and the twelfth-level read voltage L12 are less than the fifteenth-level read voltage L15. A plurality of orders corresponding to the extra page include the first level, the fourth level, the sixth level, and the eleventh level, where the first-level read voltage L1, the fourth-level read voltage L4, and the sixth-level read voltage L6 are less than the eleventh-level read voltage L11. Here, the fourteenth-level read voltage L14, the thirteenth-level read voltage L13, the fifteenth-level read voltage L15, and the eleventh-level read voltage L11 correspond to read voltages of the first order of the lower page, the middle page, the upper page, and the extra page respectively; the second-level read voltage L2 and the eighth-level read voltage L8 correspond to read voltages of the second order of the lower page; the third-level read voltage L3, the seventh-level read voltage L7, and the ninth-level read voltage L9 correspond to read voltages of the second order of the middle page; the fifth-level read voltage L5, the tenth-level read voltage L10, and the twelfth-level read voltage L12 correspond to read voltages of the second order of the upper page; the first-level read voltage L1, the fourth-level read voltage L4, and the sixth-level read voltage L6 correspond to read voltages of the second order of the extra page.

In some examples, the peripheral circuit is configured to: acquire a first result of at least one code word corresponding to a target read voltage of a target order; acquire a predicted valley bottom voltage of the target order according to the first result of the at least one code word corresponding to the target read voltage of the target order and a level in which the target order is located; and determine a target valley bottom voltage of the target order based on the predicted valley bottom voltage of the target order. Here and hereafter, a memory cell array including memory cells having 3 memory bits is described in detail as an example, but this is not used to limit the examples of the present application.

It is to be noted that the level in which the target order is located indicates that the target order belongs to the first order or the second order, and more particularly, the target order is one of a plurality of levels of read voltages corresponding to at least one of the first order or the second order. Therefore, in some particular examples, the peripheral circuit is configured to: acquire the predicted valley bottom voltage of the target order according to the first result of the at least one code word corresponding to the target read voltage of the target order and the level in which the target order is located.

It is to be noted that the predicted valley bottom voltage here may be used directly as the target valley bottom voltage to perform the read operation on the data to be read as required, or be further processed to obtain the target valley bottom voltage. An example method of acquiring the predicted valley bottom voltage will be further described herein below.

Figure 9:
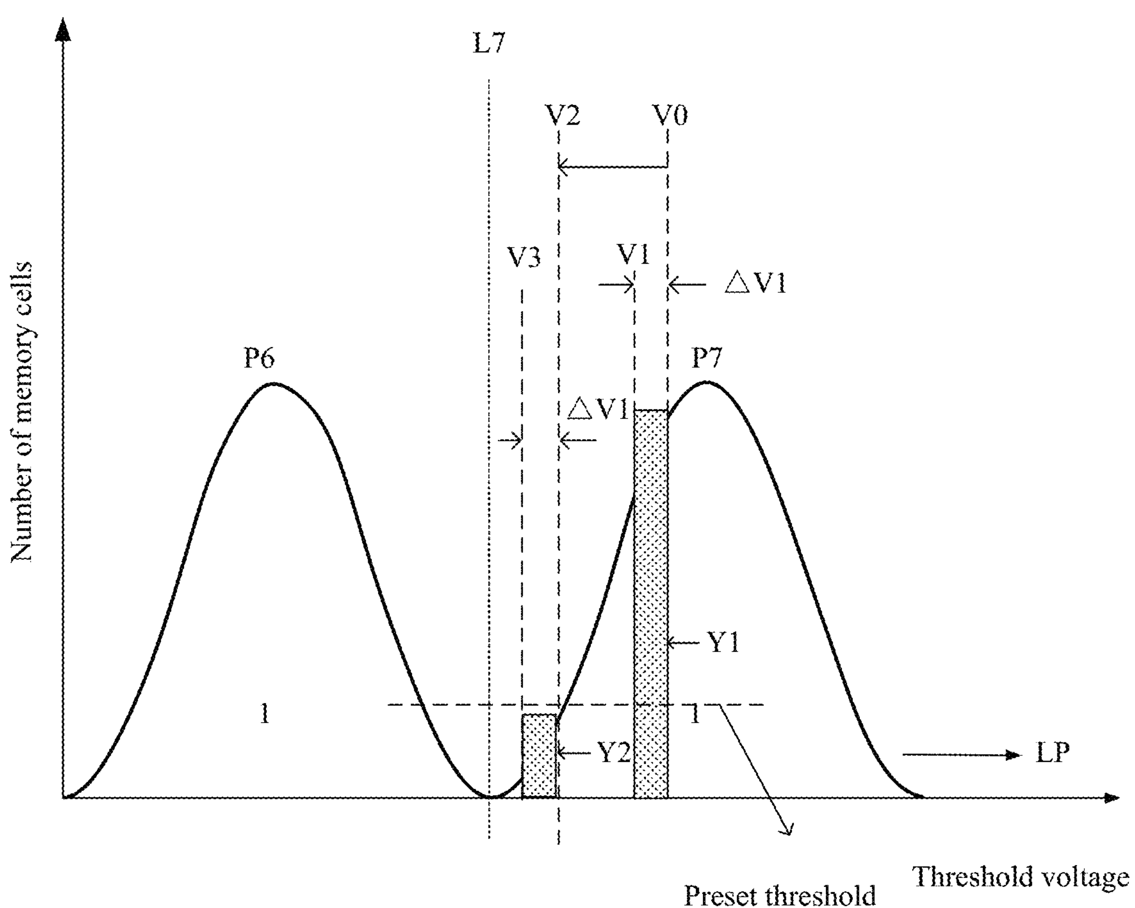
FIG. 9 is a schematic diagram I of a method for determining a target valley bottom voltage of a seventh-level read voltage L7 as shown in FIG. 8B according to an example of the present application.

In an example, as shown in FIG. 9, taking that the target order is the seventh-level read voltage L7 corresponding to the first order as an example, the peripheral circuit is configured to: acquire a first result Y1 of the at least one code word corresponding to a target read voltage (V0 shown in FIG. 9) of the seventh-level read voltage L7; acquire a predicted valley bottom voltage (V2 shown in FIG. 9) of the seventh-level read voltage L7 according to the first result Y1 of the at least one code word corresponding to the target read voltage (V0 shown in FIG. 9) of the seventh-level read voltage L7 and the level in which the seventh-level read voltage L7 is located; and determine a target valley bottom voltage of the seventh-level read voltage L7 based on the predicted valley bottom voltage (V2 shown in FIG. 9) of the seventh-level read voltage L7.

It is to be noted that the difference between the first read voltage and the second read voltage may be less than the preset voltage. In some particular examples, the second read voltage is greater than the first read voltage, and the difference between the first read voltage and the second read voltage is set to a range from 5 mV to 20 mV, and in an example, the difference between the first read voltage and the second read voltage may include 5 mV, 10 mV, 15 mV, or 20 mV. In some other particular examples, the second read voltage is less than the first read voltage, and the difference between the first read voltage and the second read voltage is set to a range from −5 mV to −20 mV, and in an example, the difference between the first read voltage and the second read voltage may include −5 mV, −10 mV, −15 mV, or −20 mV.

It is to be noted that, the first read voltage and the second read voltage are associated backwards and forwards, that is, the second read voltage is obtained after the third adjustment on the first read voltage. Accordingly, the voltage difference between the first read voltage and the second read voltage is a step of the third adjustment. The difference between the first read voltage and the second read voltage being less than the preset voltage may be understood as the first read voltage and the second read voltage having a small voltage in between. The preset voltage is related to the step of the third adjustment and may be a voltage slightly greater than the step of the third adjustment. In some particular examples, the preset voltage is set to a range from 6 mV to 21 mV, and in an example, the preset voltage may include 6 mV, 11 mV, 16 mV, or 21 mV. In some other particular examples, the preset voltage is set to a range from −6 mV to −21 mV, and in an example, the preset voltage may include −6 mV, −10 mV, −16 mV, or −21 mV.

It is to be noted that the first read voltage and the second read voltage are both generalized concepts, the target read voltage and a read voltage obtained after a first adjustment on the target read voltage each can be referred to as the first read voltage, and a read voltage obtained after the third adjustment on the first read voltage may be referred to as the second read voltage. That is, the first read voltage is a generalized concept and may be understood as the target read voltage or an adjusted target read voltage (a voltage obtained after adjusting the target read voltage with a target step, where the target step may be set to a range from 50 mV to 150 mV, and in an example, the target step may include 50 mV, 60 mV, 70 mV, 80 mV, 100 mV, 120 mV or 150 mV).

In the examples of the present application, the first result corresponding to a particular voltage may be understood as follows: when the third adjustment is performed on the particular voltage, that is, there is a first voltage difference ΔV1 between the particular voltage and a voltage after the third adjustment on the particular voltage, the number of flipped bits of a preset number of memory cells in two read results corresponding to the particular voltage and the voltage after the third adjustment on the particular voltage may be taken as the first result corresponding to the particular voltage, where the preset number of memory cells may form at least one code word.

The first result corresponding to the first read voltage may be understood as follows: when the third adjustment is performed on the first read voltage to obtain the second read voltage, that is, there is a first voltage difference ΔV1 between the first read voltage and the second read voltage, the number of flipped bits of the preset number of memory cells in two read results corresponding to the first read voltage and the second read voltage may be taken as the first result corresponding to the first read voltage. The first read voltage may be the target read voltage (V0 shown in FIG. 9) of the target order (the seventh-level read voltage L7), and the second read voltage may be a read voltage (V1 shown in FIG. 9) after the third adjustment on the first read voltage. Alternatively, the first read voltage may be the predicted valley bottom voltage (V2 shown in FIG. 9) of the target order (the seventh-level read voltage L7), and the second read voltage may be a read voltage (V3 shown in FIG. 9) after the third adjustment on the predicted trough voltage of the target order.

In the examples of the present application, the acquisition of the target valley bottom voltage may be understood as follows: the predicted valley bottom voltage of the target order is taken as the target valley bottom voltage of the target order when the predicted valley bottom voltage of the target order satisfies a preset condition. For example, a preset threshold is acquired according to the first result corresponding to the target read voltage of the first order, where the preset threshold indicates a first result corresponding to the maximum in an effective range of predicted valley bottom voltages; and the predicted valley bottom voltage of the first order is taken as the target valley bottom voltage of the first order when the first result corresponding to the predicted valley bottom voltage of the first order is less than the preset threshold.

It is to be noted that the predicted valley bottom voltage here may be taken directly as the target valley bottom voltage to perform the read operation on the data to be read as required, or be further processed to obtain the target valley bottom voltage.

In the examples of the present application, the acquisition of the predicted valley bottom voltage may be understood as follows: the predicted valley bottom voltage of the target order is acquired according to the first result of the at least one code word corresponding to the target read voltage of the target order and the level in which the target order is located. For example, the predicted valley bottom voltage of the target order is acquired according to the first result corresponding to the target read voltage of the target order, the level in which the target order is located, and a mapping function, where the mapping function indicates a relationship among the first result corresponding to the target read voltage, the level in which the target order is located, and the predicted valley bottom voltage of the target order. It is to be noted that, for ease of illustration, the above mapping function in this example is also referred to as a first mapping function, that is, the first mapping function indicates a relationship among the first result corresponding to the target read voltage, the level in which the target order is located, and the predicted valley bottom voltage of the target order.

The acquisition of the predicted valley bottom voltage may be also understood as follows: acquire a predicted valley bottom voltage of a second target order according to the predicted valley bottom voltage/target valley bottom voltage of a first target order, where the first target order includes at least one first order among a plurality of first orders corresponding to the plurality of pages, and the second target order includes at least one of other first orders or the second order, and a read voltage of the second target order is less than a read voltage of the first target order. For example, the predicted valley bottom voltage of the second target order is acquired according to the predicted valley bottom voltage/target valley bottom voltage of the first target order and a second mapping function, where the second mapping function indicates a relationship between the predicted valley bottom voltage/target valley bottom voltage of the first target order and the predicted valley bottom voltage of the second target order.

In the examples of the present application, the acquisition of an adjusted voltage (e.g., the adjusted read voltage/adjusted target read voltage) may be understood as follows: a voltage obtained after adjusting the particular voltage with the target step. For example, a plurality of first adjustments are performed on the target read voltage with a first step, and the target read voltages after the plurality of first adjustments are acquired respectively; or a plurality of second adjustments are performed on the target read voltage with a second step, and the target read voltages after the plurality of second adjustments are acquired respectively. A value of the first step may be set to a range from 50 mV to 150 mV, and the value the first step may include 50 mV, 60 mV, 70 mV, 80 mV, 100 mV, 120 mV or 150 mV. A value of the second step may be set to a range from 20 mV to 40 mV, and the value the second step may include 20 mV, 30 mV, or 40 mV.

In some examples, prior to acquiring the first result of the at least one code word corresponding to the target read voltage of the target order, a read mode of the memory device is set to a Single Level Read (SLR) mode, where the single level read mode includes reading at least one bit of data stored in the memory cell with one level of read voltage.

In some particular examples, the memory device is configured to: enter a single level read mode in response to a mode setting command; and acquire a first result of the at least one code word corresponding to a target read voltage of a target order in the single level read mode.

In some examples, the peripheral circuit is configured to: acquire the predicted valley bottom voltage of the target order according to the first result corresponding to the target read voltage, the level in which the target order is located, and a mapping function, where the mapping function indicates a relationship among the first result corresponding to the target read voltage, the level in which the target order is located, and the predicted valley bottom voltage of the target order.

In some examples, the peripheral circuit is configured to: calculate a product of a prediction direction and a tune, where the prediction direction is determined according to the first result corresponding to the target read voltage, a program state of a memory block in which the code word is located, and the level in which the target order is located, and the tune is determined according to the first result corresponding to the target read voltage and the level in which the target order is located; and take a sum of the product and the target read voltage as the predicted valley bottom voltage of the target order.

In some examples, the peripheral circuit is configured to: acquire the tune according to the first result corresponding to the target read voltage, the level in which the target order is located, a first constant, a second constant, and a step, where the first constant and the second constant are both fixed values related to the level in which the target order is located, and the step is related to the first constant and the second constant.

The term "first result corresponding to the target read voltage" in the present application may be abbreviated to "first result of the first occurrence".

In some particular examples, the tune is obtained according to the first result of the first occurrence fFBC, the level in which the target order is located, the first constant fbc_ref1, the second constant fbc_ref2, and the step. In an example, a formula (1) for obtaining the tune is: tune=mult*step+remd/fbc_ref2.

A formula (2) for obtaining a first parameter mult is: mult=fFBC/fbc_ref1, where the first parameter mult indicates a quotient obtained by dividing the first result of the first occurrence fFBC by the first constant fbc_ref1. A formula (3) for obtaining a second parameter remd is: remd=fFBC % fbc_ref2, where the second parameter remd indicates a remainder obtained by dividing the first result of the first occurrence fFBC by the second constant fbc_ref2.

It is to be noted that remd/fbc_ref2 in formula (1) indicates a remainder obtained by dividing the second parameter remd by the second constant fbc_ref2.

In some particular examples, the prediction direction dir is obtained according to the first result of the first occurrence fFBC, the program state of the memory block in which the code word is located, and the level in which the target order is located. The program state of the memory block in which the code word is located comprises a complete programmed state and a partial programmed state. The memory block in which the code word is located and having all the memory cells therein being programmed is referred to as a Close Block, and the memory block in which the code word is located and having only part of the memory cells therein being programmed is referred to as an Open Block. The level in which the target order is located indicates that the target order belongs to the first order or the second order, and more particularly, the target order is one of a plurality of levels of read voltages corresponding to at least one of the first order or the second order. It may be understood that the prediction direction dir is related to the level in which the target order is located.

A value of the prediction direction may be a preset value acquired according to the first result of the first occurrence, the program state of the memory block in which the code word is located, and the level in which the target order is located. The preset value may be set according to empirical values or may be a default value in a factory configuration of the memory device that is obtained via extensive simulation experiments.

In an example, the value of the prediction direction dir is 0, 1, or −1.

In some particular examples, a predicted shift guess_sft of the predicted valley bottom voltage pred_valley of the target order with respect to the target read voltage v_default of the target order is obtained according to the prediction direction dir, the tune, and the target read voltage v_default of the target order. In an example, a formula (4) for obtaining the predicted shift guess_sft is: guess_sft=dir*tune.

Here, the target read voltage v_default of the target order may be a preset read voltage that enables distinguishing between two adjacent memory states of the memory cells of the memory device during a previous read, where the preset read voltage may be set according to empirical values or may be a default value in the factory configuration of the memory device that is obtained via extensive simulation experiments.

In some particular examples, the predicted valley bottom voltage pred_valley of the target order is acquired based on the target read voltage v_default of the target order and the predicted shift guess_sft.

In an example, a formula (5) for acquiring the predicted valley bottom voltage pred_valley of the target order is pred_valley=guess_sft+v_default.

The first constant fbc_ref1 is a fixed value related to the level in which the target order is located. In the case of the TLC, the example first constant fbc_ref1 is {DMY, 150, 200, 300, 300, 250, 140, 140}. In some examples, a value of the first constant fbc_ref1 is related to level in which the target order is located, and more particularly, the value of the first constant fbc_ref1 is related to the level of the read voltage of the target order. When the target order is the first-level read voltage L1, the second-level read voltage L2, the third-level read voltage L3, the fourth-level read voltage L4, the fifth-level read voltage L5, the sixth-level read voltage L6, or the seventh-level read voltage L7 respectively, the value of the first constant fbc_ref1 is 150, 200, 300, 300, 250, 140, or 140 respectively.

The second constant fbc_ref2 is a fixed value related to the level in which the target order is located, and the example second constant fbc_ref2 is {DMY, 35, 30, 35, 35, 60, 35, 40}. In some examples, a value of the second constant fbc_ref2 is related to the level in which the target order is located, and more particularly, the value of the second constant fbc_ref2 is related to the level of the read voltage of the target order. When the target order is the first-level read voltage L1, the second-level read voltage L2, the third-level read voltage L3, the fourth-level read voltage L4, the fifth-level read voltage L5, the sixth-level read voltage L6, or the seventh-level read voltage L7 respectively, the value of the second constant fbc_ref2 is 35, 30, 35, 35, 60, 35, or 40 respectively.

An example value range of the step is from 6 DAC to 10 DAC (DAC represents a unit of voltage offset). More particularly, a value of the step may include 6 DAC, 8 DAC, or 10 DAC.

The value of the step is related to the first constant fbc_ref1 and the second constant fbc_ref2, that is, the particular value of the step changes with the first constant fbc_ref1 and the second constant fbc_ref2 in the value range from 6 DAC to 10 DAC.

It is to be noted that a conversion relationship between DAC and mV is 1 DAC=10 mV.

In the case of the example first constant fbc_ref1 {DMY, 150, 200, 300, 300, 250, 140, 140} and the example second constant fbc_ref2 {DMY, 35, 30, 35, 35, 60, 35, 40}, the example step is 8 DAC.

It is to be noted that the first constant fbc_ref1 and the second constant fbc_ref2 are both fixed values related to the level in which the target order is located, and the step is related to the first constant fbc_ref1 and the second constant fbc_ref2. The first constant fbc_ref1, the second constant fbc_ref2, and the step may be empirical values; and may also be default values in the factory configuration of the memory device that are obtained via extensive simulation experiments before the memory device leaves the factory.

Example values of the prediction direction dir are shown in Table 1. When the memory block in which the code word is located is the close block and the target order is the first-level read voltage L1, the second-level read voltage L2, the third-level read voltage L3, the fourth-level read voltage L4, the fifth-level read voltage L5, the sixth-level read voltage L6, or the seventh-level read voltage L7 respectively, the respective value of the prediction direction dir is 1, 1, 1, −1, −1, −1, −1, or −1. When the memory block in which the code word is located is the open block and the target order is the first-level read voltage L1, the second-level read voltage L2, the third-level read voltage L3, the fourth-level read voltage L4, the fifth-level read voltage L5, the sixth-level read voltage L6, or the seventh-level read voltage L7 respectively, the respective value of the prediction direction dir is always −1.

TABLE 1

| | Level | | | | | | |
|---|---|---|---|---|---|---|---|
| Memory Block Type | L1 | L2 | L3 | L4 | L5 | L6 | L7 |
| Close Block | 1 | 1 | 1 | −1 | −1 | −1 | −1 |
| Open Block | −1 | −1 | −1 | −1 | −1 | −1 | −1 |

Above formulas and related parameters (e.g., the first constant, the second constant, the step, and the prediction direction, etc.) are merely used as examples, and the formulas and related parameters in the examples of the present application may be adjusted according to actual product performance.

In a particular example, a process of acquiring the predicted valley bottom voltage of the target order is illustrated in conjunction with the formulas in the above examples, particular examples of the first constant, the second constant, the step, and the prediction direction in the case of the TLC, and FIG. 9. Since the target order is the seventh-level read voltage L7, the value of the first constant fbc_ref1 is 140, the value of the second constant fbc_ref2 is 40, and the value of the step is 8 DAC. Assuming that the memory block in which the code word is located is the open block, with reference to the particular examples in Table 1, the value of the prediction direction dir is-1.

In an example, the first result of the first occurrence fFBC corresponding to the seventh-level read voltage L7 shown in FIG. 9 is 627, and a shift corresponding to the target read voltage v_default of the seventh-level read voltage L7 is 0. The first parameter mult is obtained according to the formula (2), which is a quotient of 627/140, i.e., the first parameter mult is equal to 4. The second parameter remd is obtained according to the formula (3), which a remainder of 627/40, i.e., the second parameter remd is equal to 67. The tune is obtained according to the formula (1), which is tune-4*8+67/40=33. The predicted shift guess_sft=(−1)*33 DAC=−33 DAC is obtained according to the formula (4). The predicted valley bottom voltage pred_valley=−33 DAC+v_default of the seventh-level read voltage L7 is obtained according to the formula (5). It may be understood that the predicted valley bottom voltage pred_valley of the seventh-level read voltage L7 is subjected to a leftward (a direction of voltage decrease) shift of 33 DAC, compared to the target read voltage of the seventh-level read voltage L7.

Figure 10:
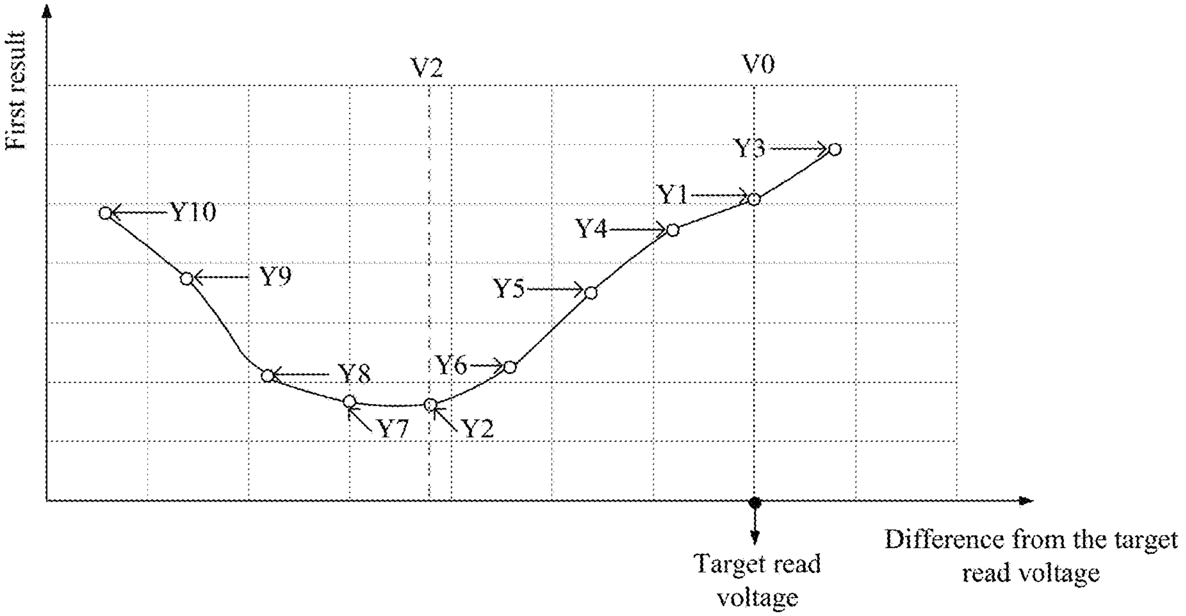
FIG. 10 is a schematic diagram of a method for determining the target valley bottom voltage of the seventh-level read voltage L7 as shown in FIG. 9 according to an example of the present application.

FIG. 10 is a schematic diagram of a method for determining the target valley bottom voltage of the seventh-level read voltage L7 as shown in FIG. 9 according to an example of the present application. In an example, as shown in FIG. 10, the first result Y1 of at least one code word corresponding to the target read voltage (V0 shown in FIG. 10) of the seventh-level read voltage L7 is acquired, a plurality of adjustments are performed on the target read voltage (V0 shown in FIG. 10) of the seventh-level read voltage L7 to acquire a plurality of adjusted target read voltages with different differences from the target read voltage, and a plurality of first results Y2, Y3, Y4, Y5, Y6, Y7, Y8, Y9, and Y10 of the at least one code word corresponding to the plurality of adjusted target read voltages respectively, where the first result Y2 is the minimum among the plurality of first results. Thus, the adjusted target read voltage (V2 shown in FIG. 10) corresponding to the first result Y2 is taken as the target valley bottom voltage of the seventh-level read voltage L7.

It is to be noted that, as shown in FIG. 10, the plurality of adjustments (e.g., 9 adjustments) are performed on the target read voltage of the seventh-level read voltage L7 and the plurality of first results corresponding to the plurality of adjusted target read voltages are acquired, such that the target valley bottom voltage determined according to the plurality of first results and the predicted valley bottom voltage (V2 shown in FIG. 9) obtained directly using the mapping function (first mapping function) as shown in FIG. 9 have substantially the equal difference from the target read voltage. It may be understood that compared to obtaining the target valley bottom voltage by performing a plurality times of cyclic iteration using the target read voltage of the target order, a method of directly obtaining the predicted valley bottom voltage of the target order according to the first result of the at least one code word corresponding to the target read voltage of the target order can reduce the number of times of cyclic iteration, thus obtaining the target valley bottom voltage more quickly and more accurately.

In some examples, the peripheral circuit is configured to: acquire predicted valley bottom voltages of other orders among the plurality of orders than the target order respectively. In an example, a predicted valley bottom voltage of the third-level read voltage L3 is acquired using a manner similar to that of acquiring the predicted valley bottom voltage of the seventh-level read voltage L7, where the predicted valley bottom voltage of the seventh-level read voltage L7 and the predicted valley bottom voltage of the third-level read voltage L3 may be used to read data of the upper page of the at least one code word. A predicted valley bottom voltage of the first-level read voltage L1 and a predicted valley bottom voltage of the fifth-level read voltage L5 are acquired using a manner similar to that of acquiring the predicted valley bottom voltage of the seventh-level read voltage L7, and used to read data of the lower page of the at least one code word. A predicted valley bottom voltage of the second-level read voltage L2, a predicted valley bottom voltage of the fourth-level read voltage L4, and a predicted valley bottom voltage of the sixth-level read voltage L6 are acquired using a manner similar to that of acquiring the predicted valley bottom voltage of the seventh-level read voltage L7, and used to read data of the middle page of the at least one code word.

In some examples, the peripheral circuit is configured to: take the predicted valley bottom voltage of the target order as the target valley bottom voltage of the target order when the predicted valley bottom voltage of the target order satisfies a preset condition; and take a first result corresponding to a previous predicted valley bottom voltage as a first result in the mapping function (first mapping condition) when the predicted valley bottom voltage of the target order does not satisfy the preset condition, and perform a cyclic iteration according to the mapping function (first mapping condition), until the predicted valley bottom voltage of the target order satisfies the preset condition.

In some examples, the peripheral circuit is configured to: acquire a preset threshold according to the first result corresponding to the target read voltage, where the preset threshold indicates a first result corresponding to the maximum in an effective range of predicted valley bottom voltages; and take the predicted valley bottom voltage of the target order as the target valley bottom voltage of the target order when the first result corresponding to the predicted valley bottom voltage of the target order is less than the preset threshold.

In some particular examples, the target read voltage may be set according to an empirical value (e.g., a read voltage corresponding to a data read success); and may also be a default value in the factory configuration of the memory device that is obtained via extensive simulation experiments before the memory device leaves the factory. A default valley bottom voltage may be a default value in the factory configuration of the memory device that is obtained via extensive simulation experiments.

The term “first result corresponding to the default valley bottom voltage” in the present application may be abbreviated to “default first result”.

In some examples, the preset threshold is positively correlated with a shift degree, where the shift degree is an absolute value of a difference between the first result of the first occurrence and the default first result.

Figure 11A:
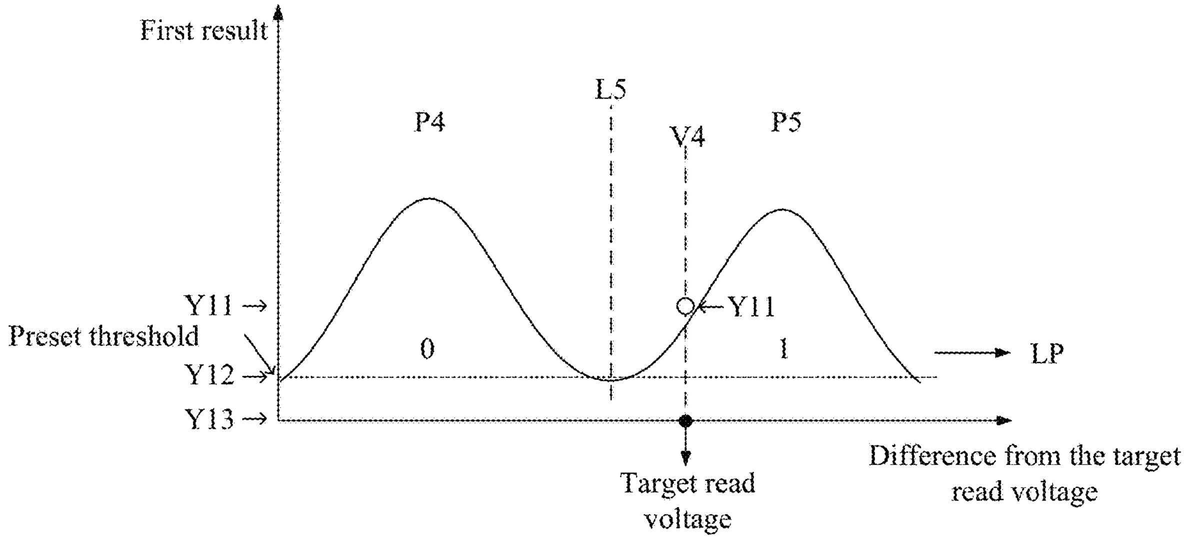
FIG. 11A is a schematic diagram I of a method for determining a preset threshold corresponding to a fifth-level read voltage corresponding to a lower page as shown in FIG. 8B according to an example of the present application.
Figure 11B:
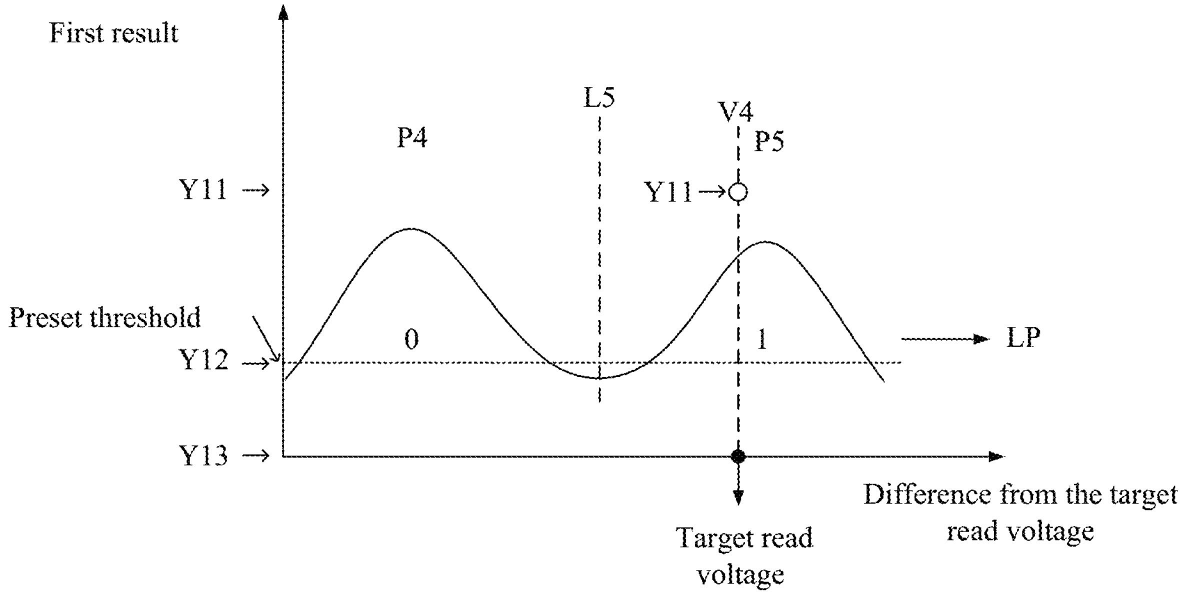
FIG. 11B is a schematic diagram II of a method for determining the preset threshold corresponding to the fifth-level read voltage corresponding to the lower page as shown in FIG. 8B according to an example of the present application.

In an example, if the absolute value of the difference between the first result of the first occurrence and the default first result is larger, then the preset threshold is also larger. As a difference between the first result of the first occurrence Y11 and the default first result Y13 in FIG. 11A is less than a difference between the first result of the first occurrence Y11 and the default first result Y13 in FIG. 11B, it can be seen that a preset threshold in FIG. 11A (Y12 shown in FIG. 11A) is less than a preset threshold (Y12 shown in FIG. 11B) in FIG. 11B.

In some examples, the peripheral circuit is configured to: take the predicted valley bottom voltage of the target order as the target valley bottom voltage of the target order when the predicted valley bottom voltage of the target order satisfies a preset condition. In an example, as shown in FIG. 9, the peripheral circuit is configured to: acquire the preset threshold according to the first result Y1 corresponding to the target read voltage (V0 shown in FIG. 9); and take the predicted valley bottom voltage (V2 shown in FIG. 9) of the target order (seventh-level read voltage L7) as the target valley bottom voltage of the target order when the first result Y2 corresponding to the predicted valley bottom voltage (V2 shown in FIG. 9) of the target order (seventh-level read voltage L7) is less than the preset threshold.

In some examples, the peripheral circuit is configured to: take a first result corresponding to a previous predicted valley bottom voltage as a first result in the mapping function (first mapping condition) when the predicted valley bottom voltage of the target order does not satisfy the preset condition, and perform a cyclic iteration according to the mapping function (first mapping condition), until the predicted valley bottom voltage of the target order satisfies the preset condition. In an example, as shown in FIG. 12, the peripheral circuit is configured to: take the first result (Y2 shown in FIG. 12) corresponding to the predicted valley bottom voltage (V2 shown in FIG. 12) as the first result in the mapping function (the first mapping function) when the predicted valley bottom voltage (V2 shown in FIG. 12) of the target order (seventh-level read voltage L7) is greater than the preset threshold; and perform the cyclic iteration according to the mapping function (the first mapping function) disclosed in the above examples of the present application, until the first result (Y14 shown in FIG. 12) corresponding to the predicted valley bottom voltage (V5 shown in FIG. 12) of the target order (seventh-level read voltage L7) is less than the preset threshold, whereby the predicted valley bottom voltage (V5 shown in FIG. 12) of the target order (seventh-level read voltage L7) may be taken as the target valley bottom voltage of the target order (seventh-level read voltage L7).

Figure 12:
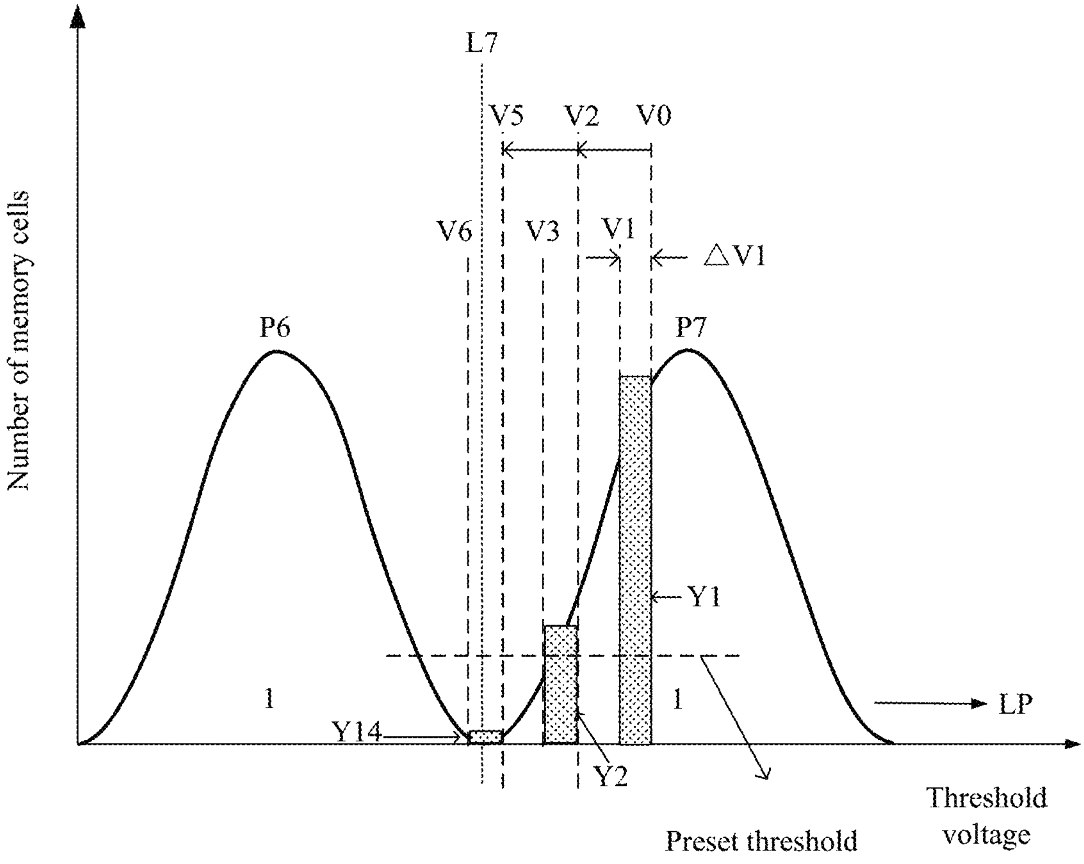
FIG. 12 is a schematic diagram II of a method for determining the target valley bottom voltage of the seventh-level read voltage as shown in FIG. 8B according to an example of the present application.

The first result Y14 is the number of flipped bits in the two read results corresponding to the first read voltage (V5 shown in FIG. 12) and the second read voltage (V6 shown in FIG. 12). FIG. 12 illustrates a case where a predicted valley bottom voltage of the target order after only one time of cyclic iteration, which is performed according to the mapping function (the first mapping function) when the predicted valley bottom voltage of the target order that does not satisfy the preset condition, satisfies the preset condition. It is to be noted that the number of times of the cyclic iteration may be adjusted according to an actual situation.

In some examples, the peripheral circuit is configured to: when the predicted valley bottom voltage of the target order still does not satisfy the preset condition after the cyclic iteration is performed according to the mapping function more than a preset number of times, perform a plurality of first adjustments on the predicted valley bottom voltage of the target order with a first step, and acquire first results corresponding to read voltages after the plurality of first adjustments respectively; determine an inflection point value according to the acquired first results corresponding to the read voltages after the plurality of first adjustments, where a read voltage corresponding to the inflection point value is an inflection point voltage; perform a plurality of second adjustments on the inflection point voltage with a second step, and acquire first results corresponding to read voltages after the plurality of second adjustments respectively, where the second step is less than the first step; and determine the target valley bottom voltage of the target order according to the acquired first results corresponding to the read voltages after the plurality of second adjustments.

Figure 13:
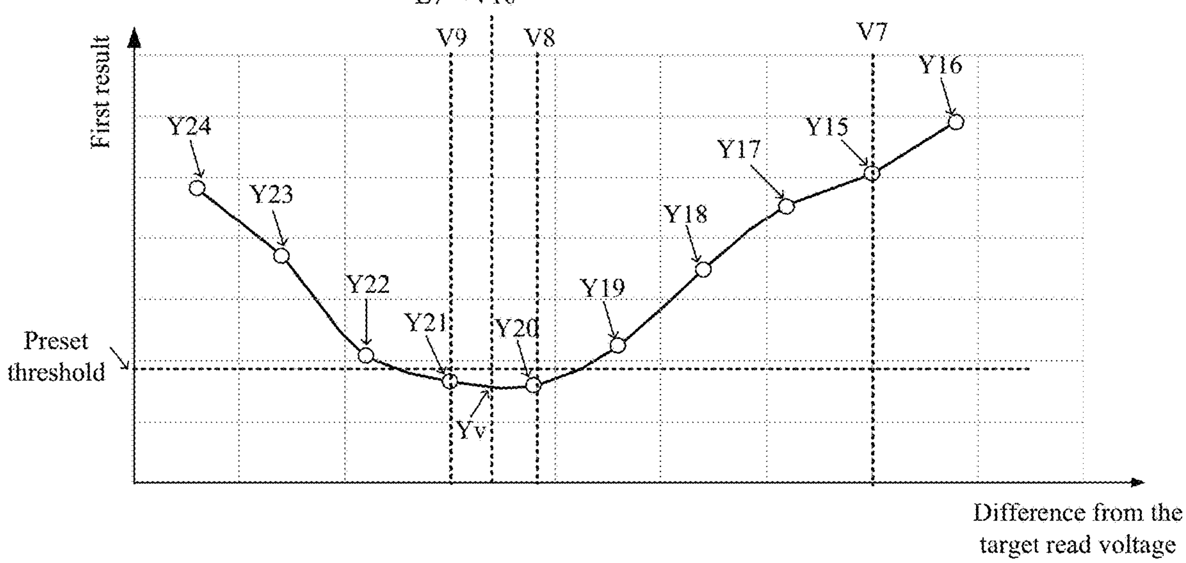
FIG. 13 is a schematic diagram of a method for determining a target valley bottom voltage of the seventh-level read voltage corresponding to an upper page as shown in FIG. 12 according to an example of the present application.

In some particular examples, as shown in FIG. 13, the peripheral circuit is configured to: when the first result corresponding to the predicted valley bottom voltage (V7 as shown in FIG. 13) of the target order (seventh-level read voltage L7) is still greater than the preset threshold after the cyclic iteration is performed according to the mapping function (the first mapping function) more than the preset number of times, perform the plurality of first adjustments on the predicted valley bottom voltage (V7 as shown in FIG. 13) of the target order with the first step, and acquire the first results corresponding to the read voltages after the plurality of first adjustments respectively.

In some examples, the preset number of times includes 3-7, and in an example, the preset number of times may include 3, 5, or 7.

In some examples, as shown in FIG. 13, the peripheral circuit is configured to acquire the inflection point voltage through the following operations: after acquiring the first result Y15 corresponding to the predicted valley bottom voltage (V7 as shown in FIG. 13) of the target order (seventh-level read voltage L7), perform a first time of first adjustment with the first step (positive) on the predicted valley bottom voltage (V7 as shown in FIG. 13) by taking the predicted valley bottom voltage (V7 as shown in FIG. 13) as a reference, to obtain the first result Y16, and perform a second time of first adjustment with the first step (negative) on the predicted valley bottom voltage (V7 as shown in FIG. 13), to obtain the first result Y17.

If the first result Y16 is greater than the first result Y15 and the first result Y17 is less than the first result Y15, it is determined that the plurality of adjustments are performed on the target read voltage with the first step (negative), to obtain the first results after the plurality of adjustments (e.g., first results Y18 to Y21, or first results Y18 to Y23, or first results Y18 to Y24).

Upon at least one upward trend, it is determined to stop the first adjustment on the predicted valley bottom voltage (V7 as shown in FIG. 13). Here, one upward trend may be understood as follows: a case where the first result Y(P+1) after a P-th time of first adjustment with the first step (negative) on the predicted valley bottom voltage (V7 as shown in FIG. 13) is less than the first result (P+2) after a (P+2)-th time of first adjustment with the first step (negative) on the predicted valley bottom voltage (V7 as shown in FIG. 13) is determined to be one upward trend. For example, a case where the first result Y21 is greater than the first result Y20, the first result Y22 is greater than the first result Y21, the first result Y23 is greater than the first result Y22, or the first result Y23 is greater than the first result Y22 may be determined to be one upward trend.

The minimum in the acquired first results corresponding to the read voltages after the plurality of first adjustments is determined to be the inflection point value, where the read voltage after the first adjustment and corresponding to the inflection point value is the inflection point voltage. For example, the minimum in the plurality of first results is the first result Y20, the first result Y20 is taken as the inflection point value, and the read voltage after the first adjustment and corresponding to the inflection point value is the inflection point voltage V8.

In some examples, the first results corresponding to the read voltages after the plurality of first adjustments include a first adjacent value and a second adjacent value both adjacent to the inflection point value, and the peripheral circuit is configured to: restrict a read voltage after each adjustment in the plurality of second adjustments between a read voltage corresponding to the first adjacent value and the inflection point voltage according to a difference between the first adjacent value and the inflection point value being less than a difference between the second adjacent value and the inflection point value; acquire an average of the read voltage corresponding to the first adjacent value and the inflection point voltage, when a first result corresponding to the average is less than the preset threshold, take the average as the target valley bottom voltage; and when the first result corresponding to the average is greater than or equal to the preset threshold, continue to perform the second adjustments between the read voltage corresponding to the first adjacent value and the inflection point voltage, until a first result corresponding to an adjusted read voltage is less than the preset threshold.

In some particular examples, as shown in FIG. 13, the peripheral circuit is configured to: after acquiring the inflection point value (first result Y20) and the inflection point voltage V8, perform at least one second adjustment with the second step to obtain an adjusted predicted valley bottom voltage by taking the inflection point voltage V8 as a reference. A detailed process of performing the at least one second adjustment with the second step may be understood with reference to the detailed process of performing at least one first adjustment with the first step in the above examples, which is no longer repeated here.

Here, the second step is less than the first step. In some examples, the first step may range from 50 mV to 150 mV, and in an example, the first step may include 50 mV, 80 mV, 100 mV, 120 mV, or 150 mV. The second step may be a smaller step. In some examples, the second step may range from 20 mV to 40 mV, and in an example, the second step may include 20 mV, 30 mV, or 40 mV.

In some particular examples, as shown in FIG. 13, the peripheral circuit is configured to: restrict the read voltage after each adjustment in the plurality of second adjustments between the read voltage (V9 shown in FIG. 13) corresponding to the first adjacent value (the first result Y21) and the inflection point voltage V8 according to the difference between the first adjacent value (the first result Y21) and the inflection point value (the first result Y20) being less than the difference between the second adjacent value (the first result Y19) and the inflection point value (the first result Y20); and acquire the average of the read voltage (V9 shown in FIG. 13) corresponding to the first adjacent value (the first result Y21) and the inflection point voltage V8, and when the first result Yv corresponding to the average is less than the preset threshold, take the average (V10 shown in FIG. 13) as the target valley bottom voltage of the seventh-level read voltage L7.

In some particular examples, the peripheral circuit is configured to: when the first result Yv corresponding to the average is greater than or equal to the preset threshold, continue to perform the second adjustment between the read voltage (V9 shown in FIG. 13) corresponding to the first adjacent value (the first result Y21) and the inflection point voltage V8, until a first result corresponding to an adjusted read voltage is less than the preset threshold.

In some particular examples, the peripheral circuit is configured to: acquire a predicted valley bottom voltage of a second target order according to a predicted valley bottom voltage of a first target order, where the first target order includes at least one first order among a plurality of first orders corresponding to the plurality of pages, and the second target order includes at least one of other first orders or the second order, and a read voltage of the second target order is less than a read voltage of the first target order.

Here, a memory cell array including memory cells having 3 memory bits is described in detail as an example, but this is not used to limit the examples of the present application. As shown in FIG. 8B, the fifth-level read voltage L5, the sixth-level read voltage L6, and the seventh-level read voltage L7 correspond to read voltages of the first order of the lower page, the middle page, and the upper page respectively; the first-level read voltage L1, the second-level read voltage L2, the fourth-level read voltage L4, and the third-level read voltage L3 correspond to read voltages of the second order of the lower page, the middle page, and the upper page respectively. The first target order includes at least one of the fifth-level read voltage L5, the sixth-level read voltage L6, and the seventh-level read voltage L7. The second target order includes at least one of other first orders or the second order. In an example, when the first target order is the seventh-level read voltage L7, the second target order includes the fifth-level read voltage L5, at least one of the sixth-level read voltage L6 or the first-level read voltage L1, the second-level read voltage L2, the fourth-level read voltage L4, and the third-level read voltage L3.

In some examples, when the first target order is the seventh-level read voltage L7, the predicted valley bottom voltages of all the other first orders and the second order may be obtained according to the predicted valley bottom voltage of the seventh-level read voltage L7, that is, the predicted valley bottom voltages of the first-level read voltage L1, the second-level read voltage L2, the fourth-level read voltage L4, the fifth-level read voltage L5, and the sixth-level read voltage L6 may be directly obtained according to the predicted valley bottom voltage of the seventh-level read voltage L7.

Figure 14:
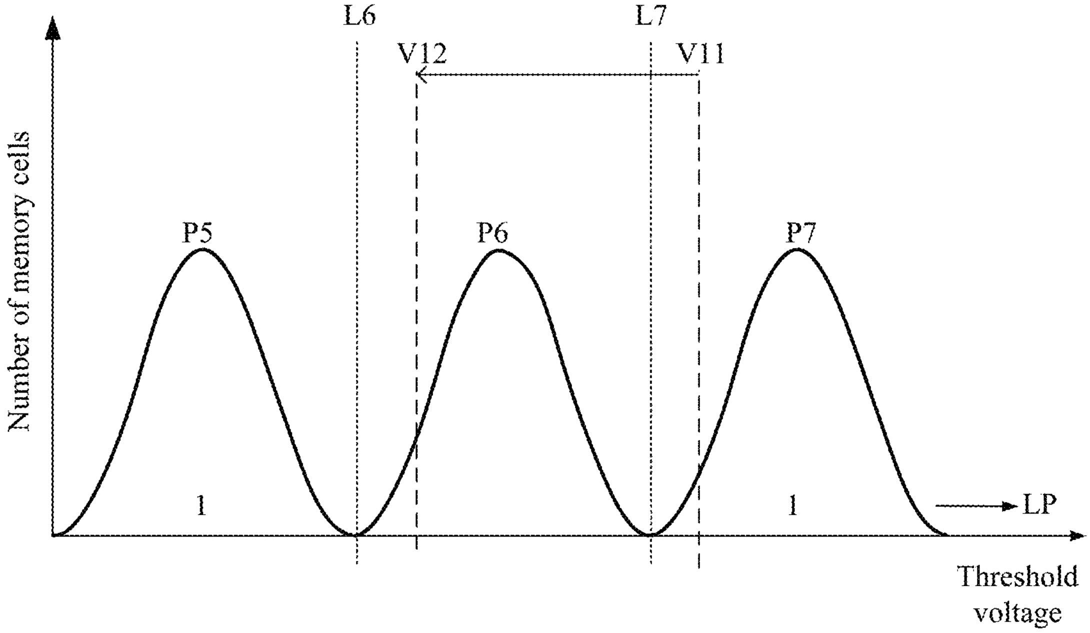
FIG. 14 is a schematic diagram of a method for determining a predicted target valley bottom voltage of a second target order as shown in FIG. 8B according to an example of the present application.

FIG. 14 is a schematic diagram of a method for determining a predicted target valley bottom voltage of a second target order as shown in FIG. 8B according to an example of the present application. Referring to FIGS. 8B and 14, the peripheral circuit is configured to: acquire the predicted valley bottom voltage of the first target order (the seventh-level read voltage L7); and acquire the predicted valley bottom voltage of the second target order (the fifth-level read voltage L5, at least one of the sixth-level read voltage L6 or the first-level read voltage L1, the second-level read voltage L2, the fourth-level read voltage L4, and the third-level read voltage L3) according to the predicted valley bottom voltage of the first target order (the seventh-level read voltage L7).

In some particular examples, as shown in FIG. 14, the peripheral circuit is configured to: acquire the predicted valley bottom voltage (V12 shown in FIG. 14) of the second target order (the sixth-level read voltage L6) according to the predicted valley bottom voltage (V11 shown in FIG. 14) of the first target order (the seventh-level read voltage L7) and the second mapping function, where the second mapping function indicates the relationship of the predicted valley bottom voltage of the first target order and the predicted valley bottom voltage of the second target order.

The second mapping function may be an empirical formula; and may also be a default formula in the factory configuration of the memory device that is obtained via extensive simulation experiments before the memory device leaves the factory.

In other examples, the predicted valley bottom voltage of the sixth-level read voltage L6 may be acquired according to the predicted valley bottom voltage of the seventh-level read voltage L7, the target valley bottom voltage of the sixth-level read voltage L6 may be acquired according to the predicted valley bottom voltage of the sixth-level read voltage L6, then the predicted valley bottom voltage of the fifth-level read voltage L5 may be acquired according to the target valley bottom voltage of the sixth-level read voltage L6, and so on, to sequentially obtain target valley bottom voltages of the fifth-level read voltage L5, the fourth-level read voltage L4, and the third-level read voltage L3, the second-level read voltage L2, and the first-level read voltage L1 respectively.

In some examples, the peripheral circuit is configured to: acquire a predicted valley bottom voltage of a first order of each of the plurality of pages; and acquire a predicted valley bottom voltage of a second order belonging to the same page as the first order according to the predicted valley bottom voltage of the first order of each page.

Figure 15A:
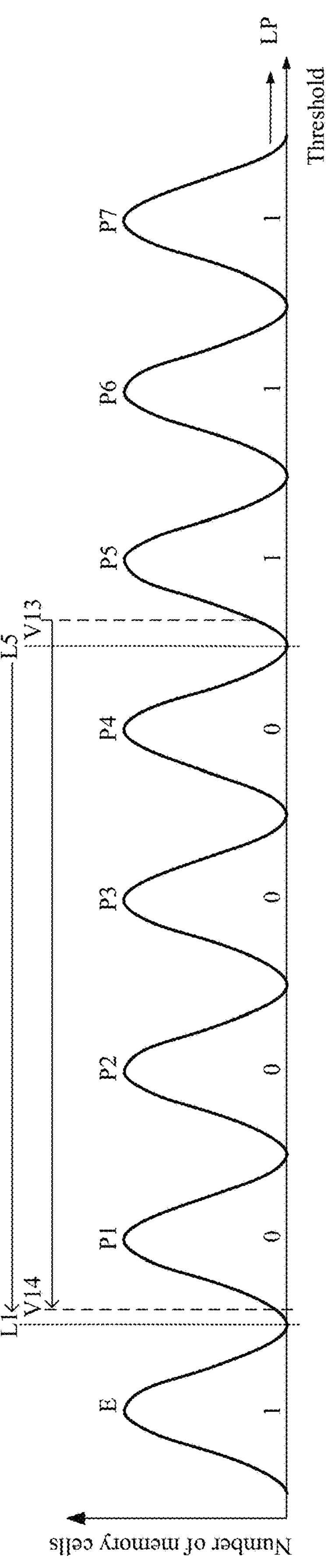
FIG. 15A is a schematic diagram of a method for determining a predicted target valley bottom voltage of a second target order corresponding to the lower page as shown in FIG. 8B according to an example of the present application.
Figure 15B:
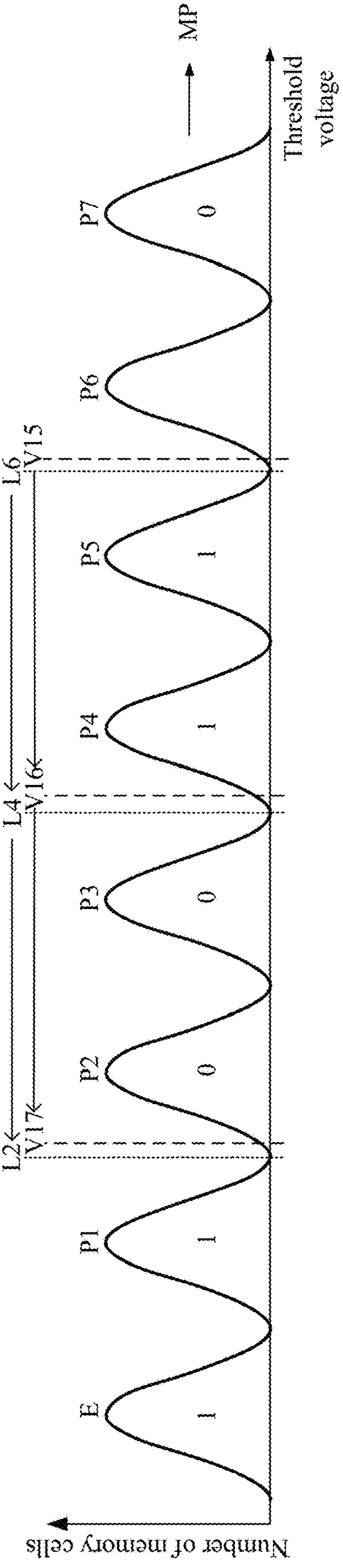
FIG. 15B is a schematic diagram of a method for determining a predicted target valley bottom voltage of a second target order corresponding to a middle page as shown in FIG. 8B according to an example of the present application.
Figure 15C:
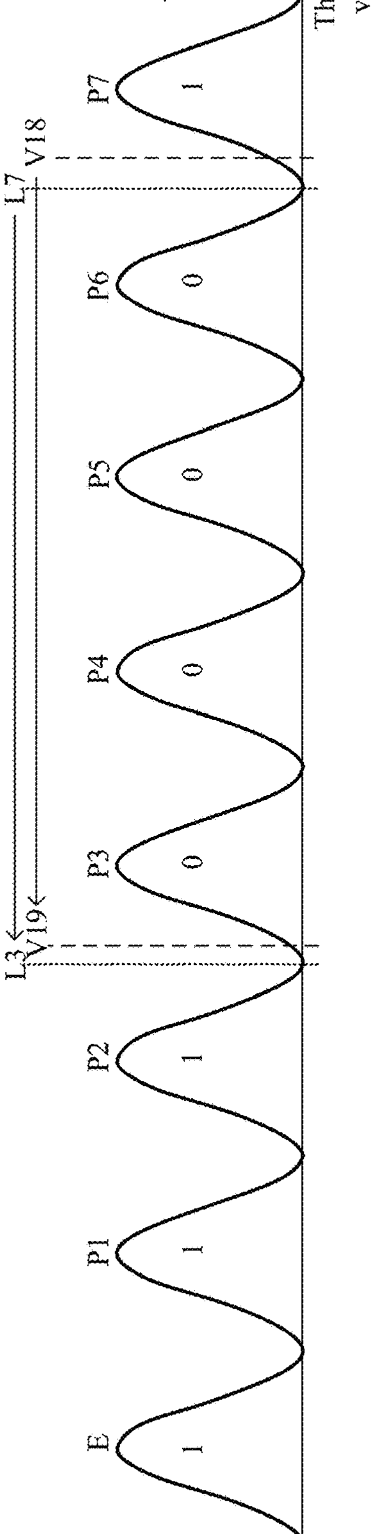
FIG. 15C is a schematic diagram of a method for determining a predicted target valley bottom voltage of a second target order corresponding to the upper page as shown in FIG. 8B according to an example of the present application.

In an example, referring to FIGS. 15A, 15B and 15C, the memory cells of the at least one code word have three memory bits corresponding to the lower page, the middle page, and the upper page respectively, where each page corresponds to a plurality of orders. A plurality of orders corresponding to the lower page include the first level and the fifth level, and the first-level read voltage L1 is less than the fifth-level read voltage L5. A plurality of orders corresponding to the middle page include the second level, the fourth level, and the sixth level, and the second-level read voltage L2 and the fourth-level read voltage L4 are both less than the sixth-level read voltage L6. A plurality of orders corresponding to the upper page include the third level and the seventh level, and the third-level read voltage L3 is less than the seventh-level read voltage L7. Here, the fifth-level read voltage L5, the sixth-level read voltage L6, and the seventh-level read voltage L7 correspond to read voltages of the first order of the lower page, the middle page, and the upper page respectively; the first-level read voltage L1 corresponds to a read voltage of the second order of the lower page; the second-level read voltage L2 and the fourth-level read voltage L4 correspond to read voltages of the second order of the middle page; and the third-level read voltage L3 corresponds to a read voltage of the second order the upper page.

In an example, as shown in FIG. 15A, the peripheral circuit is configured to: acquire the predicted valley bottom voltage (V13 shown in FIG. 15A) of the fifth-level read voltage L5 of the lower page in the plurality of pages; and acquire the predicted valley bottom voltage (V14 shown in FIG. 15A) of the first-level read voltage L1 of the lower page according to the predicted valley bottom voltage of the fifth-level read voltage L5 of the lower page.

In an example, as shown in FIG. 15B, the peripheral circuit is configured to: acquire the predicted valley bottom voltage (V16 shown in FIG. 15B) of the fourth-level read voltage L4 which is the maximum read voltage in the plurality of second orders of the middle page according to the predicted valley bottom voltage (V15 shown in FIG. 15B) of the sixth-level read voltage L6 of the middle page in the plurality of pages, and acquire the predicted valley bottom voltage (V17 shown in FIG. 15B) of the second-level read voltage L2 which is adjacent to and less than the fourth-level read voltage L4 according to the predicted valley bottom voltage of the fourth-level read voltage L4.

As shown in FIG. 15C, the peripheral circuit is configured to: acquire the predicted valley bottom voltage (V19 shown in FIG. 15C) of the third-level read voltage L3 of the upper page according to the predicted valley bottom voltage (V18 shown in FIG. 15C) of the seventh-level read voltage L7 of the upper page.

In some examples, the peripheral circuit is configured to: perform the read operation on the at least one code word according to predicted valley bottom voltages of all the first orders and second orders.

In an example, as shown in FIGS. 15A to 15C, the peripheral circuit is configured to: perform the read operation on the at least one code word according to the predicted valley bottom voltages of the first-level read voltage L1, the second-level read voltage L2, the third-level read voltage L3, the fourth-level read voltage L4, the fifth-level read voltage L5, the sixth-level read voltage L6, and the seventh-level read voltage L7.

In an example, the peripheral circuit is configured to: in response to a first error correction decoding of the first read result corresponding to the first read operation fails, take each of the predicted valley bottom voltage of the first order and the predicted valley bottom voltage of the second order as an initial target read voltage; acquire a first result corresponding to the initial target read voltage; and determine the initial target read voltage to be a target valley bottom voltage when the first result corresponding to the initial target read voltage satisfies the preset condition; alternatively, perform at least one adjustment on the initial target read voltage, acquire a first result corresponding to an adjusted target read voltage after each adjustment; when the first result corresponding to the adjusted target read voltage satisfies the preset condition, determine the adjusted target read voltage to be the target valley bottom voltage; and perform a second read operation on the at least one code word according to the target valley bottom voltage.

Here, the first result corresponding to the initial target read voltage satisfying the preset condition may be understood as the first result corresponding to the initial target read voltage being less than the preset threshold; and the first result corresponding to the initial target read voltage not satisfying the preset condition may be understood as the first result corresponding to the initial target read voltage being greater than or equal to the preset threshold. The preset threshold may be set with reference to the related descriptions of FIGS. 11A to 11B and is no longer repeated here.

In some examples, in a scenario of a QLC-type memory cell including four memory bits, corresponding memory states include a first state to a fifteenth state, and the four memory bits corresponding to the 16 states are stored in the lower page, middle page, upper page, and extra page respectively. The lower page includes one first order (i.e., the fourteenth level) and a plurality of second orders (i.e., the eighth level and the second level); the middle page includes one first order (i.e., the thirteenth level) and a plurality of second orders (i.e., the ninth level, the seventh level, and the third level); the upper page includes one first order (i.e., the fifteenth level) and a plurality of second orders (i.e., the twelfth level, the tenth level, and the fifth level); and the extra page includes one first order (i.e., the eleventh level) and a plurality of second orders (i.e., the sixth level, the fourth level, and the first level).

In some examples, as shown in FIG. 8C, the peripheral circuit is configured to: acquire the predicted valley bottom voltage of the eighth-level read voltage L8 of the lower page according to the predicted valley bottom voltage of the fourteenth-level read voltage L14 of the lower page; acquire the predicted valley bottom voltage of the second-level read voltage L2 of the lower page according to the predicted valley bottom voltage of the eighth-level read voltage L8 of the lower page; acquire the predicted valley bottom voltage of the ninth-level read voltage L9 of the middle page according to the predicted valley bottom voltage of the thirteenth-level read voltage L13 of the middle page; acquire the predicted valley bottom voltage of the seventh-level read voltage L7 of the middle page according to the predicted valley bottom voltage of the ninth-level read voltage L9 of the middle page; acquire the predicted valley bottom voltage of the third-level read voltage L3 of the middle page according to the predicted valley bottom voltage of the seventh-level read voltage L7 of the middle page; acquire the predicted valley bottom voltage of the twelfth-level read voltage L12 of the upper page according to the predicted valley bottom voltage of the fifteenth-level read voltage L15 of the upper page; acquire the predicted valley bottom voltage of the tenth-level read voltage L10 of the upper page according to the predicted valley bottom voltage of the twelfth-level read voltage L12 of the upper page; acquire the predicted valley bottom voltage of the fifth-level read voltage L5 of the upper page according to the predicted valley bottom voltage of the tenth-level read voltage L10 of the upper page; acquire the predicted valley bottom voltage of the sixth-level read voltage L6 of the extra page according to the predicted valley bottom voltage of the eleventh-level read voltage L11 of the extra page; acquire the predicted valley bottom voltage of the fourth-level read voltage L4 of the extra page according to the predicted valley bottom voltage of the sixth-level read voltage L6 of the extra page; and acquire the predicted valley bottom voltage of the first-level read voltage L1 of the extra page according to the predicted valley bottom voltage of the fourth-level read voltage L4 of the extra page. As such, predicted valley bottom voltages of the 15 levels of read voltages required to read the QLC-type memory cell are acquired.

In some examples, the peripheral circuit is configured to: read data stored in the at least one code word with the first read voltage to obtain a second result; read data stored in the at least one code word with the second read voltage to obtain a third result; perform a logic operation on the second result and the third result to obtain a fourth result; and count the number of bits in the fourth result that indicate flips of the third result compared to the second result to obtain the first result.

In an example, as shown in FIG. 9, the data stored in the memory cells in the at least one code word is read with the first read voltage (V0 shown in FIG. 9), where a memory cell with a threshold voltage less than the first read voltage is labeled with a bit 1, and a memory cell with a threshold voltage greater than the first read voltage is labeled with a bit 0, so as to obtain the second result.

In an example, as shown in FIG. 9, the data stored in the memory cells in the at least one code word is read with the second read voltage (V1 shown in FIG. 9), where a memory cell with a threshold voltage less than the second read voltage is labeled with a bit 1, and a memory cell with a threshold voltage greater than the second read voltage is labeled with a bit 0, so as to obtain the third result.

In an example, an exclusive-OR operation is performed on the second result and the third result, to obtain the fourth result. It is to be noted that the exclusive-OR operation is one of basic logic operations. In binary, if two binary numbers at the same location are identical, the result is "0", and if two binary numbers at the same location are different, the result is "1" (i.e., identical binary numbers result in 0, and different binary numbers result in 1).

In an example, the bit 1 in the fourth result indicates that data read from a memory cell in the at least one code word with the first read voltage is different from data read from the memory cell with the second read voltage, and a bit 0 in the fourth result indicates that data read from a memory cell in the at least one code word with the first read voltage is the same as data read from the memory cell with the second read voltage. In other words, the number of bits 1 in the fourth result indicates the number of flipped bits of the at least one code word in the two read results corresponding to the first read voltage and the second read voltage, and the number of bits 0 in the fourth result indicates the number of identical bits of the at least one code word in the two read results corresponding to the first read voltage and the second read voltage. Since a single level read mode is employed, i.e., both of the above two read operations read one bit of data stored in the same page of the memory cells of at least one code word, the number of bits 1 in the fourth result indicates the number of flipped memory cells of the at least one code word in the two read results corresponding to the first read voltage and the second read voltage, and the number is labeled as the first result corresponding to the first read voltage. For example, the at least one code word has the first result Y1 corresponding to the target read voltage (V0 shown in FIG. 9) of the target order, and the at least one codeword has the first result Y2 corresponding to the predicted valley bottom voltage (V2 shown in FIG. 9) of the target order.

In some examples, the peripheral circuit includes: a first latch configured to store the second result; a second latch configured to store the third result; and a third latch configured to store the fourth result.

In an example, data (i.e., the second result) stored in the at least one code word is read with the first read voltage and stored in the first latch, and data (i.e., the third result) stored in the at least one code word is read with the second read voltage and stored in the second latch. The exclusive-OR operation is performed on the second result and the third result to obtain the fourth result, and the number of bits in the fourth result that indicate flips of the third result compared to the second result is counted stored in the third latch.

According to the first aspect, in each memory device provided by the examples of the present application, transmitting the first result (the size of the first result may be a few bytes), rather than transmitting the at least one code word (for example, the size of the code word may be 4 KB), reduces the amount of transmitted data. Acquiring the predicted valley bottom voltage of the target order according to the first result of the at least one code word corresponding to the target read voltage of the target order and the level in which the target order is located, and determining the target valley bottom voltage according to the predicted valley bottom voltage of the target order, allows for faster iterative convergence. The process of acquiring the first result converges inside the memory device, without occupying, for example, a space of the memory controller, and is less dependent on, for example, the memory controller. Completing the process of acquiring the predicted valley bottom voltage/determining the valley bottom voltage according to the first result in the memory device reduces transmission time of an output port, and is applicable to MLC, TLC, or QLC-type memory devices.

Figure 16A:
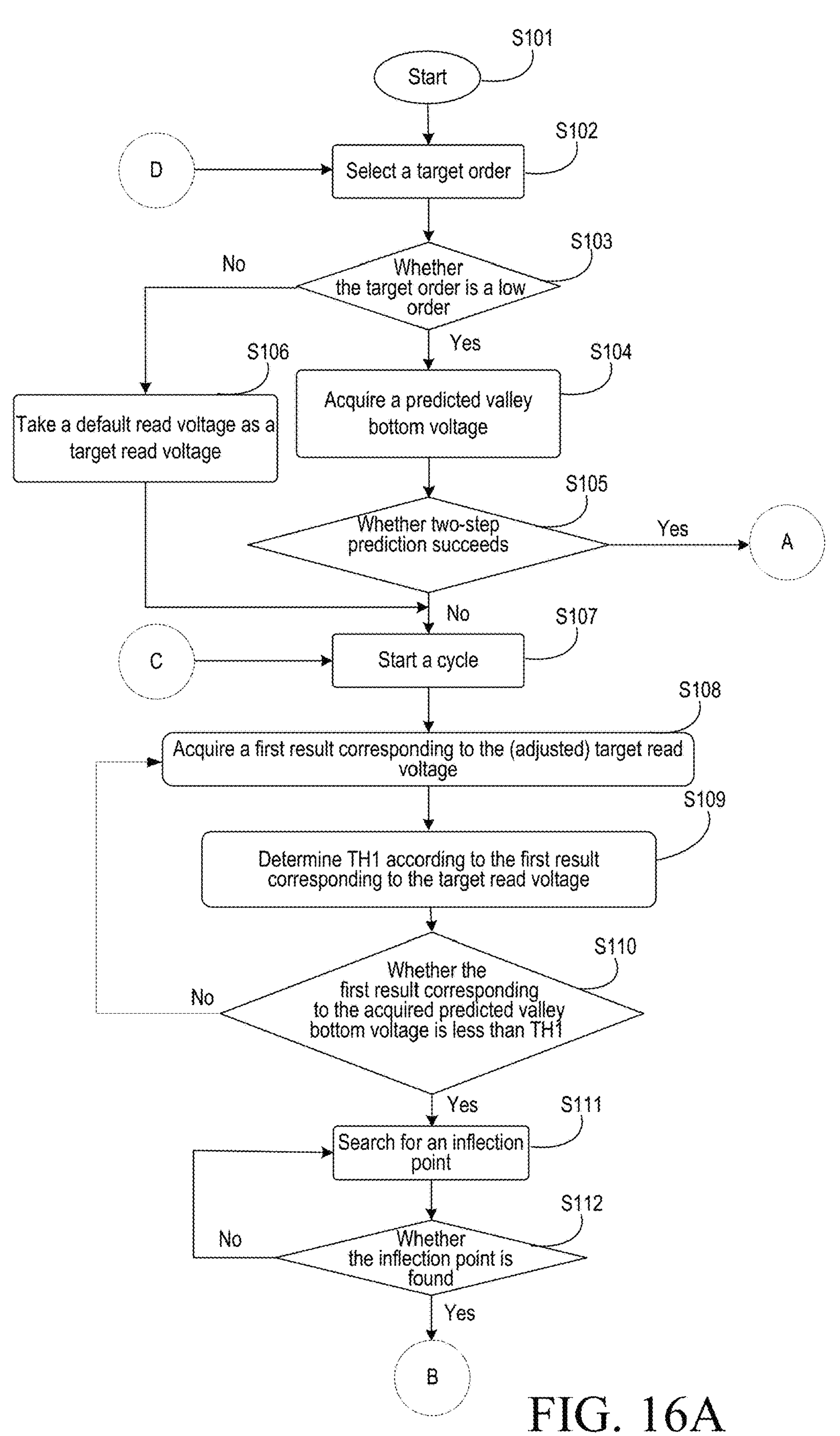
FIGS. 16A and 16B are a flowchart of an operation method of a memory device according to an example of the present application.
Figure 16B:
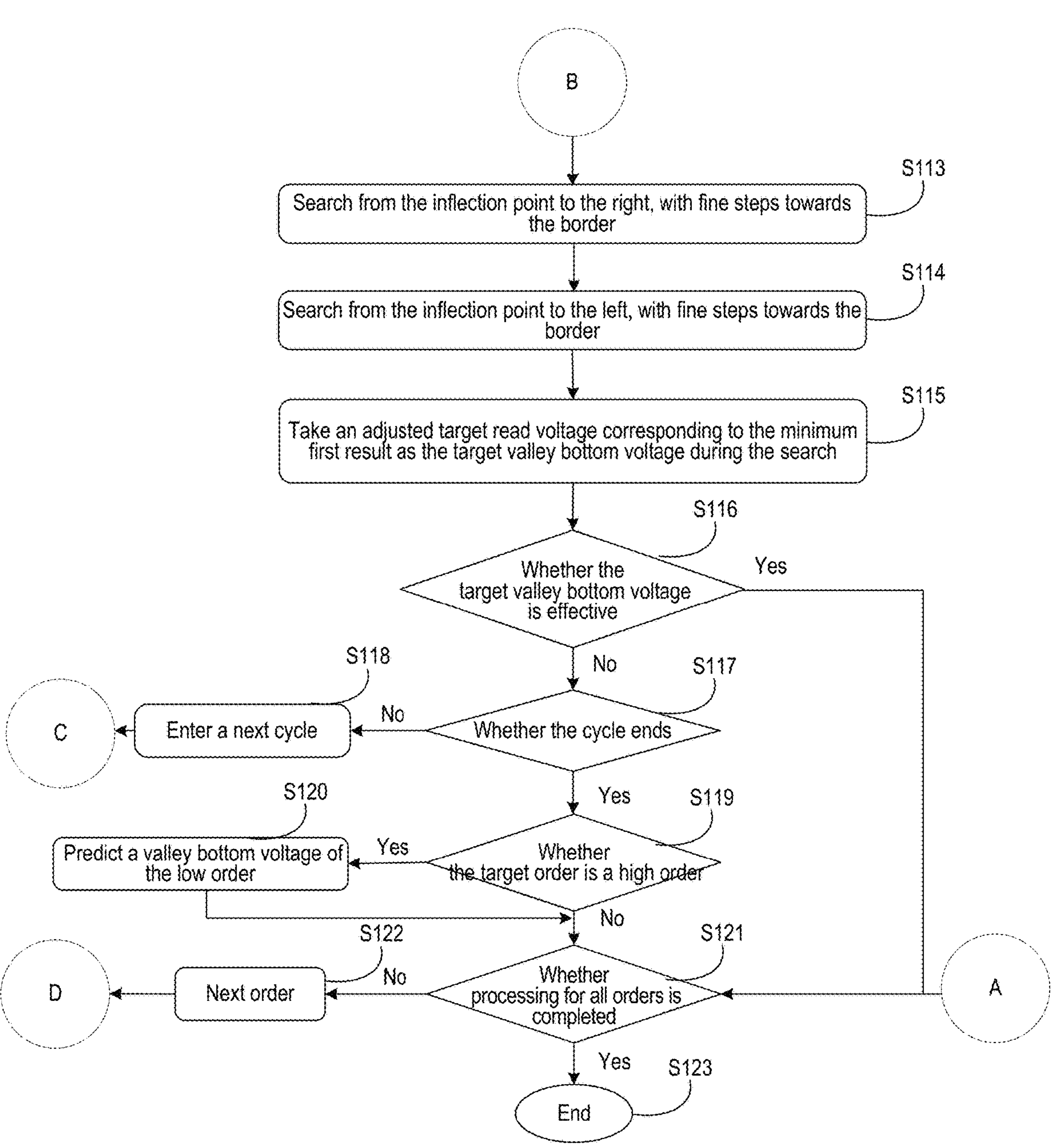

FIGS. 16A and 16B are a flowchart of an operation method of a memory device according to an example of the present application. A detailed process of determining the target valley bottom voltage will be described in detail below through FIGS. 16A and 16B. It is to be noted that here and hereafter, the target valley bottom voltage refers to a voltage used to perform the read operation on the data to be read.

In operation S101, a program for acquiring the target valley bottom voltage is triggered, and a process of acquiring the target valley bottom voltage is started. Then operation S102 is performed.

As set forth above, the memory cell has a plurality of memory bits, the plurality of memory bits correspond to a plurality of pages respectively, and at least one page corresponds to a plurality of orders. During determining of the target valley bottom voltages, the target valley bottom voltages for each of the at least one order of read voltages corresponding to each of the plurality of pages are determined sequentially. In operation S103, one order is selected from the plurality of orders corresponding to one page as the target order, and the target read voltage corresponding to the read voltage of the target order is determined first. In an example, taking TLC as an example, target valley bottom voltages of the first-level read voltage L1 and the fifth-level read voltage L5 corresponding to the lower page are determined first, and one of L1 or L5 may be selected as the target order. Operation S103 is performed after the target order is determined.

Operation S103 is mainly intended to determine a type of the target order. Here, the target order can be divided into two types, the first order (also referred to as the high order) and the second order (also referred to as the low order), where the read voltage of the first order is greater than the read voltage of the second order. In an example, still using the lower page of the TLC as an example, L5 is the first order, and L1 is the second order. If L1 is selected as the target order in operation S103, the target order is the second order, i.e., the low order; if L5 is selected as the target order in operation S104, the target order is the first order, i.e., the high order. If the target order is the low order, operation S104 is performed; if the target order is the high order, operation S106 is performed.

In operation S104, the predicted valley bottom voltage is acquired. Here, as for the predicted valley bottom voltage, the predicted valley bottom voltage corresponding to the low order is acquired according to the target valley bottom voltage corresponding to the high order and a related mapping function. Here and hereafter, the related mapping function may be obtained by fitting many experimental results before the memory device leaves the factory and stored in the memory device. Then operation S105 is performed.

In operation S105, determine whether two-step prediction succeeds. Here, the two-step prediction may include first-step prediction and second-step prediction. The first-step prediction is to acquire the predicted valley bottom voltage of the high order, and more specifically, to acquire the predicted valley bottom voltage of the high order according to the first result corresponding to the target read voltage (a default read voltage), an order of the high order, and a first mapping function. The second-step prediction is to acquire the predicted valley bottom voltage of the low order, and more specifically, to acquire the predicted valley bottom voltage of the low order according to the predicted valley bottom voltage of the high order as mentioned above, an order of the low order, and the second mapping function. Furthermore, the two-step prediction is followed by no confirmation of the predicted valley bottom voltage, and the predicted valley bottom voltage of the high order and the predicted valley bottom voltage of the low order are used directly to perform hard decoding. If the hard decoding succeeds, it indicates that the two-step prediction succeeds, in which case the search for the target valley bottom voltage is stopped directly and operation S121 is performed. If the hard decoding fails, it indicates that the two-step prediction fails, in which case the point corresponding to the predicted valley bottom voltage is used as the near-valley point for the subsequent iterations and operation S107 is continued.

It is to be noted that if the hard decoding fails, it indicates that the two-step prediction does not succeed, in which case the target valley bottom voltage is required to be determined by means of searching, or referred to as a cycling (or iteration). Therefore, a cyclic process is entered when the two-step prediction does not succeed, so that when the two-step prediction does not succeed, a search process can be started directly from the beginning of the cycle, i.e., a jump to operation S107 from operation S105.

If the target order is the high order, the target valley bottom voltage of the high order is determined by means of the searching or cycling. In operation S106, the default read voltage is taken as the target read voltage. Here, the target read voltage can be used as an initial value for subsequent searching or cycling. In some examples, the default read voltage may be a read voltage in the case where the threshold voltage of the memory cell has not been shifted, such as a read voltage corresponding to the time when the write operation has just been carried out, in which case a corresponding offset is 0 DAC. Operation S107 is performed after operation S106.

It is to be noted that, here and hereafter, a conversion relationship between DAC and mv is 1 DAC=10 mv.

In operation S107, the target valley bottom voltage is determined by means of searching or cycling. Operation S108 is performed after operation S107.

A first time of performing the cyclic process in operation S108 is to acquire the first result corresponding to the target read voltage. It may be understood that subsequent times of performing the cyclic process in operation S108 are to acquire the first result corresponding to the adjusted target read voltage. Operation S109 is performed after operation S108.

In operation S109, a first threshold TH1 is determined or adjusted according to the first result corresponding to the target read voltage. It may be understood that during the read operation, the further the threshold voltage of the memory cell is offset from the threshold voltage at the time of writing, the larger the first result read using the initial target read voltage will be as well. On that basis, a specific value of the first result corresponding to the initial target read voltage can be used to determine the first threshold TH1, where the first threshold TH1 indicates a situation of a change (raise) of the valley bottom voltage due to the offset of the threshold voltage of the memory cell. Operation S110 is performed after operation S109. A further understanding of the first threshold here may be referred to the related description of the preset threshold in the above examples.

It is to be noted that operation S109 is mainly for the first time of performing the cyclic process, and may be skipped for the subsequent times of performing the cyclic process.

In operation S110, the predicted valley bottom voltage is acquired, and whether the corresponding first result corresponding to the predicted valley bottom voltage is less than the first threshold TH1 is determined. A predicted valley bottom voltage of the next adjustment is acquired according to the first result corresponding to the target read voltage after the previous adjustment and a related mapping function (e.g., the above first mapping function), and a first result corresponding to the acquired predicted valley bottom voltage is compared with the magnitude of the first threshold TH1. When a determination result of operation S110 is a no, it indicates that the first result corresponding to the predicted valley bottom voltage acquired at this time is greater than or equal to the first threshold TH1, and operation S108 of the cycle is continued by adjusting the target read voltage, re-acquiring the predicted valley bottom voltage, and comparing the first result corresponding to each re-acquired predicted valley bottom voltage with the magnitude of the first threshold TH1, until the first result corresponding the acquired predicted valley bottom voltage is less than the first threshold TH1. That is, a prediction iteration is performed using the above prediction formula or related mapping functions, until the first result corresponding the acquired predicted valley bottom voltage is less than the first threshold TH1. When a determination result of operation S110 is a yes, it indicates that the first result corresponding to the acquired predicted valley bottom voltage at this time is less than the first threshold TH1, and proceed to the next operation S111.

A search for the inflection point is performed in operation S111. Here, a target read voltage after each adjustment is taken as an horizontal coordinate, the corresponding first result corresponding to the adjusted target read voltage is taken as an vertical coordinate, and the horizontal coordinate and the vertical coordinate form a point. An inflection point may be understood as a point close to a valley bottom. In some examples, the search may be performed with a coarse step (the first step), starting from the near-valley point and proceeding to the left boundary and the right boundary respectively, until the left boundary and the right boundary are reached, where the point corresponding to the minimum first result during the search is taken as the inflection point. Here, the inflection point is a point closer to the valley bottom than the near-valley point, and a point less than the first threshold in preceding operations may be taken as the near-valley point, for example, the near-valley point may be a point less than the first threshold that is present first in the preceding operations. The first step may be a larger step. In some examples, the first step may include 5-15 DAC, and in an example, the first step may include 5 DAC, 10 DAC, or 15 DAC. Operation S112 is performed after operation S111.

Whether the inflection point is found is determined in operation S112. If no inflection point is found, the search is continued by continuing operation S111, until the inflection point is found. Operation S113 is performed after the inflection point is found.

In operations S113 and S114, the search may be performed with a fine step (the second step), starting from the near-valley point and proceeding to the left boundary and the right boundary respectively, until the left boundary and the right boundary are reached or the count of upward trends exceeds the preset count. Here, when the first result corresponding to the target read voltage after the next adjustment is greater than the first result corresponding to the target read voltage after the previous adjustment, the count of upward trends is performed. In some examples, the preset count includes 3-7, and in an example, the preset count may include 3, 5, or 7. It is to be noted that operations S113 and S114 may be interchanged. The second step may be a smaller step. In some examples, the second step may include 2-4 DAC, and in an example, the second step may include 2 DAC, 3 DAC, or 4 DAC.

Operation S115 is performed when searches in operations S113 and S114 both satisfy the above condition (reaching boundaries or the count of upward trends exceeding the preset count).

In operation S115, the adjusted target read voltage corresponding to the minimum first result is taken as the target valley bottom voltage. Operation S116 is performed after operation S115.

whether the target valley bottom voltage is effective is determined in operation S116. Here, a method of determining whether the target valley bottom voltage is effective may be as follows: reading data using the target valley bottom voltage, decoding the read data by the memory controller, and if the decoding succeeds, it indicates that the target valley bottom voltage is effective. Operation S121 is performed when a determination result of operation S116 is a yes; and operation S117 is performed when a determination result of operation S116 is a no.

Whether the cycle ends is determined in operation S117. Operation S119 is performed when a determination result of operation S117 is a yes; and operation S118 is performed when a determination result of operation S117 is a no.

A next cycle is entered in operation S118 to continue the search. Operation S118 jumps to operation S107.

Whether the target order is the high order is determined in operation S119. Operation S120 is performed when a determination result of operation S119 is a yes; and operation S121 is performed when a determination result of operation S119 is a no.

In operation S120, the predicted valley bottom voltage of the low order is acquired according to the target valley bottom voltage of the high order. Here, the predicted valley bottom voltage of the low order may be acquired through the target valley bottom voltage of the high order, the order of the low order, and a related mapping function (e.g., the above second mapping function). Operation S121 is performed after operation S120.

Whether respective target valley bottom voltages corresponding to read voltages of all orders included in the page have been determined is determined in operation S121. When a determination result of operation S121 is a yes, it indicates that the respective target valley bottom voltages corresponding to the read voltages of all the orders included in the page have been determined, in which case operation S123 may be performed. When a determination result of operation S121 is a no, it indicates that there is an order in the page for which a target valley bottom voltage corresponding to the read voltage thereof has not been determined yet, in which case operation S122 is performed.

In operation S122, the valley bottom voltage of each order for which the valley bottom voltage has not been determined is determined sequentially. Operation S122 jumps to operation S102.

In operation S123, the process of acquiring the target valley bottom voltage ends. It is to be noted that determining of target valley bottom voltages corresponding to read voltages of all orders of a next page may be started after operation S123.

Figure 17A:
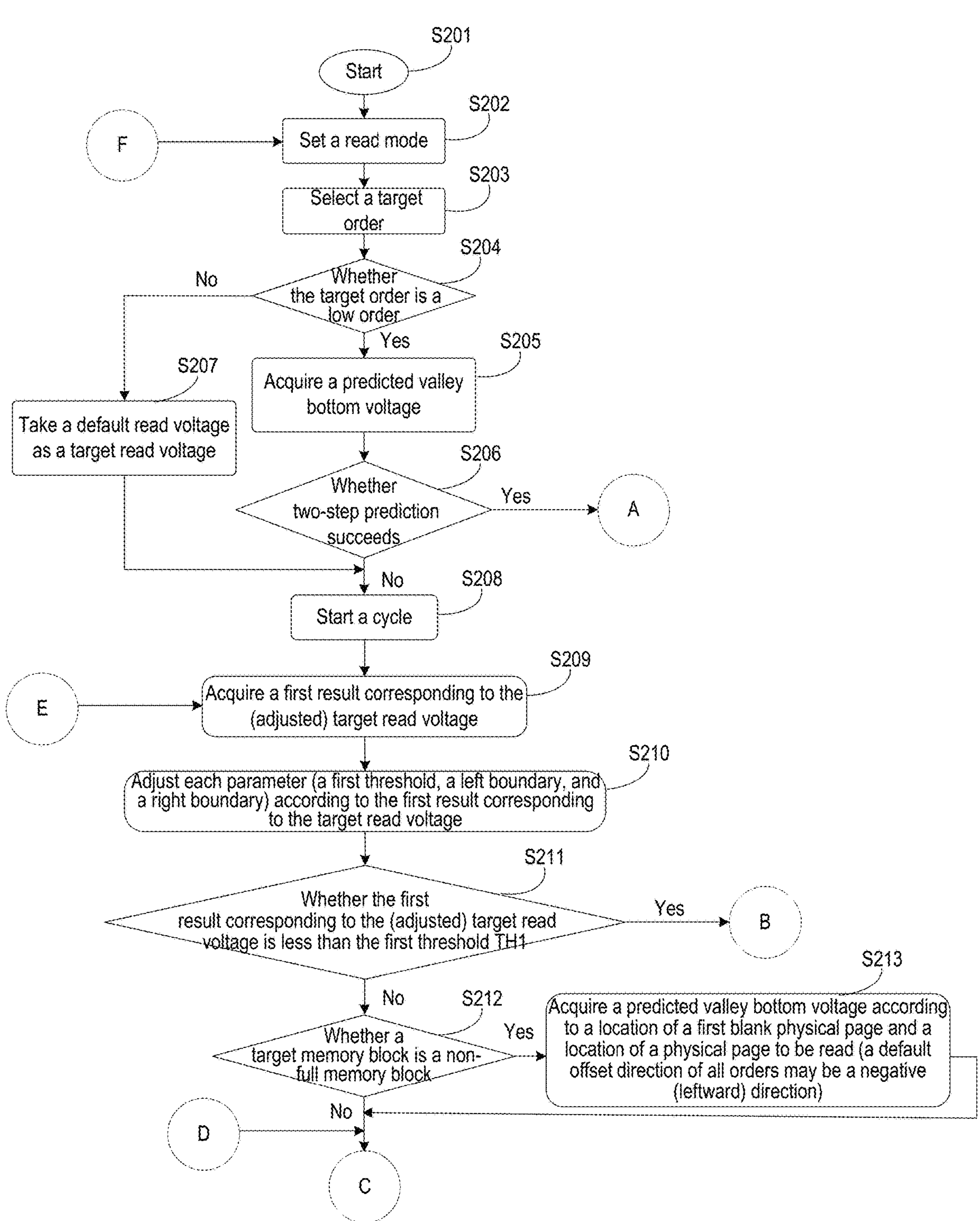
FIGS. 17A-17C are a flowchart of an operation method of a memory device according to an example of the present application.
Figure 17B:
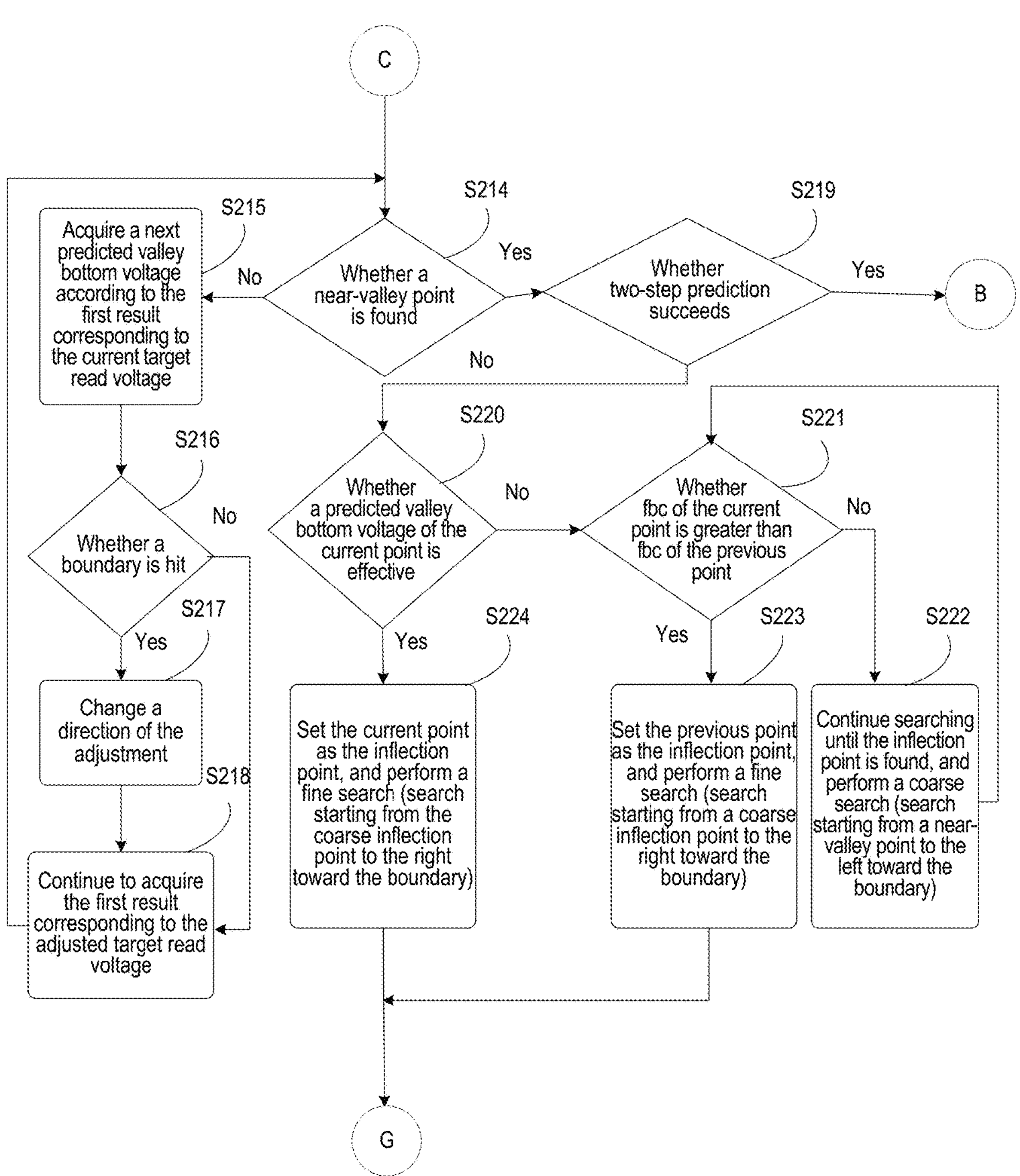
Figure 17C:
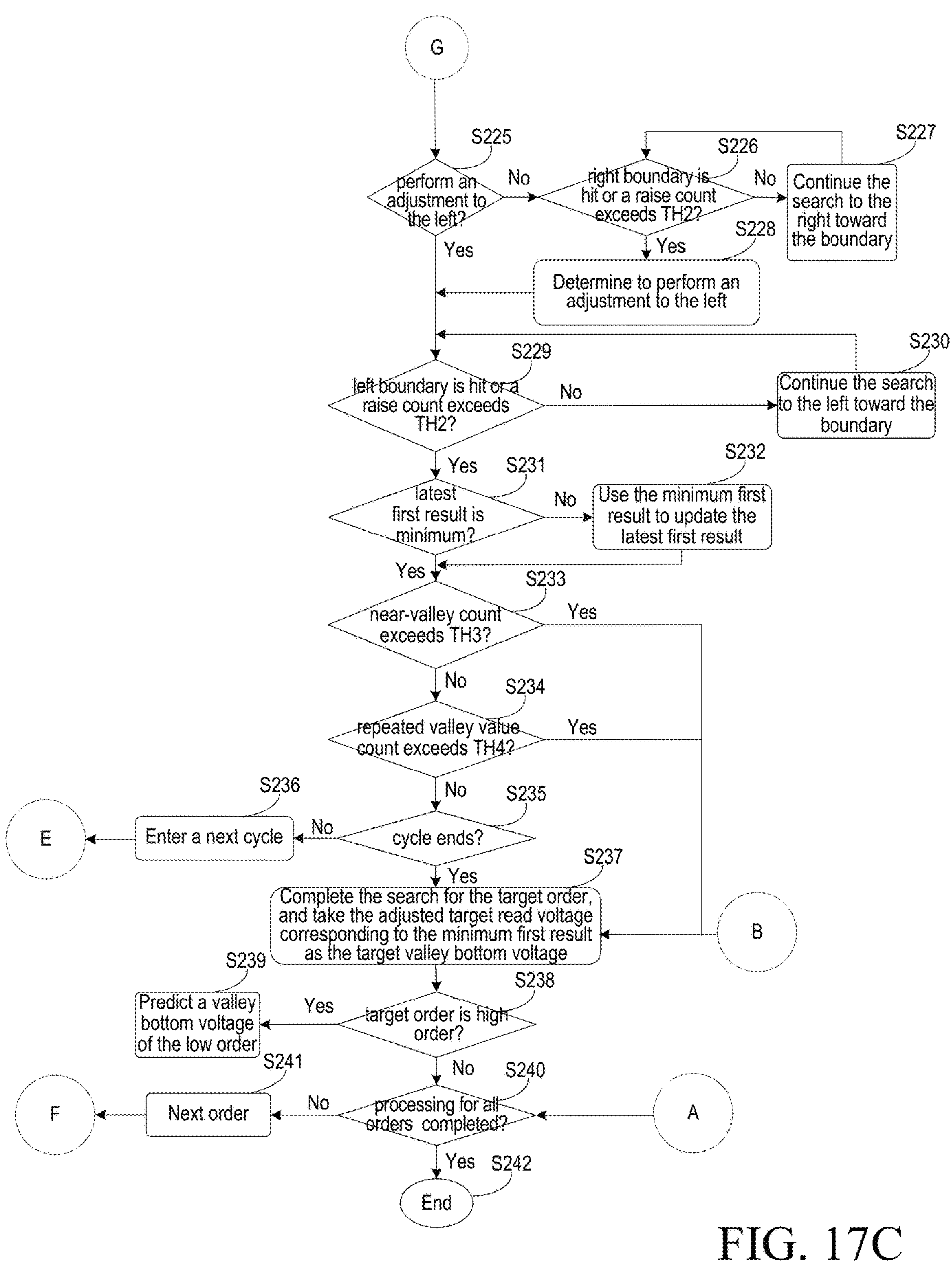

FIGS. 17A-17C are a flowchart of an operation method of a memory device according to an example of the present application. A detailed process of determining the target valley bottom voltage will be described in detail below through FIGS. 17A-17C.

In operation S201, a program for acquiring the target valley bottom voltage is triggered, and a process of acquiring the target valley bottom voltage is started. Then operation S202 is performed.

In operation S202, in some particular examples, the read mode of the memory device is set to the Single Level Read (SLR) mode, where the single level read mode includes reading at least one bit of data stored in the memory cell with one order of read voltages. Then operation S203 is performed.

As set forth above, the memory cell has a plurality of memory bits, the plurality of memory bits correspond to a plurality of pages respectively, and at least one page corresponds to a plurality of orders. During determining of the target valley bottom voltages, the target valley bottom voltages for each of the at least one order of read voltages corresponding to each of the plurality of pages are determined sequentially. In operation S203, one order is selected from the plurality of orders corresponding to one page as the target order, and the target read voltage corresponding to the read voltage of the target order is determined first. In an example, taking TLC as an example, target valley bottom voltages of the first-level read voltage L1 and the fifth-level read voltage L5 corresponding to the lower page are determined first, and one of L1 or L5 may be selected as the target order. Operation S204 is performed after the target order is determined.

Operation S204 is mainly intended to determine a type of the target order. Here, the target order can be divided into two types, the first order (also referred to as the high order) and the second order (also referred to as the low order), where the read voltage of the first order is greater than the read voltage of the second order. In an example, still using the lower page of the TLC as an example, L5 is the first order, and L1 is the second order. If L1 is selected as the target order in operation S203, the target order is the second order, i.e., the low order; if L5 is selected as the target order in operation S204, the target order is the first order, i.e., the high order. If the target order is the low order, operation S204 is performed; if the target order is the high order, operation S207 is performed.

In operation S205, the predicted valley bottom voltage is acquired. Here, as for the predicted valley bottom voltage, the predicted valley bottom voltage corresponding to the low order is acquired according to the target valley bottom voltage corresponding to the high order and a related mapping function. Here and hereafter, the related mapping function may be obtained by fitting many experimental results before the memory device leaves the factory and stored in the memory device. Then operation S206 is performed.

In operation S206, determine whether two-step prediction succeeds. Here, the two-step prediction may include first-step prediction and second-step prediction. The first-step prediction is to acquire the predicted valley bottom voltage of the high order, and more specifically, to acquire the predicted valley bottom voltage of the high order according to the first result corresponding to the target read voltage (a default read voltage), an order of the high order, and a first mapping function. The second-step prediction is to acquire the predicted valley bottom voltage of the low order, and more specifically, to acquire the predicted valley bottom voltage of the low order according to the predicted valley bottom voltage of the high order as mentioned above, an order of the low order, and the second mapping function. Furthermore, the two-step prediction is followed by no confirmation of the predicted valley bottom voltage, and the predicted valley bottom voltage of the high order and the predicted valley bottom voltage of the low order are used directly to perform hard decoding. If the hard decoding succeeds, it indicates that the two-step prediction succeeds, in which case the search for the target valley bottom voltage is stopped directly and operation S245 is performed. If the hard decoding fails, it indicates that the two-step prediction fails, in which case the point corresponding to the predicted valley bottom voltage is used as the near-valley point for the subsequent iterations and operation S220 is continued. S220 will be detailed in the following description.

It is to be noted that if the hard decoding fails, it indicates that the two-step prediction does not succeed, in which case the target valley bottom voltage is required to be determined by means of searching, or referred to as a cycling (or iteration). Therefore, a cyclic process is entered when the two-step prediction does not succeed, so that when the two-step prediction does not succeed, a search process can be started directly from the beginning of the cycle, i.e., a jump to operation S208 from operation S206; or the point corresponding to the predicted valley bottom voltage may be used directly as the near-valley point for the subsequent iterations, i.e., a jump to operation S220 from operation S206 (S219).

If the target order is the high order, the target valley bottom voltage of the high order is determined by means of the searching or cycling. In operation S207, the default read voltage is taken as the target read voltage. Here, the target read voltage can be used as an initial value for subsequent searching or cycling. In some examples, the default read voltage may be a read voltage in the case where the threshold voltage of the memory cell has not been shifted, such as a read voltage corresponding to the time when the write operation has just been carried out, in which case a corresponding offset is 0 DAC. Operation S208 is performed after operation S207.

In operation S208, the target valley bottom voltage is determined by means of searching or cycling. Operation S209 is performed after operation S208.

A first time of performing the cyclic process in operation S209 is to acquire the first result corresponding to the target read voltage. It may be understood that subsequent times of performing the cyclic process in operation S209 are to acquire the first result corresponding to the adjusted target read voltage. Operation S210 is performed after operation S209.

In operation S210, each parameter is determined or adjusted according to the first result corresponding to the target read voltage, where each parameter here may include at least the first threshold, the first boundary voltage (a location corresponding to the first boundary voltage is referred to as the left boundary), and the second boundary voltage (a location corresponding to the second boundary voltage is referred to as the right boundary). It may be understood that during the read operation, the further the threshold voltage of the memory cell is offset from the threshold voltage at the time of writing, the larger the first result read using the initial target read voltage will be as well. On that basis, a specific value of the first result corresponding to the default target read voltage can be used to determine the first threshold, where the first threshold indicates a situation of a change (raise) of the valley bottom voltage due to the offset of the threshold voltage of the memory cell. Here, an initial first boundary voltage and an initial second boundary voltage may be set according to empirical values etc. For example, the initial first boundary voltage and the initial second boundary voltage may be set within a relatively large range, and then the initial first boundary voltage and the initial second boundary voltage are adjusted according to the first result corresponding to the target read voltage, e.g., narrowing ranges of the first boundary voltage and the second boundary voltage to obtain the first boundary voltage and the second boundary voltages. Operation S211 is performed after operation S210.

It is to be noted that operation S210 is mainly for the first time of performing the cyclic process, and may be skipped for the subsequent times of performing the cyclic process.

A first time of performing the cyclic process in operation S211 is to determine whether the first result corresponding to the target read voltage is less than the first threshold. It may be understood that subsequent times of performing the cyclic process in operation S211 are to determine whether the first result corresponding to the adjusted target read voltage is less than the first threshold. When a determination result of operation S211 is a yes, the first result corresponding to the adjusted target read voltage may be considered as being able to satisfy a requirement for read data decoding substantially. Then jump to S242, the cycle ends, and a corresponding target valley bottom voltage is output. When a determination result of operation S211 is a no, operation S212 of the cycle is continued.

Whether a target memory block is a non-full memory block is determined in operation S212. Here, the target memory block is a memory block where the at least one code word on which the read operation to be performed is located. The non-full memory block includes a memory block having two data states: a programmed state and an erased state. Operation S213 is performed when a determination result of operation S212 is a yes; and operation S214 is performed when a determination result of operation S212 is a no.

It is to be noted that operation S212 is mainly for the first time of performing the cyclic process, and may be skipped for the subsequent times of performing the cyclic process. Operation S214 is continued after the above operation is skipped.

In operation S213, it is considered the fact that an offset of the threshold voltage of the memory cell in the non-full memory block is more complex, compared to an offset of the threshold voltage of the memory cell in a full memory block (the full memory block may be understood as a memory block in the same application scenario as the non-full memory block and having a difference in writing moments from the non-full memory block that is less than a preset duration). Compared to the full memory block, the offset of the threshold voltage of the memory cell in the non-full memory block is also related to a location of a first blank physical page (the first blank physical page may be understood as a first physical page having all the data states thereof being erased states in the non-full memory block, in an order of programming) in the non-full memory block and a location of a physical page to be read (a physical page where the at least one code word to be read is located). On that basis, the predicted valley bottom voltage may be acquired according to a first offset corresponding to the full memory block, a second offset corresponding to the location of the first blank physical page in the non-full memory block, and a third offset corresponding to the location of the physical page to be read, and then proceed to operation S214. It may be understood that the acquired predicted valley bottom voltage is more targeted compared to that obtained through the blind adjustments on the target read voltage, shortening a search duration to a certain extent and thereby determining the target valley bottom voltage more quickly.

Whether the inflection point is found is determined in operation S214. Here, a target read voltage after each adjustment is taken as an horizontal coordinate, the corresponding first result corresponding to the adjusted target read voltage is taken as an vertical coordinate, and the horizontal coordinate and the vertical coordinate form a point. During a plurality of adjustments on the target read voltage, a point corresponding to a first result being less than the near-valley threshold for the first time among the plurality of first results corresponding to the plurality of adjusted target read voltages may be taken as the near-valley point. The near-valley threshold is used to represent the maximum of the corresponding first results near the target valley bottom voltage. It is to be noted that there are differences between the near-valley threshold and the first threshold. When the first result is less than the near-valley threshold, it indicates that a finer search can be carried out subsequently; when the first result is less than the first threshold, it indicates that a stop of the search may be taken into consideration. Operation S219 is performed when a determination result of operation S214 is a yes; and operation S215 is performed when a determination result of operation S214 is a no.

Operation S215 is performed when no near-valley point is found in operation S215, where a predicted read voltage after the next adjustment is acquired according to the first result corresponding to the target read voltage after the previous adjustment and a related mapping function (e.g., the above first mapping function). That is, a prediction iteration is performed using the above prediction formula or mapping function. Operation S216 is performed after operation S215.

Whether the acquired predicted read voltage after the next adjustment hits a boundary is determined in operation S216. The boundary here may be one of the above left boundary or right boundary, and hitting the boundary may be understood as being located right on or crossing the boundary. Operation S217 is performed when a determination result of operation S216 is a yes; and operation S218 is performed when a determination result of operation S216 is a no.

An adjustment direction is changed in operation S217. Here, there are two adjustment directions during the adjustments on the target read voltage, i.e., a positive (rightward) direction and a negative (leftward) direction. An adjustment on an offset direction may be understood as changing a previous rightward adjustment into a leftward adjustment upon hitting the right boundary; alternatively, changing a previous leftward adjustment into a rightward adjustment upon hitting the left boundary. Operation S218 is performed after operation S217.

The first result corresponding to the adjusted target read voltage is acquired in operation S218. Operation S214 is performed after operation S218. That is, after each adjustment of the target voltage and acquisition of the corresponding first result, the determining is continued to determine whether a latest adjustment point is the near-valley point. Here, one or more adjustments are performed until the near-valley point is found.

It is to be noted that operations S215 to S218 may be skipped if the next cycle is entered because a subsequent condition is not met during operations after the near-valley point is found.

In operation S219, referring to the description of operation S206, the cyclic process may be entered when the two-step prediction does not succeed, so that when the two-step prediction does not succeed, the point corresponding to the predicted valley bottom voltage may be used directly as the near-valley point for the subsequent iterations, i.e., jump from operation S219 to S220.

Whether a predicted valley bottom voltage (the latest adjusted target read voltage) of a current point is effective is determined in operation S220. In some examples, the predicted valley bottom voltage may be determined to be effective if the first result corresponding to the latest adjusted target read voltage is less than the first threshold. It is to be noted that, operation S212 and subsequent operations are performed when the first result corresponding to the (adjusted) target read voltage is not less than the first threshold in operation S211, however, at least one adjustment on the target read voltage is carried out before the determination result of S214 is a yes, so that there may be a situation that a newly adjusted target read voltage is less than the first threshold at this time. Operation S224 is performed when a determination result of operation S220 is a yes; and operation S221 is performed when a determination result of operation S220 is a no.

Whether a first result FBC of the current point is greater than FBC of a previous point is determined in operation S221. Here, during a leftward coarse search for the inflection point after finding the near-valley point, a general change in the magnitude of FBC is a decrease followed by an increase. When the first result FBC of the current point is larger than FBC of the previous point, it indicates that FBC further increases in a subsequent leftward adjustment, and that the previous point is a point with a smaller value, in which case the previous point is set as the inflection point. In some examples, a step used for the coarse search may be a larger step, which may include, for example, 5-15 DAC, and in particular, may include 5 DAC, 10 DAC, or 15 DAC. Operation S223 is performed when a determination result of operation S221 is a yes; and operation S222 is performed when a determination result of operation S221 is a no.

In operation S222, the leftward coarse search is started from the near-valley point, and after each search, FBC is compared with that of a previous search, until a point where the decrease stops and the increase starts is found. Upon finding the point, it indicates that operation S222 is completed and jump to operation S223.

In operation S223, the previous point (i.e., the point where the decrease stops and the increase starts) is set as the inflection point, and a rightward fine search is performed starting from the inflection point. In some examples, a step used for the fine search may be a smaller step, which may include, for example, 1-4 DAC, and in particular, may include 2 DAC or 3 DAC. Operation S225 is performed after operation S223.

In operation S224, the current point is set as the inflection point, and the rightward fine search is performed starting from the inflection point. In some examples, a step used for the fine search may be referred to that in operation S223. Operation S225 is performed after operation S224.

Whether to perform a leftward adjustment on the target read voltage is determined in operation S225. Operation S229 is performed when a determination result of operation S225 is a yes; and operation S226 is performed when a determination result of operation S225 is a no.

In operation S226, a rightward adjustment on the target read voltage is performed, and during the rightward adjustment on the target read voltage, whether the right boundary is hit or whether a raise count (or referred to as a count of upward trends, where the count of upward trends is performed when the first result corresponding to the target read voltage after the next adjustment is greater than the first result corresponding to the target read voltage after the previous adjustment) exceeds the preset count TH2 is determined. In some examples, the preset count includes 3-7, and in an example, the preset count may include 3, 5, or 7. Operation S228 is performed when a determination result of operation S226 is a yes; and operation S227 is performed when a determination result of operation S226 is a no.

In operation S227, when the right boundary is not hit or the raise count does not exceed the preset count TH2, the search toward the right boundary is continued, and the determination is performed after each search, until the right boundary is hit or the raise count exceeds the preset count TH2. That is, jump to operation S228 after operation S227.

A leftward adjustment on the target read voltage is started in operation S228.

In operation S229, during the leftward adjustment on the target read voltage, whether the left boundary is hit or a raise count exceeds the preset count is determined. The raise count here may be understood with reference to that in operation S226. The thresholds for the left and right raise count are set to the same value. Operation S231 is performed when a determination result of operation S229 is a yes; and operation S230 is performed when a determination result of operation S229 is a no.

In operation S230, when the left boundary is not hit or the raise count does not exceed the preset count TH2, the search toward the left boundary is continued, and the determination is performed after each search, until the left boundary is hit or the raise count exceeds the preset count TH2. That is, jump to operation S231 after operation S230.

Whether a latest first result is the minimum is determined in operation S231. Here, whether the latest first result is the minimum refers to whether the first result corresponding to the adjusted target read voltage after the last target read voltage adjustment is the minimum. At this time, traversal of at least all the points found in the current cycle is required to find the adjusted target read voltage corresponding to the point with the minimum first result. Operation S233 is performed when a determination result of operation S231 is a yes; and operation S232 is performed when a determination result of operation S231 is a no.

The found minimum first result is used to update the latest first result in operation S232. Operation S233 is performed after operation S232.

Whether a near-valley count exceeds a preset count TH3 is determined in operation S233. Here, taking the minimum first result in a plurality of first results corresponding to target read voltages obtained after a plurality of adjustments as a reference value, when a number of first results, among the remaining plurality of first results, each having a difference from the reference value that is less than the second threshold is greater than a preset number, the search is stopped, and the target read voltage corresponding to the minimum first result in the plurality of first results is used as the target valley bottom voltage. In some examples, the second threshold and the preset number can be set jointly according to the actual situation. Typically, if the second threshold is set to be larger, then the preset number is also larger; if the second threshold is set to be smaller, then the preset number is also smaller. When a determination result of operation S233 is a yes, the search is stopped and operation S237 is performed; and when a determination result of operation S233 is a no, a determination for the next time and operation S234 is performed.

Whether a repeated valley value count exceeds a preset count TH4 is determined in operation S234. Here, during the plurality of adjustments on the target read voltage, different adjustment methods may be used to perform the adjustments. If more than a preset number of adjustment methods among the different adjustment methods correspond to the same adjusted target read voltage and the first result corresponding to this same target read voltage is the minimum among all the first results, the same target read voltage is taken as the target valley bottom voltage. In some examples, the preset count include 2-4, and in an example, the preset count may include 2, 3, or 4. When a determination result of operation S234 is a yes, the search is stopped and operation S237 is performed; and when a determination result of operation S234 is a no, a determination for the next time and operation S235 is performed.

It is to be noted that operations S233 and S234 belong to different determining methods, and are interchangeable in a positional relationship. That is, the determination of the repeated valley value count may be performed first, and the determination of the near-valley count is performed when the repeated valley value count does not satisfy the condition. It may be understood that other types of determining may be performed here to determine whether the cycle ends.

Whether the cycle ends is determined in operation S235. Operation S237 is performed when a determination result of operation S235 is a yes; and operation S236 is performed when a determination result of operation S235 is a no.

A next cycle is entered in operation S236 to continue the search. Operation S236 jumps to operation S209.

In operation S237, a search for the target order is completed, and the adjusted target read voltage corresponding to the minimum first result is taken as the target valley bottom voltage. Operation S238 is performed after operation S237.

Whether the target order is the high order is determined in operation S238. Operation S239 is performed when a determination result of operation S238 is a yes; and operation S240 is performed when a determination result of operation S238 is a no.

In operation S239, the predicted valley bottom voltage of the low order is acquired according to the target valley bottom voltage of the high order. Here, the predicted valley bottom voltage of the low order may be acquired through the target valley bottom voltage of the high order, the order of the low order, and a related mapping function (e.g., the above second mapping function). Operation S240 is performed after operation S239.

Whether respective target valley bottom voltages corresponding to read voltages of all orders included in the page have been determined is determined in operation S240. When a determination result of operation S240 is a yes, it indicates that the respective target valley bottom voltages corresponding to the read voltages of all the orders included in the page have been determined, in which case operation S242 may be performed. When a determination result of operation S240 is a no, it indicates that there is an order in the page for which a target valley bottom voltage corresponding to the read voltage thereof has not been determined yet, in which case operation S241 is performed.

In operation S241, the target valley bottom voltage of each order for which the target valley bottom voltage has not been determined is determined sequentially. Operation S236 jumps to operation S202.

In operation S242, the process of acquiring the target valley bottom voltage ends. It is to be noted that determination of target valley bottom voltages corresponding to read voltages of all orders of a next page may be started after operation S242.

It is to be noted that the methods disclosed in the examples of the present application can solve many problems in the read retry operation, but are not used to limit application scenarios in the examples of the present application, and the methods disclosed in the examples of the present application are also applicable to a conventional read operation.

It is to be noted that an executive body of a particular example process of each operation in FIGS. 16A and 16B and 17A-17C may be the peripheral circuit or the memory controller.

Figure 18:
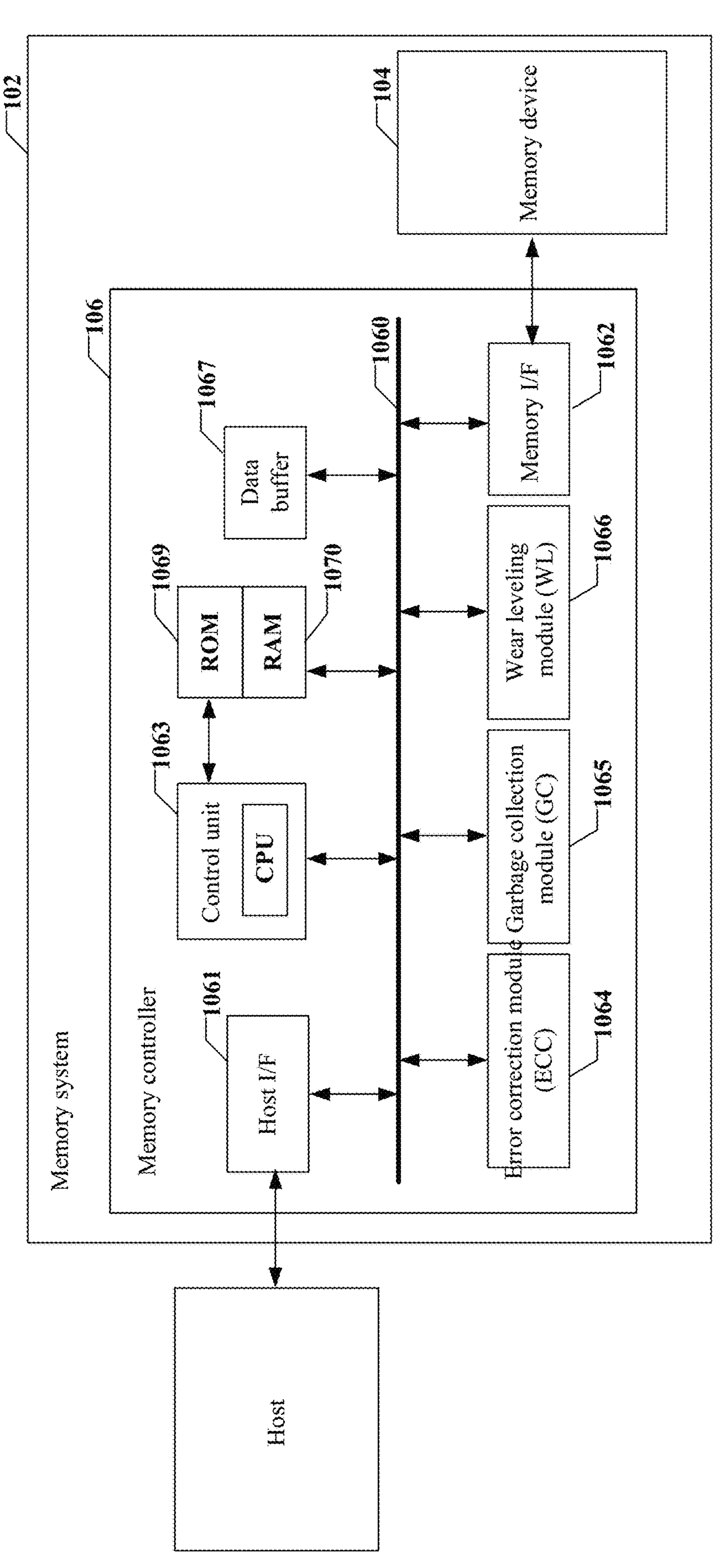
FIG. 18 is a schematic diagram of an example constituent structure having a memory system according to an example of the present application.
Figure 19:
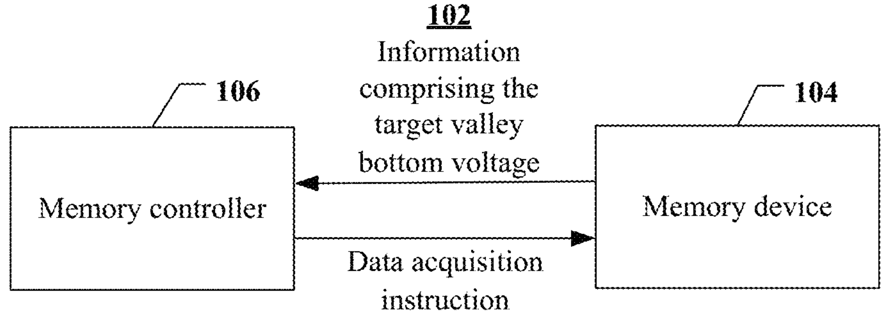
FIG. 19 is a block diagram of a memory system according to an example of the present application.

In a second aspect, examples of the present application provide a memory system. As shown in FIGS. 18 and 19, the memory system 102 includes: one or more memory devices 104 in the first aspect; and a memory controller 106 coupled with the memory devices 104 and configured to control the memory devices 104.

As shown in FIG. 18, in some particular examples, the memory system 102 is coupled with a host, and performs various types of feedback in response to instructions of the host. The memory system 102 may include the memory controller 106 and the memory devices 104. The memory controller 106 is configured to control the memory devices 104 to perform operations such as read, write, erase, etc. The memory controller 106 may also be coupled with the memory devices 104 in any appropriate methods.

The memory controller 106 may include a host interface (I/F) 1061, a memory interface (I/F) 1062, a control unit 1063, a Read-Only Memory (ROM) 1069, a Random Access Memory (RAM) 1070, an error correction module 1064, a garbage collection module 1065, a wear leveling module 1066, a buffer 1067, and a bus 1060. The host interface 1061 is a connection interface that connects the host 108 and the memory controller 106. The host interface 1061 allows the host and the memory controller to communicate according to a specific protocol, send a read request and a write request, and perform other operations. The memory interface 1062 is a connection interface between the memory controller 106 and the memory device 104. The memory interface 1062 is configured to implement data transmission between the memory controller 106 and the memory device 104. The control unit 1063 is configured to control the memory system 102 integrally. The above particular operations performed by the memory controller are mainly performed and completed by the control unit 1063 here. In some specific examples, the control unit 1063 is, for example, a central processing unit (CPU), a microcontroller unit (MCU), etc. The ROM 1069 typically includes firmware or firmware program codes of the memory controller 106. These codes are used to initialize and operate various components of the memory controller, and the RAM 1070 is typically configured to buffer data. The error correction module 1064 may further include a coding unit and a decoding unit. The coding unit is used to code data to be stored to obtain check data; the decoding unit is used to decode the check data, to detect and correct possible error data during the data transmission.

The garbage collection module 1065 is configured to: after a storage space of the memory device reaches a certain threshold, read valid data from some memory blocks, rewrite and then label these memory blocks to obtain new spare memory blocks. A general example of garbage collection may include three operations: selecting a source memory block with a small amount of valid data; finding the valid data from the source memory block; and writing the valid data to a target memory block. In this case, all data in the source memory block becomes invalid data, and the source memory block is labeled and may be used as a new spare memory block. The wear leveling module 1066 is configured to keep wear (erase count) of all the memory blocks in the memory system leveled through data statistics and algorithms. A general example of wear leveling may include two operations: selecting a source memory block in which cold data is located; and reading valid data in the source memory block and writing the valid data to a memory block with a large erase count. In this case, the valid data in the source memory block becomes invalid data, and the source memory block is labeled. The buffer 1067 is configured to buffer data.

In some particular examples, the memory controller 106 is configured to: control the memory device 104 to perform a read operation on at least one code word.

In some particular examples, the memory device 104 includes: a memory cell array including memory cells that store a plurality of memory bits, the plurality of memory bits corresponding to a plurality of orders of read voltages, and a preset number of the memory cells forming a code word; and a peripheral circuit of the memory device 104 coupled with the memory cell array and configured to: acquire a first result of at least one code word corresponding to a target read voltage of a target order, where the first result indicates the number of flipped bits of the at least one code word in two read results corresponding to a first read voltage and a second read voltage, and a difference between the first read voltage and the second read voltage is less than a preset voltage; acquire a predicted valley bottom voltage of the target order according to the first result of the at least one code word corresponding to the target read voltage of the target order and a level in which the target order is located; and determine a target valley bottom voltage of the target order based on the predicted valley bottom voltage of the target order, where the target valley bottom voltage is taken as a read voltage for a read operation performed on the at least one code word.

In some particular examples, the peripheral circuit of the memory device 104 is configured to: acquire the predicted valley bottom voltage of the target order according to the first result corresponding to the target read voltage, the level in which the target order is located, and a mapping function, where the mapping function indicates a relationship among the first result corresponding to the target read voltage, the level in which the target order is located, and the predicted valley bottom voltage of the target order.

In some particular examples, the peripheral circuit of the memory device 104 is configured to: calculate a product of a prediction direction and a tune, where the prediction direction is determined according to the first result corresponding to the target read voltage, a program state of a memory block in which the code word is located, and the level in which the target order is located, and the tune is determined according to the first result corresponding to the target read voltage and the level in which the target order is located; and take a sum of the product and the target read voltage as the predicted valley bottom voltage of the target order.

In some particular examples, the peripheral circuit of the memory device 104 is configured to: acquire the tune according to the first result corresponding to the target read voltage, the level in which the target order is located, a first constant, a second constant, and a step, where the first constant and the second constant are both fixed values related to the level in which the target order is located, and the step is related to the first constant and the second constant.

In some particular examples, the peripheral circuit of the memory device 104 is configured to: take the predicted valley bottom voltage of the target order as the target valley bottom voltage of the target order when the predicted valley bottom voltage of the target order satisfies a preset condition; and take a first result corresponding to a previous predicted valley bottom voltage as a first result in the mapping function when the predicted valley bottom voltage of the target order does not satisfy the preset condition, and perform a cyclic iteration according to the mapping function, until the predicted valley bottom voltage of the target order satisfies the preset condition.

In some particular examples, the peripheral circuit of the memory device 104 is configured to: acquire a preset threshold according to the first result corresponding to the target read voltage, where the preset threshold indicates a first result corresponding to the maximum in an effective range of predicted valley bottom voltages; and take the predicted valley bottom voltage of the target order as the target valley bottom voltage of the target order when the first result corresponding to the predicted valley bottom voltage of the target order is less than the preset threshold.

In some particular examples, the peripheral circuit of the memory device 104 is configured to: when the predicted valley bottom voltage of the target order still does not satisfy the preset condition after the cyclic iteration is performed according to the mapping function more than a preset number of times, perform a plurality of first adjustments on the predicted valley bottom voltage of the target order with a first step, and acquire first results corresponding to read voltages after the plurality of first adjustments respectively;

determine an inflection point value according to the acquired first results corresponding to the read voltages after the plurality of first adjustments, where a read voltage corresponding to the inflection point value is an inflection point voltage; perform a plurality of second adjustments on the inflection point voltage with a second step, and acquire first results corresponding to read voltages after the plurality of second adjustments respectively, where the second step is less than the first step; and determine the target valley bottom voltage of the target order according to the acquired first results corresponding to the read voltages after the plurality of second adjustments.

In some particular examples, the first results corresponding to the read voltages after the plurality of first adjustments include a first adjacent value and a second adjacent value both adjacent to the inflection point value, and the peripheral circuit of the memory device 104 is configured to: restrict a read voltage after each adjustment in the plurality of second adjustments between a read voltage corresponding to the first adjacent value and the inflection point voltage according to a difference between the first adjacent value and the inflection point value being less than a difference between the second adjacent value and the inflection point value; acquire an average of the read voltage corresponding to the first adjacent value and the inflection point voltage, when a first result corresponding to the average is less than the preset threshold, take the average as the target valley bottom voltage; and when the first result corresponding to the average is greater than or equal to the preset threshold, continue to perform the second adjustments between the read voltage corresponding to the first adjacent value and the inflection point voltage, until a first result corresponding to an adjusted read voltage is less than the preset threshold.

In some particular examples, the plurality of memory bits correspond to a plurality of pages respectively, at least one page corresponds to a plurality of orders, the plurality of orders include a first order and a second order, and a read voltage of the second order is less than a read voltage of the first order, and the peripheral circuit of the memory device 104 is configured to: acquire a predicted valley bottom voltage of a second target order according to a predicted valley bottom voltage of a first target order, where the first target order includes at least one first order among a plurality of first orders corresponding to the plurality of pages, and the second target order includes at least one of other first orders or the second order, and a read voltage of the second target order is less than a read voltage of the first target order.

In some particular examples, the peripheral circuit of the memory device 104 is configured to: perform the read operation on the at least one code word according to predicted valley bottom voltages of all the first orders and second orders.

In some particular examples, the peripheral circuit of the memory device 104 is configured to: respectively acquire predicted valley bottom voltages of other orders in the plurality of orders than the target order.

In some particular examples, the peripheral circuit of the memory device 104 is configured to: read data stored in the at least one code word with the first read voltage to obtain a second result; read data stored in the at least one code word with the second read voltage to obtain a third result; perform a logic operation on the second result and the third result to obtain a fourth result; and count the number of bits in the fourth result that indicate flips of the third result compared to the second result to obtain the first result.

In some particular examples, the peripheral circuit of the memory device 104 includes: a first latch configured to store the second result; a second latch configured to store the third result; and a third latch configured to store the fourth result.

In some examples, the memory controller 106 is configured to: send a data acquisition instruction, where the data acquisition instruction is to instruct acquisition of the target valley bottom voltage; the memory device 104 is configured to: receive the data acquisition instruction, acquire the target valley bottom voltage, and send information including the target valley bottom voltage to the memory controller; and the memory controller is further configured to: perform a read operation on data stored in the memory device according to the target valley bottom voltage in the information.

In some examples, the memory controller 106 is further configured to: perform an error correction code decoding operation on a read result of the read operation. In some examples, the error correction code decoding operation includes a hard decoding operation using a Low Density Parity Check Code (LDPC).

In some examples, the memory controller 106 is configured to: send a mode setting command, where the mode setting command is to instruct setting a read mode of the memory device to the single level read mode, where the single level read mode includes reading at least one bit of data stored in the memory cell with one level of read voltage. The memory device 104 is configured to: enter the single level read mode in response to the mode setting command, and acquire the first result of the at least one code word corresponding to the target read voltage in the single level read mode.

According to the second aspect, in the memory system provided by the examples of the present application, transmitting the first result (the size of the first result may be a few bytes), rather than transmitting the at least one code word (for example, the size of the code word may be 4 KB), reduces the amount of data transmitted between the memory device and the memory controller and reduces transmission time of an output port. The process of acquiring the first result converges inside the memory device, without occupying a space of the memory controller, and is less dependent on the memory controller. Completing the process of acquiring the predicted valley bottom voltage of the target order according to the first result of the at least one code word corresponding to the target read voltage of the target order and the level in which the target order is located, and determining the target valley bottom voltage according to the predicted valley bottom voltage of the target order, in the memory device, reduces at least one of transmission time of input and output ports of the memory device or time for error correction decoding operation of the memory controller, saves iteration time of an error correction decoding algorithm of the memory controller, allows for faster error correction decoding, and is applicable to MLC, TLC, or QLC-type memory devices.

According to the third aspect, examples of the present application provide a memory controller, coupled with at least one memory device, the memory device including memory cells that store a plurality of memory bits, the plurality of memory bits corresponding to a plurality of orders of read voltages, and a preset number of the memory cells forming a code word, where the memory controller includes: a control unit configured to: acquire a first result of at least one code word corresponding to a target read voltage of a target order, where the first result indicates the number of flipped bits of the at least one code word in two read results corresponding to a first read voltage and a second read voltage, and a difference between the first read voltage and the second read voltage is less than a preset voltage;

acquire a predicted valley bottom voltage of the target order according to the first result of the at least one code word corresponding to the target read voltage of the target order and a level in which the target order is located; and determine a target valley bottom voltage of the target order based on the predicted valley bottom voltage of the target order, where the target valley bottom voltage is taken as a read voltage for a read operation performed on the at least one code word.

In some particular examples, the control unit is configured to: acquire the predicted valley bottom voltage of the target order according to the first result corresponding to the target read voltage, the level in which the target order is located, and a mapping function, where the mapping function indicates a relationship among the first result corresponding to the target read voltage, the level in which the target order is located, and the predicted valley bottom voltage of the target order.

In some particular examples, the control unit is configured to: calculate a product of a prediction direction and a tune, where the prediction direction is determined according to the first result corresponding to the target read voltage, a program state of a memory block in which the code word is located, and the level in which the target order is located, and the tune is determined according to the first result corresponding to the target read voltage and the level in which the target order is located; and take a sum of the product and the target read voltage as the predicted valley bottom voltage of the target order.

In some particular examples, the control unit is configured to: acquire the tune according to the first result corresponding to the target read voltage, the level in which the target order is located, a first constant, a second constant, and a step, where the first constant and the second constant are both fixed values related to the level in which the target order is located, and the step is related to the first constant and the second constant.

In some particular examples, the control unit is configured to: take the predicted valley bottom voltage of the target order as the target valley bottom voltage of the target order when the predicted valley bottom voltage of the target order satisfies a preset condition; and take a first result corresponding to a previous predicted valley bottom voltage as a first result in the mapping function when the predicted valley bottom voltage of the target order does not satisfy the preset condition, and perform a cyclic iteration according to the mapping function, until the predicted valley bottom voltage of the target order satisfies the preset condition.

In some particular examples, the control unit is configured to: acquire a preset threshold according to the first result corresponding to the target read voltage, where the preset threshold indicates a first result corresponding to the maximum in an effective range of predicted valley bottom voltages; and take the predicted valley bottom voltage of the target order as the target valley bottom voltage of the target order when the first result corresponding to the predicted valley bottom voltage of the target order is less than the preset threshold.

In some particular examples, the control unit is configured to: when the predicted valley bottom voltage of the target order still does not satisfy the preset condition after the cyclic iteration is performed according to the mapping function more than a preset number of times, perform a plurality of first adjustments on the predicted valley bottom voltage of the target order with a first step, and acquire first results corresponding to read voltages after the plurality of first adjustments respectively; determine an inflection point value according to the acquired first results corresponding to the read voltages after the plurality of first adjustments, where a read voltage corresponding to the inflection point value is an inflection point voltage; perform a plurality of second adjustments on the inflection point voltage with a second step, and acquire first results corresponding to read voltages after the plurality of second adjustments respectively, where the second step is less than the first step; and determine the target valley bottom voltage of the target order according to the acquired first results corresponding to the read voltages after the plurality of second adjustments.

In some particular examples, the first results corresponding to the read voltages after the plurality of first adjustments include a first adjacent value and a second adjacent value both adjacent to the inflection point value, and the control unit is configured to: restrict a read voltage after each adjustment in the plurality of second adjustments between a read voltage corresponding to the first adjacent value and the inflection point voltage according to a difference between the first adjacent value and the inflection point value being less than a difference between the second adjacent value and the inflection point value; acquire an average of the read voltage corresponding to the first adjacent value and the inflection point voltage, when a first result corresponding to the average is less than the preset threshold, take the average as the target valley bottom voltage; and when the first result corresponding to the average is greater than or equal to the preset threshold, continue to perform the second adjustments between the read voltage corresponding to the first adjacent value and the inflection point voltage, until a first result corresponding to an adjusted read voltage is less than the preset threshold.

In some particular examples, the plurality of memory bits correspond to a plurality of pages respectively, at least one page corresponds to a plurality of orders, the plurality of orders include a first order and a second order, and a read voltage of the second order is less than a read voltage of the first order, and the control unit is configured to: acquire a predicted valley bottom voltage of a second target order according to a predicted valley bottom voltage of a first target order, where the first target order includes at least one first order among a plurality of first orders corresponding to the plurality of pages, and the second target order includes at least one of other first orders or the second order, and a read voltage of the second target order is less than a read voltage of the first target order.

In some particular examples, the control unit is configured to: perform the read operation on the at least one code word according to predicted valley bottom voltages of all the first orders and second orders.

In some particular examples, the control unit is configured to: acquire predicted valley bottom voltages of other orders among the plurality of orders than the target order respectively.

In some examples, a data amount of the first result is less than a preset data amount threshold. In an example, the data amount of the first result ranges from 1 byte to 4 bytes, so that during determination of the target valley bottom voltage, data is transmitted between the memory device and the memory controller with a small amount and a fast speed, which is favorable to improvement of an overall speed of the read operation.

Here, the control unit may be understood in connection with the control unit illustrated in FIG. 18. It is to be noted that in this example of the present application, the executive body is changed from the above peripheral circuit into the control unit in the memory controller. That is, in this example of the present application, at least one first result is acquired by the memory device; at the same time, the control unit performs analysis and processing using the at least one first result, and determines the target valley bottom voltage according to analysis and processing situations.

It is to be noted that an executive body of a particular example process in FIGS. 16A and 16B and 17A-17C may be the control unit in the memory controller.

According to the third aspect, in the memory controller provided by the examples of the present application, transmitting the first result (the size of the first result may be a few bytes) rather than transmitting the at least one code word (for example, the size of the code word may be 4 KB) between the memory device and the memory controller, reduces the amount of data transmitted between the memory device and the memory controller. The process of acquiring the first result converges inside the memory device, without occupying a space of the memory controller, and is less dependent on the memory controller. Completing the process of acquiring the predicted valley bottom voltage of the target order according to the first result of the at least one code word corresponding to the target read voltage of the target order and the level in which the target order is located, and determining the target valley bottom voltage according to the predicted valley bottom voltage of the target order, in the memory controller instead of in the memory device has higher efficiency, reduces at least one of transmission time of input and output ports of the memory device or time for error correction decoding operation of the memory controller, saves iteration time of an error correction decoding algorithm of the memory controller, allows for faster error correction decoding, and is applicable to MLC, TLC, or QLC-type memory devices.

According to the fourth aspect, examples of the present application provide an operation method of a memory device, the memory device including memory cells that store a plurality of memory bits, the plurality of memory bits corresponding to a plurality of orders of read voltages, and a preset number of the memory cells forming a code word, where the operation method including: acquiring a first result of at least one code word corresponding to a target read voltage of a target order, where the first result indicates the number of flipped bits of the at least one code word in two read results corresponding to a first read voltage and a second read voltage, and a difference between the first read voltage and the second read voltage is less than a preset voltage; acquiring a predicted valley bottom voltage of the target order according to the first result of the at least one code word corresponding to the target read voltage of the target order and a level in which the target order is located; and determining a target valley bottom voltage of the target order based on the predicted valley bottom voltage of the target order, where the target valley bottom voltage is taken as a read voltage for a read operation performed on the at least one code word.

In some examples, the operation method of the memory device includes: acquiring the predicted valley bottom voltage of the target order according to the first result corresponding to the target read voltage, the level in which the target order is located, and a mapping function, where the mapping function indicates a relationship among the first result corresponding to the target read voltage, the level in which the target order is located, and the predicted valley bottom voltage of the target order.

In some examples, the operation method of the memory device includes: calculating a product of a prediction direction and a tune, where the prediction direction is determined according to the first result corresponding to the target read voltage, a program state of a memory block in which the code word is located, and the level in which the target order is located, and the tune is determined according to the first result corresponding to the target read voltage and the level in which the target order is located; and taking a sum of the product and the target read voltage as the predicted valley bottom voltage of the target order.

In some examples, the operation method of the memory device includes: acquiring the tune according to the first result corresponding to the target read voltage, the level in which the target order is located, a first constant, a second constant, and a step, where the first constant and the second constant are both fixed values related to the level in which the target order is located, and the step is related to the first constant and the second constant.

In some examples, the operation method of the memory device includes: taking the predicted valley bottom voltage of the target order as the target valley bottom voltage of the target order when the predicted valley bottom voltage of the target order satisfies a preset condition; and taking a first result corresponding to a previous predicted valley bottom voltage as a first result in the mapping function when the predicted valley bottom voltage of the target order does not satisfy the preset condition, and performing a cyclic iteration according to the mapping function, until the predicted valley bottom voltage of the target order satisfies the preset condition.

In some examples, the operation method of the memory device includes: acquiring a preset threshold according to the first result corresponding to the target read voltage, where the preset threshold indicates a first result corresponding to the maximum in an effective range of predicted valley bottom voltages; and taking the predicted valley bottom voltage of the target order as the target valley bottom voltage of the target order when the first result corresponding to the predicted valley bottom voltage of the target order is less than the preset threshold. In some examples, the operation method of the memory device includes: when the predicted valley bottom voltage of the target order still does not satisfy the preset condition after the cyclic iteration is performed according to the mapping function more than a preset number of times, performing a plurality of first adjustments on the predicted valley bottom voltage of the target order with a first step, and acquire first results corresponding to read voltages after the plurality of first adjustments respectively; determining an inflection point value according to the acquired first results corresponding to the read voltages after the plurality of first adjustments, where a read voltage corresponding to the inflection point value is an inflection point voltage; performing a plurality of second adjustments on the inflection point voltage with a second step, and acquiring first results corresponding to read voltages after the plurality of second adjustments respectively, where the second step is less than the first step; and determining the target valley bottom voltage of the target order according to the acquired first results corresponding to the read voltages after the plurality of second adjustments.

In some examples, the first results corresponding to the read voltages after the plurality of first adjustments include a first adjacent value and a second adjacent value both adjacent to the inflection point value, and the operation method of the memory device includes: restricting a read voltage after each adjustment in the plurality of second adjustments between a read voltage corresponding to the first adjacent value and the inflection point voltage according to a difference between the first adjacent value and the inflection point value being less than a difference between the second adjacent value and the inflection point value; acquiring an average of the read voltage corresponding to the first adjacent value and the inflection point voltage, when a first result corresponding to the average is less than the preset threshold, taking the average as the target valley bottom voltage; and when the first result corresponding to the average is greater than or equal to the preset threshold, continuing to perform the second adjustments between the read voltage corresponding to the first adjacent value and the inflection point voltage, until a first result corresponding to an adjusted read voltage is less than the preset threshold.

In some examples, the plurality of memory bits correspond to a plurality of pages respectively, at least one page corresponds to a plurality of orders, the plurality of orders include a first order and a second order, and a read voltage of the second order is less than a read voltage of the first order, and the operation method of the memory device includes: acquiring a predicted valley bottom voltage of a second target order according to a predicted valley bottom voltage of a first target order, where the first target order includes at least one first order among a plurality of first orders corresponding to the plurality of pages, and the second target order includes at least one of other first orders or the second order, and a read voltage of the second target order is less than a read voltage of the first target order.

In some examples, the operation method of the memory device includes: performing the read operation on the at least one code word according to predicted valley bottom voltages of all the first orders and second orders.

In some examples, the operation method of the memory device includes: acquiring predicted valley bottom voltages of other orders among the plurality of orders than the target order respectively.

In some examples, the operation method of the memory device includes: reading data stored in the at least one code word with the first read voltage to obtain a second result; reading data stored in the at least one code word with the second read voltage to obtain a third result; performing a logic operation on the second result and the third result to obtain a fourth result; and counting the number of bits in the fourth result that indicate flips of the third result compared to the second result to obtain the first result.

According to the fifth aspect, examples of the present application provide an operation method of a memory system, including: sending, by a memory controller in the memory system, a data acquisition instruction, where the data acquisition instruction is to instruct acquisition of a target valley bottom voltage; receiving, by a memory device in the memory system, the data acquisition instruction, acquiring the target valley bottom voltage according to the operation method of the memory device in the fourth aspect, and sending information including the target valley bottom voltage to the memory controller; and performing, by the memory controller, a read operation on data stored in the memory device according to the target valley bottom voltage in the information.

In some particular examples, the memory device in the memory system includes memory cells that store a plurality of memory bits, the plurality of memory bits corresponding to a plurality of orders of read voltages, and a preset number of the memory cells forming a code word; and the operation method of the memory system including: acquiring a first result of at least one code word corresponding to a target read voltage of a target order, where the first result indicates the number of flipped bits of the at least one code word in two read results corresponding to a first read voltage and a second read voltage, and a difference between the first read voltage and the second read voltage is less than a preset voltage; acquiring a predicted valley bottom voltage of the target order according to the first result of the at least one code word corresponding to the target read voltage of the target order and a level in which the target order is located; and determining a target valley bottom voltage of the target order based on the predicted valley bottom voltage of the target order, where the target valley bottom voltage is taken as a read voltage for a read operation performed on the at least one code word.

According to the sixth aspect, examples of the present application provide an operation method of a memory controller, the memory controller being coupled with at least one memory device, the memory device including memory cells that store a plurality of memory bits, the plurality of memory bits corresponding to a plurality of orders of read voltages, and a preset number of the memory cells forming a code word, where the operation method of the memory controller including: acquiring a first result of at least one code word corresponding to a target read voltage of a target order, where the first result indicates the number of flipped bits of the at least one code word in two read results corresponding to a first read voltage and a second read voltage, and a difference between the first read voltage and the second read voltage is less than a preset voltage; acquiring a predicted valley bottom voltage of the target order according to the first result of the at least one code word corresponding to the target read voltage of the target order and a level in which the target order is located; and determining a target valley bottom voltage of the target order based on the predicted valley bottom voltage of the target order, where the target valley bottom voltage is taken as a read voltage for a read operation performed on the at least one code word.

In some examples, the operation method of the memory controller includes: acquiring the predicted valley bottom voltage of the target order according to the first result corresponding to the target read voltage, the level in which the target order is located, and a mapping function, where the mapping function indicates a relationship among the first result corresponding to the target read voltage, the level in which the target order is located, and the predicted valley bottom voltage of the target order.

In some examples, the operation method of the memory controller includes: calculating a product of a prediction direction and a tune, where the prediction direction is determined according to the first result corresponding to the target read voltage, a program state of a memory block in which the code word is located, and the level in which the target order is located, and the tune is determined according to the first result corresponding to the target read voltage and the level in which the target order is located; and taking a sum of the product and the target read voltage as the predicted valley bottom voltage of the target order.

In some examples, the operation method of the memory controller includes: acquiring the tune according to the first result corresponding to the target read voltage, the level in which the target order is located, a first constant, a second constant, and a step, where the first constant and the second constant are both fixed values related to the level in which the target order is located, and the step is related to the first constant and the second constant. In some examples, the operation method of the memory controller includes: taking the predicted valley bottom voltage of the target order as the target valley bottom voltage of the target order when the predicted valley bottom voltage of the target order satisfies a preset condition; and taking a first result corresponding to a previous predicted valley bottom voltage as a first result in the mapping function when the predicted valley bottom voltage of the target order does not satisfy the preset condition, and performing a cyclic iteration according to the mapping function, until the predicted valley bottom voltage of the target order satisfies the preset condition.

In some examples, the operation method of the memory controller includes: acquiring a preset threshold according to the first result corresponding to the target read voltage, where the preset threshold indicates a first result corresponding to the maximum in an effective range of predicted valley bottom voltages; and taking the predicted valley bottom voltage of the target order as the target valley bottom voltage of the target order when the first result corresponding to the predicted valley bottom voltage of the target order is less than the preset threshold. In some examples, the operation method of the memory controller includes: when the predicted valley bottom voltage of the target order still does not satisfy the preset condition after the cyclic iteration is performed according to the mapping function more than a preset number of times, performing a plurality of first adjustments on the predicted valley bottom voltage of the target order with a first step, and acquire first results corresponding to read voltages after the plurality of first adjustments respectively; determining an inflection point value according to the acquired first results corresponding to the read voltages after the plurality of first adjustments, where a read voltage corresponding to the inflection point value is an inflection point voltage; performing a plurality of second adjustments on the inflection point voltage with a second step, and acquiring first results corresponding to read voltages after the plurality of second adjustments respectively, where the second step is less than the first step; and determining the target valley bottom voltage of the target order according to the acquired first results corresponding to the read voltages after the plurality of second adjustments.

In some examples, the first results corresponding to the read voltages after the plurality of first adjustments include a first adjacent value and a second adjacent value both adjacent to the inflection point value, and the operation method of the memory controller includes: restricting a read voltage after each adjustment in the plurality of second adjustments between a read voltage corresponding to the first adjacent value and the inflection point voltage according to a difference between the first adjacent value and the inflection point value being less than a difference between the second adjacent value and the inflection point value; acquiring an average of the read voltage corresponding to the first adjacent value and the inflection point voltage, when a first result corresponding to the average is less than the preset threshold, taking the average as the target valley bottom voltage; and when the first result corresponding to the average is greater than or equal to the preset threshold, continuing to perform the second adjustments between the read voltage corresponding to the first adjacent value and the inflection point voltage, until a first result corresponding to an adjusted read voltage is less than the preset threshold.

In some examples, the plurality of memory bits correspond to a plurality of pages respectively, at least one page corresponds to a plurality of orders, the plurality of orders include a first order and a second order, and a read voltage of the second order is less than a read voltage of the first order, and the operation method of the memory controller includes: acquiring a predicted valley bottom voltage of a second target order according to a predicted valley bottom voltage of a first target order, where the first target order includes at least one first order among a plurality of first orders corresponding to the plurality of pages, and the second target order includes at least one of other first orders or the second order, and a read voltage of the second target order is less than a read voltage of the first target order.

In some examples, the operation method of the memory controller includes: performing the read operation on the at least one code word according to predicted valley bottom voltages of all the first orders and second orders.

In some examples, the operation method of the memory controller includes: acquiring predicted valley bottom voltages of other orders among the plurality of orders than the target order respectively.

Figure 20:
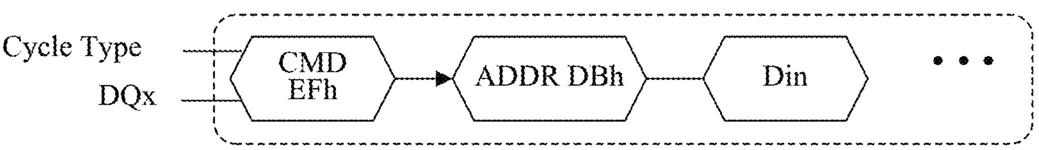
FIG. 20 is a timing diagram of an example start-up single level read mode operation according to the present application.

FIG. 20 is a timing diagram of an example start-up single level read mode operation according to the present application. DQx may represent a data bus signal, and Cycle Type may represent a type of the data bus signal.

As shown in FIG. 20, a function setup command may include, for example, a subcommand (e.g., EFh). In an example, the memory device initiates the single level read mode upon receiving the subcommand EFh. In the single level read mode, the memory device transmits addresses ADDR (e.g., two column addresses C1-C2 and three row addresses R1-R3) of data to be read between received subcommands 00h and 30h. During read time, the corresponding data DATA (e.g., Dn) in a page of the received addresses can be buffered in the page buffer, and then the data DATA is read as required. It is to be noted that in the above examples, frequent transmission (Din/Dout) of data (e.g., Dn) corresponding to one physical page between the memory device and the memory controller is required during the read retry operation, and thus the transmission of the data takes a long time.

Figure 21:
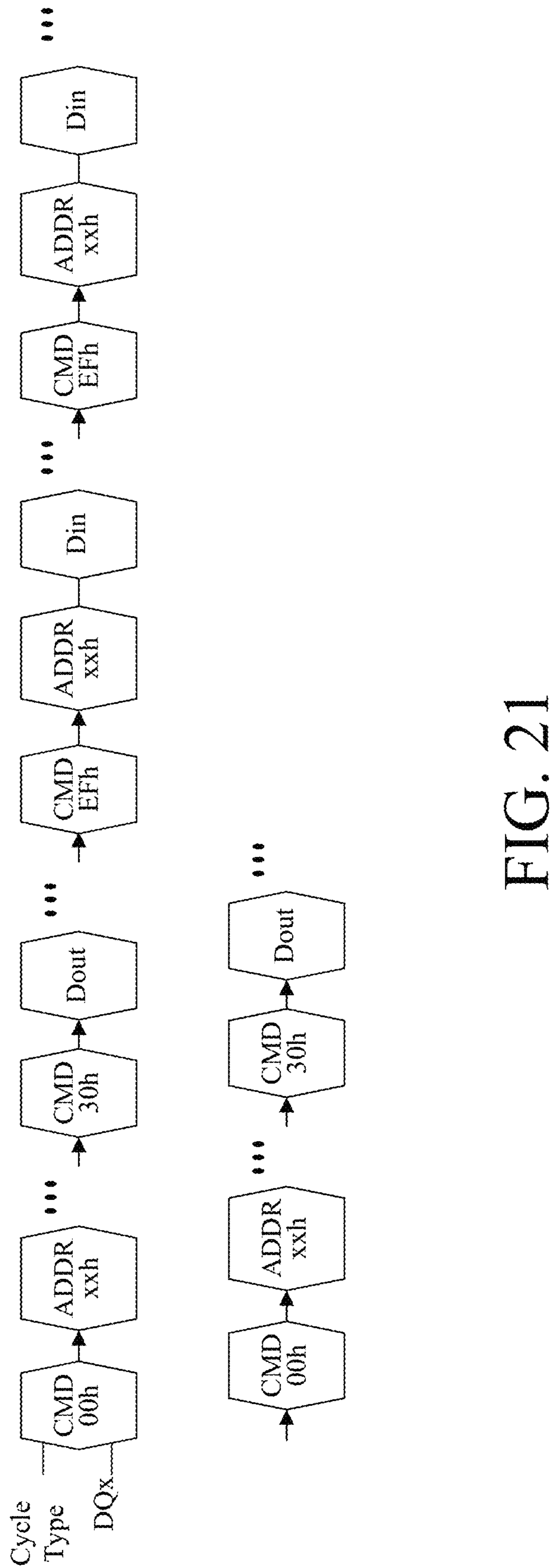
FIG. 21 is a timing diagram of target valley bottom voltage determination and read operation execution according to an example of the present application.

FIG. 21 is a timing diagram of target valley bottom voltage determination and read operation execution according to an example of the present application. As shown in FIG. 21, the read command may include, for example, two subcommands (e.g., 00h and 30h). In an example, the memory device transmits addresses ADDR (e.g., two column addresses C1-C2 and three row addresses R1-R3) of data to be read between the received subcommands 00h and 30h. After receiving the subcommand 30h, during read time, the memory device may buffer corresponding data DATA (e.g., Dn) in a page of the received addresses in the page buffer, and then read the data DATA as required.

In an example, the memory device 104 transmits addresses ADDR (e.g., two column addresses C1-C2 and three row addresses R1-R3) of data to be read between the received subcommands 00h and 30h. After receiving the subcommand 30h, the memory device 104 receives subcommands EFh and xxh of the data acquisition instruction, and the memory device 104 acquires the first result of the code word corresponding to the respective read voltage upon instruction of the data acquisition instruction, and sends the acquired first result to the memory controller. The memory controller determines the target valley bottom voltage according to the plurality of first results corresponding to the plurality of different read voltages respectively received from the memory device, and performs the read operation on the data stored in the memory device according to the target valley bottom voltage.

It is to be noted that the data acquisition instruction provided in the examples of the present application is merely an example and should not unduly limit the protection scope of the present application.

In some examples, a data amount of the first result is less than a preset data amount threshold. For example, the data amount of the first result ranges from 1 byte to 4 bytes, so that during determination of the target valley bottom voltage, data is transmitted between the memory device and the memory controller with a small amount and a fast speed, which is favorable to improvement of an overall speed of the read operation.

Examples of the present application also provide a storage medium storing thereon executable instructions that, when executed, can implement operations of the operation method described in the above examples of the present application.

In some examples, the storage medium may be memories such as Ferromagnetic Random Access Memory (FRAM), Read Only Memory (ROM), or Programmable Read-Only Memory (PROM), Erasable Programmable Read-Only Memory (EPROM), Electrically Erasable Programmable Read-Only Memory (EEPROM), Flash Memory, magnetic surface memory, optical disc, or Compact Disc Read-Only Memory (CD-ROM); alternatively, it may be various devices including one of the above memory devices or any combination thereof.

In some examples, executable instructions may in the form of a program, software, software module, script, or code, written in any form of programming language, including compiled or interpreted languages, or declarative or procedural languages, and may be deployed in any form, including deployed as a stand-alone program or deployed as a module, component, subroutine, or other means suitable for use in a computing environment.

As an example, executable instructions may, but do not necessarily correspond to, files in a file system and may be stored as part of a file holding other programs or data, for example, stored in one or more scripts in a Hyper Text Markup Language (HTML) document, stored in a single file that is specific to the program in question, or, stored in multiple collaborative files (for example, a file that stores one or more modules, subroutines, or portions of code).

As an example, the executable instruction may be deployed on an electronic apparatus for execution, or on a plurality of electronic apparatuses at one site for execution, or distributed on a plurality of electronic apparatuses interconnected through a communication network at a plurality of sites for execution.

Figure 22:
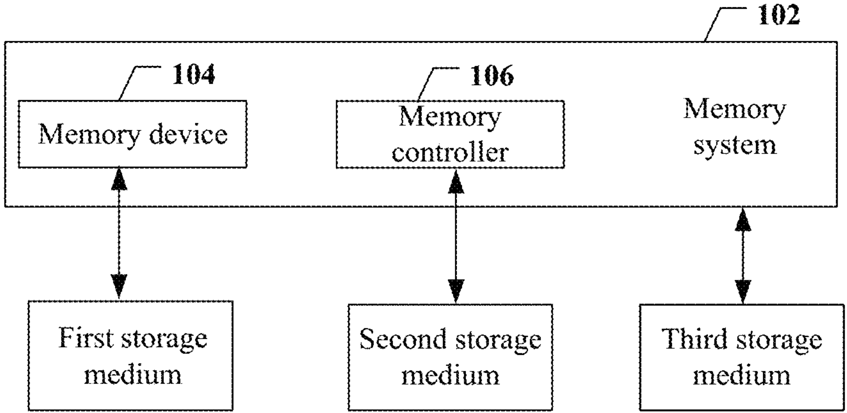
FIG. 22 is a schematic diagram of a constituent structure of a storage medium according to an example of the present application.

In some particular examples, referring to FIG. 22, FIG. 22 is a schematic diagram of a constituent structure of a storage medium according to examples of the present application. The storage medium includes a first storage medium corresponding to the memory device 104, a second storage medium corresponding to the memory controller 106, and a third storage medium corresponding to the memory system 102. When the executable instructions are executed by the memory device, the first storage medium may be used to implement operations of the operation method of the memory device in the above examples of the present application. When the executable instructions are executed by the memory controller, the second storage medium may be used to implement operations of the operation method of the memory controller in the above examples of the present application. When the executable instructions are executed by the memory system, the third storage medium may be used to implement operations of the operation method of the memory system in the above examples of the present application.

It should be understood that references to "one example" or "an example" throughout this specification mean that particular features, structures, or characteristics related to the example are comprised in at least one example of the present application. Therefore, "in one example" or "in an example" presented throughout this specification does not necessarily refer to the same example. Furthermore, these particular features, structures, or characteristics may be incorporated in one or more examples in any suitable manner. It is to be understood that, in various examples of the present application, sequence numbers of the above processes do not indicate an execution order, and an execution order of various processes shall be determined by functionalities and intrinsic logics thereof, and shall constitute no limitation on an implementation process of the examples of the present application. The above sequence numbers of the examples of the present application are only for description, and do not represent advantages or disadvantages of the examples.

The above descriptions are merely examples of the present application, and not intended to limit the patent scope of the present application. Equivalent structure transformation made using the contents of the specification and the drawings of the present application under the inventive concept of the present application, or direct/indirect application to other related technical fields are both encompassed within the patent protection scope of the present application.

What is claimed is:

1. A memory device, comprising:

a memory cell array comprising memory cells that store a plurality of memory bits, the plurality of memory bits corresponding to a plurality of orders of read voltages, and a preset number of the memory cells forming a code word; and a peripheral circuit coupled with the memory cell array and configured to:

acquire a first result of at least one code word corresponding to a target read voltage of a target order, wherein the first result indicates a number of flipped bits of the at least one code word in two read results corresponding to a first read voltage and a second read voltage, and a difference between the first read voltage and the second read voltage is less than a preset voltage;

acquire a predicted valley bottom voltage of the target order according to the first result of the at least one code word corresponding to the target read voltage of the target order and a level in which the target order is located; and determine a target valley bottom voltage of the target order based on the predicted valley bottom voltage of the target order, wherein the target valley bottom voltage is taken as a read voltage for a read operation performed on the at least one code word.

2. The memory device of claim 1, wherein the peripheral circuit is configured to:

acquire the predicted valley bottom voltage of the target order according to the first result corresponding to the target read voltage, the level in which the target order is located, and a mapping function, wherein the mapping function indicates a relationship among the first result corresponding to the target read voltage, the level in which the target order is located, and the predicted valley bottom voltage of the target order.

3. The memory device of claim 2, wherein the peripheral circuit is configured to:

calculate a product of a prediction direction and a tune, wherein the prediction direction is determined according to the first result corresponding to the target read voltage, a program state of a memory block in which the code word is located, and the level in which the target order is located, and the tune is determined according to the first result corresponding to the target read voltage and the level in which the target order is located; and take a sum of the product and the target read voltage as the predicted valley bottom voltage of the target order.

4. The memory device of claim 3, wherein the peripheral circuit is configured to:

acquire the tune according to the first result corresponding to the target read voltage, the level in which the target order is located, a first constant, a second constant, and a step, wherein the first constant and the second constant are both fixed values related to the level in which the target order is located, and the step is related to the first constant and the second constant.

5. The memory device of claim 2, wherein the peripheral circuit is configured to:

take the predicted valley bottom voltage of the target order as the target valley bottom voltage of the target order when the predicted valley bottom voltage of the target order satisfies a preset condition; and take a first result corresponding to a previous predicted valley bottom voltage as a first result in the mapping function when the predicted valley bottom voltage of the target order does not satisfy the preset condition, and perform a cyclic iteration according to the mapping function, until the predicted valley bottom voltage of the target order satisfies the preset condition.

6. The memory device of claim 5, wherein the peripheral circuit is configured to:

acquire a preset threshold according to the first result corresponding to the target read voltage, wherein the preset threshold indicates a first result corresponding to a maximum in an effective range of predicted valley bottom voltages; and take the predicted valley bottom voltage of the target order as the target valley bottom voltage of the target order when the first result corresponding to the predicted valley bottom voltage of the target order is less than the preset threshold.

7. The memory device of claim 6, wherein the peripheral circuit is configured to:

when the predicted valley bottom voltage of the target order still does not satisfy the preset condition after the cyclic iteration is performed according to the mapping function more than a preset number of times, perform a plurality of first adjustments on the predicted valley bottom voltage of the target order with a first step, and acquire first results corresponding to read voltages after the plurality of first adjustments respectively;

determine an inflection point value according to the acquired first results corresponding to the read voltages after the plurality of first adjustments, wherein a read voltage corresponding to the inflection point value is an inflection point voltage;

perform a plurality of second adjustments on the inflection point voltage with a second step, and acquire first results corresponding to read voltages after the plurality of second adjustments respectively, wherein the second step is less than the first step; and determine the target valley bottom voltage of the target order according to the acquired first results corresponding to the read voltages after the plurality of second adjustments.

8. The memory device of claim 7, wherein the first results corresponding to the read voltages after the plurality of first adjustments comprise a first adjacent value and a second adjacent value both adjacent to the inflection point value, and the peripheral circuit is configured to:

restrict a read voltage after each adjustment in the plurality of second adjustments between a read voltage corresponding to the first adjacent value and the inflection point voltage according to a difference between the first adjacent value and the inflection point value being less than a difference between the second adjacent value and the inflection point value;

acquire an average of the read voltage corresponding to the first adjacent value and the inflection point voltage, when a first result corresponding to the average is less than the preset threshold, take the average as the target valley bottom voltage; and when the first result corresponding to the average is greater than or equal to the preset threshold, continue to perform the second adjustments between the read voltage corresponding to the first adjacent value and the inflection point voltage, until a first result corresponding to an adjusted read voltage is less than the preset threshold.

9. The memory device of claim 1, wherein the plurality of memory bits correspond to a plurality of pages respectively, at least one page corresponds to a plurality of orders, the plurality of orders comprise a first order and a second order, and a read voltage of the second order is less than a read voltage of the first order, and the peripheral circuit is configured to:

acquire a predicted valley bottom voltage of a second target order according to a predicted valley bottom voltage of a first target order, wherein the first target order comprises at least one first order among a plurality of first orders corresponding to the plurality of pages, and the second target order comprises at least one of other first orders or the second order, and a read voltage of the second target order is less than a read voltage of the first target order.

10. The memory device of claim 9, wherein the peripheral circuit is configured to:

perform the read operation on the at least one code word according to predicted valley bottom voltages of all the first orders and second orders.

11. The memory device of claim 1, wherein the peripheral circuit is configured to:

acquire predicted valley bottom voltages of other orders among the plurality of orders than the target order respectively.

12. The memory device of claim 1, wherein the peripheral circuit is configured to:

read data stored in the at least one code word with the first read voltage to obtain a second result;

read data stored in the at least one code word with the second read voltage to obtain a third result;

perform a logic operation on the second result and the third result to obtain a fourth result; and count the number of bits in the fourth result that indicate flips of the third result compared to the second result to obtain the first result.

13. The memory device of claim 12, wherein the peripheral circuit comprises:

a first latch configured to store the second result;

a second latch configured to store the third result; and a third latch configured to store the fourth result.

14. A memory system, comprising:

one or more memory devices, wherein each of the one or more memory devices comprises:

a memory cell array comprising memory cells that store a plurality of memory bits, the plurality of memory bits corresponding to a plurality of orders of read voltages, and a preset number of the memory cells forming a code word; and a peripheral circuit coupled with the memory cell array and configured to:

acquire a first result of at least one code word corresponding to a target read voltage of a target order, wherein the first result indicates the number of flipped bits of the at least one code word in two read results corresponding to a first read voltage and a second read voltage, and a difference between the first read voltage and the second read voltage is less than a preset voltage;

acquire a predicted valley bottom voltage of the target order according to the first result of the at least one code word corresponding to the target read voltage of the target order and a level in which the target order is located; and determine a target valley bottom voltage of the target order based on the predicted valley bottom voltage of the target order, wherein the target valley bottom voltage is taken as a read voltage for a read operation performed on the at least one code word; and a memory controller coupled with the one or more memory devices and configured to control the one or more memory devices.

15. The memory system of claim 14, wherein the memory controller is configured to: send a data acquisition instruction, wherein the data acquisition instruction is to instruct acquisition of the target valley bottom voltage;

the one or more memory devices is configured to: receive the data acquisition instruction, acquire the target valley bottom voltage, and send information comprising the target valley bottom voltage to the memory controller; and the memory controller is further configured to: perform a read operation on data stored in the one or more memory devices according to the target valley bottom voltage in the information.

16. The memory system of claim 15, wherein the memory controller is further configured to:

perform an error correction code decoding operation on a read result of the read operation.

17. A memory controller, comprising:

a control unit configured to:

acquire a first result of at least one code word corresponding to a target read voltage of a target order, wherein the first result indicates the number of flipped bits of the at least one code word in two read results corresponding to a first read voltage and a second read voltage, and a difference between the first read voltage and the second read voltage is less than a preset voltage, wherein the memory controller is coupled with at least one memory device, wherein the at least one memory device comprises memory cells that store a plurality of memory bits, wherein the plurality of memory bits correspond to a plurality of orders of read voltages, and wherein a preset number of the memory cells forming a code word;

acquire a predicted valley bottom voltage of the target order according to the first result of the at least one code word corresponding to the target read voltage of the target order and a level in which the target order is located; and determine a target valley bottom voltage of the target order based on the predicted valley bottom voltage of the target order, wherein the target valley bottom voltage is taken as a read voltage for a read operation performed on the at least one code word.

18. The memory controller of claim 17, wherein the control unit is configured to:

acquire the predicted valley bottom voltage of the target order according to the first result corresponding to the target read voltage, the level in which the target order is located, and a mapping function, wherein the mapping function indicates a relationship among the first result corresponding to the target read voltage, the level in which the target order is located, and the predicted valley bottom voltage of the target order.

19. The memory controller of claim 18, wherein the control unit is configured to:

calculate a product of a prediction direction and a tune, wherein the prediction direction is determined according to the first result corresponding to the target read voltage, a program state of a memory block in which the code word is located, and the level in which the target order is located, and the tune is determined according to the first result corresponding to the target read voltage and the level in which the target order is located; and take a sum of the product and the target read voltage as the predicted valley bottom voltage of the target order.

20. The memory controller of claim 19, wherein the control unit is configured to:

acquire the tune according to the first result corresponding to the target read voltage, the level in which the target order is located, a first constant, a second constant, and a step, wherein the first constant and the second constant are both fixed values related to the level in which the target order is located, and the step is related to the first constant and the second constant.

* * * * *